United States Patent [19]

Hornbeck

[11] Patent Number: 5,061,049
[45] Date of Patent: Oct. 29, 1991

[54] SPATIAL LIGHT MODULATOR AND METHOD

[75] Inventor: Larry J. Hornbeck, Van Alstyne, Tex.

[73] Assignee: Texas Instruments Incorporated, Dallas, Tex.

[21] Appl. No.: 582,804

[22] Filed: Sep. 13, 1990

Related U.S. Application Data

[63] Continuation of Ser. No. 355,049, May 15, 1989, abandoned, which is a continuation of Ser. No. 168,724, Mar. 16, 1988, abandoned, which is a continuation-in-part of Ser. No. 159,466, Feb. 19, 1988, abandoned, which is a continuation of Ser. No. 636,180, Jul. 31, 1984, abandoned, and Ser. No. 43,740, Apr. 29, 1987, abandoned, which is a continuation-in-part of Ser. No. 792,947, Oct. 30, 1985, Pat. No. 4,662,746, and Ser. No. 129,353, Nov. 30, 1987, abandoned, which is a continuation of Ser. No. 877,654, Jun. 23, 1986, abandoned, which is a continuation-in-part of Ser. No. 646,399, Aug. 31, 1984, Pat. No. 4,596,992.

[51] Int. Cl.⁵ .......................... G02F 1/27; B44C 1/22; H04N 5/74; G02B 26/08
[52] U.S. Cl. .................................. 359/224; 358/206; 359/213; 359/298; 359/847
[58] Field of Search .......................................... 350/6.9

[56] References Cited

U.S. PATENT DOCUMENTS

| | | | |
|---|---|---|---|
| 2,993,403 | 7/1961 | Harries | 350/6.5 |
| 3,896,338 | 7/1975 | Nathanson et al. | 315/373 |
| 4,317,611 | 3/1982 | Petersen | 350/6.6 |
| 4,441,791 | 4/1984 | Hornbeck | 350/360 |
| 4,592,628 | 6/1986 | Altman et al. | 350/486 |
| 4,596,992 | 6/1986 | Hornbeck | 350/360 |
| 4,638,309 | 1/1987 | Ott | 350/360 |
| 4,662,746 | 5/1987 | Hornbeck | 332/7.51 |
| 4,698,602 | 10/1987 | Armtage | 332/7.51 |
| 4,710,732 | 12/1987 | Hornbeck | 332/7.51 |
| 4,793,699 | 12/1988 | Tokuhara | 350/6.6 |
| 4,831,614 | 5/1989 | Duerig et al. | 369/101 |

FOREIGN PATENT DOCUMENTS

| | | | |
|---|---|---|---|
| 0232413 | 10/1986 | Japan | 350/6.5 |
| 0021115 | 1/1987 | Japan | 350/6.5 |
| 0035321 | 2/1987 | Japan | 350/486 |
| 0035322 | 2/1987 | Japan | 350/6.5 |
| 0100417 | 5/1988 | Japan | 350/6.5 |
| 1441840 | 3/1974 | United Kingdom | 350/487 |

Primary Examiner—Nelson Moskowitz
Attorney, Agent, or Firm—James C. Kesterson; James T. Comfort; Melvin Sharp

[57] ABSTRACT

An electrostatically deflectable beam spatial light modulator with the beams (30), address electrodes (42, 46), and landing electrodes (40, 41) to provide soft-landing of the beams on the landing electrodes (40, 41) which gives uniform large-angle deflection plus high reliability.

28 Claims, 34 Drawing Sheets

SPATIAL LIGHT MODULATOR AND METHOD

RELATED APPLICATIONS

This application is a continuation of application Ser. No. 07/355,049, filed May 15, 1989 now abandoned which is a continuation of Ser. No. 07/168,724, filed Mar. 16, 1988, abandoned; which is a continuation in part of Ser. No. 07/159,466, filed Feb. 19, 1988, abandoned; which is a continuation of Ser. No. 06/636,180, filed Jul. 31, 1984, abandoned; and a continuation of Ser. No. 07/043,740, filed Apr. 29, 1987, abandoned; which is a continuation in part of Ser. No. 06/792,947, filed Oct. 30, 1985, now U.S. Pat. No. 4,662,746; and a continuation in part of Ser. No. 07/129,353 filed Nov. 30, 1987, abandoned; which is a continuation of Ser. No. 06/877,654 filed June 23, 1986, abandoned; which is a continuation in part of Ser. No. 06/646,399 filed Aug. 31, 1984, now U.S. Pat. No. 4,596,992.

BACKGROUND OF THE INVENTION

The present invention relates to spatial light modulators (light valves), and, more particularly, to spatial light modulators with pixels formed of electronically addressable deflectable beams.

Spatial light modulators (SLM) are transducers that modulate incident light in a spatial pattern corresponding to an electrical or optical input. The incident light may be modulated in its phase, intensity, polarization, or direction, and the light modulation may achieved by a variety of materials exhibiting various electrooptic or magnetoopotic effects and by materials that modulate light by surface deformation. SLMs have found numerous applications in the areas of optical information processing, projection displays, and electrostatic printing. See references cited in L. Hornbeck, 128 X 128 Deformable Mirror Device, 30 IEEE Tran. Elec. Dev. 539 (1983).

A well known SLM used for large bright electronic displays is the Eidophor, a system which uses an electrostatically dimpled oil film as the active optical element. See, E. Baumann, The Fischer large-screen projection system (Eidophor), 20 J. SMPTE 351 (1953). In this system a continuous oil film is scanned in raster fashion with an electron beam that is modulated so as to create a spatially periodic distribution of deposited charge within each resolvable pixel area on the oil film. This charge distribution results in the creation of a phase grating within each pixel by virtue of the electrostatic attraction between the oil film surface and the supporting substrate, which is maintained at constant potential. This attractive force causes the surface of the film to deform by an amount proportional to the quantity of deposited charge. The modulated oil film is illuminated with spatially coherent light from a xenon arc lamp. Light incident to modulated pixels on the oil film is diffracted by the local phase gratings into a discrete set of regularly spaced orders which are made to fall on a schlieren stop consisting of a periodic array of alternating clear and opaque bars by part of the optical system. The spacing of the schlieren stop bars is chosen to match the spacing of the diffracted signal orders at the stop plane so that high optical throughput efficiency is achieved. Light that is incident to unmodulated regions of the light valve is blocked from reaching the projection lens by the opaque bars of the schlieren stop. Images formed of unmodulated areas on the light valve by the schlieren imaging system on the projection screen are therefore dark, while the phase perturbations introduced by the modulated electron beam are converted into bright spots of light at the screen by the schlieren projector. In spite of numerous technical difficulties associated with oil polymerization by electron bombardment and organic vapor contamination of the cathode, this type of oil-film system has been successfully developed to the point that it is the almost universally used system for a total light requirement of thousands of lumens at the screen. However, such systems are expensive, bulky, and have short-lived components.

A number of non-oil-film SLMs have also been developed and include deflectable element types, rotation of plane of polarization types, and light scattering types. These SLM types employ various effects such as deformation of reflective layers of metal, elastomer, or elastomer-photoconductor, and polarization and scattering of ferroelectrics, PLZT ceramics, and liquid crystals. For example, R. Sprague et al, Linear total internal reflection spatial light modulator for laser printing, 299 Proc. SPIE 68 (1981) and W. Turner and R. Sprague, Integrated total internal reflection (TIR) spatial light modulator for laser printing, 299 Proc. SPIE 76 (1982) and U.S. Pat. No. 4,380,373 describe a system for non-impact printing on a photosensitive medium in which laser light is formed into a line of illumination and passed through a linear array of light modulators and then imaged onto the photosensitive medium. The arra is implemented as a total internal reflection spatial light modulator with the electrodes and drive electronics fabricated on an integrated drive element which is placed against the total internal reflection surface of an electrooptic crystal such as lithium niobate. The localized change in index of refraction produced by the fringing field between each two electrodes is read out with schlieren readout optics which image the TIR interface onto the photosensitive medium. This is a one dimensional image, and the photosensitive medium is rotated on a drum beneath the image of the linear array to generate the two dimensional image (e.g., a page of text) for printing applications. However, the SLM (light valve) is highly susceptible to fabrication problems due to its hybrid nature. The fringing field strength, and hence the amount of light diffracted from modulated pixels, is sensitive to changes in the air gap thickness between the address electrodes and the electrooptic crystal surface of less than one tenth micron. Thus, even very small particles trapped between the crystal and electrode structure could cause illumination nonuniformity problems at the photosensitive medium. The system optical response for pixels located at the boundary between modulated and unmodulated areas of the light valve is also significantly lower than the response for pixels near the middle of a modulated region due to the nature of the addressing technique. A commercially available printer based on this technology has not been introduced to date.

M. Little et al., CCD-Addressed Liquid Crystal Light Valve, Proc. SID Symp. 250 (April 1982) describes a SLM with a CCD area array on the front side of a silicon chip and a liquid crystal array on the backside of the chip. Charge is input into the CCD until a complete frame of analog charge data has been loaded; the charge is then dumped to the backside of the chip where it modulates the liquid crystal. This device suffers from severe fixed pattern noise as well as resolution degradation due to the charge spreading from the front-to-back transfer.

Another SLM type which may be fabricated in both one and two dimensional arrays is the deformable mirror. Deformable mirrors may be subdivided into three classes: elastomers, membranes, and cantilever beams. In the elastomer approach a metallized elastomer is addressed by a spatially varying voltage that produces surface deformation through compression of the elastomer. Because of the address voltage requirements in the order of one or two hundred volts, the elastomer is not a good candidate for integration with a high-density silicon address circuit. See, generally, A. Lakatos and R. Bergen, TV projection display using an amorphous Se-type RUTICON light valve, 24 IEEE Tran. Elec. Dev. 930 (1977).

Membrane deformable mirrors come in a variety of types. One type is essentially a substitute for the oil film of the Eidophor system discussed above. In this system a thin reflective membrane is mounted to the faceplate of a cathode ray tube (CRT) by means of a support grid structure. Addressing is by a raster scanned electron beam as with the Eidophor. The charge deposited on the glass faceplate of the CRT by the electron beam electrostatically attracts the membrane which is held at a constant voltage. This attractive force causes the membrane to sag into the well formed by the grid structure, thereby forming a miniature spherical mirror at each modulated pixel location. The light diffracted from this type of modulated pixel is concentrated into a relatively narrow cone that is rotationally symmetric about the specularly reflected beam. This type of light valve is thus used with a schlieren stop that consists of a single central obscuration positioned and sized so as to block the image of the light source that is formed by the optical system after specular reflection from unmodulated areas of the light valve. Modulated pixels give rise to a circular patch of light at the schlieren stop plane that is larger than the central obscuration, but centered on it. The stop efficency, or fraction of the modulated pixel energy that clears the schlieren stop, is generally somewhat lower for projectors based on deformable membranes than it is for the oil film Eidophor projector. Further, such membrane deformable mirror systems have at least two major problems. High voltages are required for addressing the relatively stiff reflective membrane, and slight misalignments between the electron beam raster and the pixel support grid structure lead to addressing problems. Such misalignments would cause image blurring and nonuniformity in display brightness.

Another type of membrane deformable mirror is described in L. Hornbeck, 30 IEEE Tran. Elec. Dev. 539 (1983) and U.S. Pat. No. 4,441,791 and is a hybrid integrated circuit consisting of an array of metallized polymer mirrors bonded to a silicon address circuit. The underlying analog address circuit, which is separated by an air gap from the mirror elements, causes the array of mirrors to be displaced in selected pixels by electrostatic attraction. The resultant two-dimensional displacement pattern yields a corresponding phase modulation pattern for reflected light. This pattern may be converted into analog intensity variations by schlieren projection techniques or used as the input transducer for an optical information processor. However, the membrane deformable mirror has manufacturability problems due to the susceptibility to defects that result when even small, micron sized particles are trapped between the membrane and the underlying support structure. The membrane would form a tent over these trapped particles, and the lateral extent of such tents is much larger than the size of the particle itself, and these tents would in turn be imaged as bright spots by a schlieren imaging system.

A cantilever beam deformable mirror is a micromechanical array of deformable cantilever beams which can be electrostatically and individually deformed by some address means to modulate incident light in a linear or areal pattern. Used in conjunction with the proper projection optics, a cantilever beam deformable mirror can be employed for displays, optical information processing, and electrophotographic printing. An early version with metal cantilever beams fabricated on glass by vacuum evaporation appears in U.S. Pat. No. 3,600,798. This device has fabrication problems which include the alignment of the front and back glass substrates arising from the device's nonintegrated architecture.

A cantilever beam deformable mirror device is described in R. Thomas et al, The Mirror-Matrix Tube: A Novel Light Valve for Projection Displays, 22 IEEE Tran. Elec. Dev. 765 (1975) and U.S. Pat. Nos. 3,886,310 and 3,896,338. This device is fabricated as follows: a thermal silicon dioxide layer is grown on a silicon on sapphire substrate; the oxide is patterned in a cloverleaf array of four cantilever beams joined in the middle. The silicon is isotropically wet etched until the oxide is undercut, leaving within each pixel four oxide cantilever beams supported by a central silicon support post. The cloverleaf array is then metallized with aluminum for reflectivity. The aluminum which is deposited on the sapphire substrate forms a reference grid electrode which is held at a DC bias. The device is addressed by a scanning electron beam which deposits a charge pattern on the cloverleaf beams causing the beams to be deformed by electrostatic attraction towards the reference grid. Erasure is achieved by negatively biasing a closely spaced external grid and flooding the device with low-energy electrons. A schlieren projector is used to convert the beam deformation into brightness variations at the projection screen. A significant feature of this device is the cloverleaf geometry which leads to beam deflection in a direction rotated forty-five degrees from the openings between the beams; this permits use of a simple cross shaped schlieren stop to block out the fixed diffraction background signal without attenuating the modulated diffraction signal. The device was fabricated with a pixel density of five hundred pixels per inch with beams deflectable up to four degrees. The optics employed a 150 watt xenon arc lamp, reflective schlieren optics and a 2.5 by 3.5 foot screen with a gain of five. Four hundred TV lines of resolution were demonstrated with a screen brightness of thirty-five foot-lumens, a contrast ratio of fifteen to one, and a beam diffraction efficiency of forty-eight percent. Write times of less than 1/30 second were achieved and erase times were as short as 1/10 of the write time. However, the device has problems, including degradation of resolution from scanning errors, poor manufacturing yield, and no advantage over conventional projection cathode ray tubes. That is, the scan-to-scan positioning accuracy is not high enough to reproducibly write on individual pixels. The resulting loss of resolution forces at least a four fold increase in the number of pixels required to maintain the same resolution compared to comparably written phosphor. Also, the device yield is limited by the lack of an etch stop for the cloverleaf support post, the wet etching of the beams leading to beam breakage, and the need to evaporate normally tensile aluminum in a state of zero stress on the oxide beams. Further, the device offers no apparent cost or performance advantage over conventional projection CRTs.

Cantilever beam deformable mirrors integrated on silicon with addressing circuitry, thus eliminating the electron beam addressing with its high voltage circuitry and vacuum envelopes of the previously described cantilever device, appear in K. Petersen, Micromechanical Light Modulator Array Fabricated on Silicon, 31 Appl. Phys. Lett. 521 (1977) and U.S. Pat. No. 4,229,732. The first of these references describes a 16 by 1 array of diving board-shaped cantilever beams fabricated as follows: an epitaxial layer of (100)-oriented silicon (either p or n) of thickness of about 12 microns is grown on a p+substrate (or buried layer); the epilayer is oxidized to a thickness of about 0.5 micron and covered with a Cr-Au film of thickness about 500 A. The Cr-Au is etched away to form contact pads and address lines and to define the diving board metallization. The oxide is etched away in a comb pattern around the metallization in a second masking step. Finally, the silicon itself is etched in a solution of ethylenediamine and pyrocatechol at 120 degrees C. If the proper orientation of the mask with respect to the crystalline axes is maintained, the metal-coated oxide diving boards will be undercut by the etch and freed from the silicon. Since the etch is anisotropic, further lateral etching will be stopped by the (111) planes defining the rectangular envelope of the comb pattern. In addition, the etchant is inhibited by p+material, so the depth of the well beneath the diving boards is defined by the thickness of the epilayer. When a dc voltage is applied between the substrate and the diving board metallization, the thin oxide diving board will be electrostatically deflected downward into the etched well. Diving boards of length 106 microns and width 25 microns showed a threshold voltage of about 66 volts.

The second reference (Hartstein and Petersen, U.S. Pat. No. 4,229,732) describes devices fabricated in a manner similar to the diving board device (a buried p+layer as an etch stop for forming the wells underneath metallized silicon dioxide cantilever beams) but has a different architecture; namely, the cantilever beams are in the shape of square flaps hinged at one corner, the flaps form a two dimensional array instead of the one dimensional row of diving boards, and the wells underneath the flaps are not connected so that addressing lines for the flaps may be formed on the top surface of the silicon between the rows and columns of flaps. Of course, the corner hinging of the flaps derives from the cloverleaf architecture of U.S. Pat. Nos. 3,886,310 and 3,896,338, but the full cloverleaf architecture could not be used because this would preclude the surface addressing lines since cloverleaf flaps are hinged to a central post isolated from the silicon surface. Further, these devices have problems including poor resolution and low efficiency due to density limitations and the small fractional active area, low manufacturing yield, degradation of contrast ratio due to diffraction effects from the address circuitry, and residual image due to the charging effects of the oxide flap. More particularly, the addressing circuitry is squeezed around the active area (flaps) because no option exists for placing the address circuitry under the active area due to the wells being formed by etching away the epilayer down to the p+etch stop. Thus the active area is reduced substantially together with the diffraction efficiency. This means more lamp power is required for the same screen brightness. Because the address circuitry requires additional area, the pixel size is increased far beyond the flap area with a resulting decrease in achievable resolution. The wet etching required to form the wells leads to low electrical and mechanical yield; indeed, wet cleanups, such as after dicing into chips, destroy flaps and diving boards because during the spin-rinse/dry cycle the water trapped under the beam breaks the beam as it is spun from the surface. If the water is instead evaporated from the surface it leaves behind surface residues which can increase surface leakage currents contributing to erratic device operation. Also, the addressing circuitry being on the silicon surface is exposed to the incident light to be modulated and creates unwanted diffraction effects from the transistor gates plus lowers the contrast ratio. In addition, light leakage into the address structure produces photogenerated charge and reduces storage time. Lastly, the oxide/metal flap has the insulating side facing the well and will charge up due to the intense electric fields which exist across the well; this produces a residual ("burn-in") image. The AC drive required to eliminate this residual image problem cannot be supplied by the NMOS drive circuitry described. Further, if the flap is deflected past the maximum stable deflection, then it will collapse and stick to the bottom of the well. Thus, voltages over the collapse voltage must be absolutely avoided.

A variation of the cantilever beam approach appears in K. Petersen, Silicon Torsional Scanning Mirror, 24 IBM J. Res. Devp. 631 (1980) and M. Cadman et al, New Micromechanical Display Using Thin Metallic Films, 4 IEEE Elec. Dev. Lett. 3 (1983). This approach forms metallic-coated silicon flaps or metallic flaps which are connected to the surrounding reflective surface at two hinges and operate by twisting the flaps along the axes formed by the hinges. The flaps are not formed monolithically with the underlying addressing substrate, but are glued to it in a manner analogous to the deformable membrane devices mentioned above.

Cade, U.S. Pat. No. 4,356,730 combines aspects of the foregoing and has a silicon substrate with metal coated silicon dioxide cantilever diving boards, corner-hinged flaps, and torsion hinged flaps. The addressing electrodes (two per diving board or flap for x-y addressing as in a memory array) are on the surface, and the diving board or flap may be operated as a switch or memory bit and collapsed to the bottom of the pit etched in the silicon substrate by application of a threshold voltage. The diving board or flap can then be held at the bottom of the pit by a smaller standby voltage.

The cantilever beam references discussed above suggest that schlieren projection optical systems be used with the cantilever beam devices. But such systems have limitations in terms of attainable optical performance. First, the aperture diameter of the imaging lens must be larger than is necessary to pass the signal energy alone. Hence the speed of the lens must be relatively high (or, equivalently, its f-number must be relatively low) to pass all the signal energy around the central schlieren stop obscuration. In addition, the signal passes through the outer portion of the lens pupil in this imaging configuration. Rays of light emanating from any given point on the SLM and passing through the outermost areas of an imager lens pupil are the most difficult ones to bring to a well-corrected focus during the optical design of any imaging lens. When the outer rays are brought under good control, the rays passing through the center of the imager lens are automatically well-corrected. Hence, a greater level of optical design complexity is required of the imagining lens. Second, the field angle over which the imaging lens can form well-corrected images of off-axis pixels on a cantilever beam SLM is also restricted. Any lens design task involves a compromise between the speed of the lens and the field angle it can cover with good image quality. Fast lenses tend to work over small fields, while wide angle lenses tend to be relatively slow. Since the schlieren imager must be well-corrected over its entire aperture, and since this aperture is larger in diameter than is required to pass the image forming light, the field angle that can be covered by the lens is smaller than it could be if a different imaging configuration could be devised in which the signal was passed through the center of an unobscured, smaller diameter lens. Lastly, for an imager lens having a given finite speed, the use of the schlieren stop configuration also limits the size of the light source that can be utilized. This in turn limits the irradiance level that can be delivered to a projection screen or a photoreceptor at the image of a deflected pixel. This irradiance level, or the delivered power per unit area, depends on the product of the radiance of the light source, the transmittance of the optical system, and the solid angle of the cone of image forming rays of light. The source radiance is determined only by the particular lamp that is used. The optics transmittance depends on the stop efficiency for the particular SLM/schlieren stop configuration and surface transmission losses. But the solid angle of the image forming cone of light is directly proportional to the area of the imager lens pupil that is filled with signal energy. The use of a schlieren stop that obscures the central area of the imager lens pupil limits the usable pupil area and thus the image plane irradiance level that can be obtained for a lens of a given speed and a source of a given radiance; this is in addition to the fundamental irradiance limitation that the maximum usable cone of light has an opening angle equal to the beam deflection angle.

The known beam SLMs have problems including beam insulator charging effects, lack of overvoltage protection against beam collapse, small-angle and nonuniform beam deflection leading to optical inefficiency and nonuniformity, and high voltage addressing of the pixels.

SUMMARY OF THE INVENTION

The present invention provides deflectable beam spatial light modulators with both addressing and landing electrodes for each beam, permitting soft-landing of the beams to a precise, architecturally determined angle without destructive collapse. This solves the problems of small-angle and nonuniform beam deflection and overvoltage collapse plus provides increased deflection cycle lifetime and optical contrast.

The preferred embodiments also provide the technique of differential biasing which permits low voltage addressing without contrast degradation of a conventional bias, as well as introducing two modes of operation having two or three statically stable states of beam deflection that do not require a continuous address voltage for their maintenance.

DESCRIPTION OF THE PREFERRED EMBODIMENTS

The preferred embodiment deflectable beam spatial light modulators (SLM) are typically formed of linear or area arrays of pixels, each pixel individually addressable and containing at least one deflectable reflecting beam; the pixels are organized in the form of monolithic silicon based chips. The chips are fabricated by processing silicon wafers, dicing the wafers into chips, followed by further processing of the individual chips. The chips will vary in size depending upon the application; for example, a 2400 by 1 linear array of pixels (which could be a component of a 300 dots per inch printer) may be fabricated on a chip about 1300 mils by 250 mils with pixels about 12 microns (one-half mil) square. The SLMs operate by reflecting light off of the pixels, and the reflected light is modulated by varying the deflection of the deflectable beams. Such SLMs are consequently also called deformable mirror devices (DMDs) and the deflectable beams are also called mirror elements. The following descriptions are primarily of the individual pixels for a DMD, and all of the drawings are schematic for clarity of explanation.

Figure 1A:
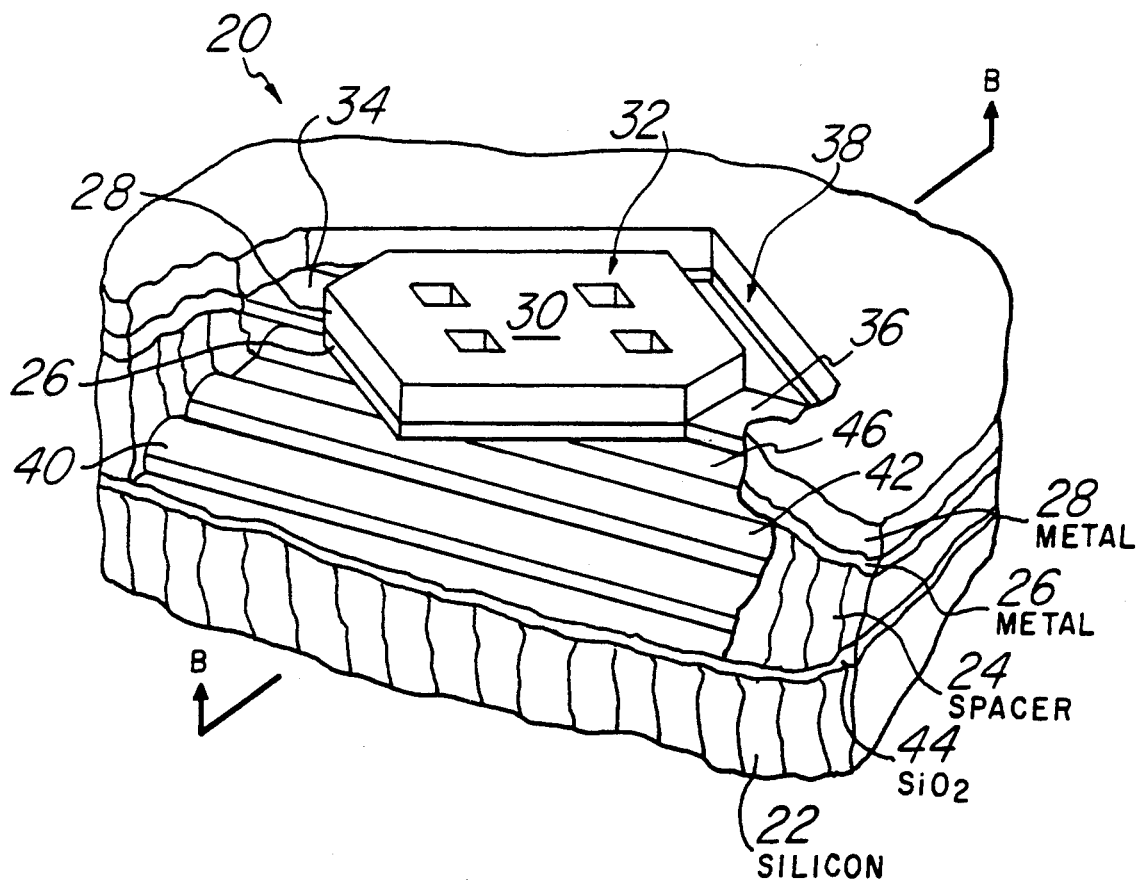
FIGS. 1A-C illustrate in perspective, cross sectional elevation, and plan views a first preferred embodiment pixel.
Figure 1B:
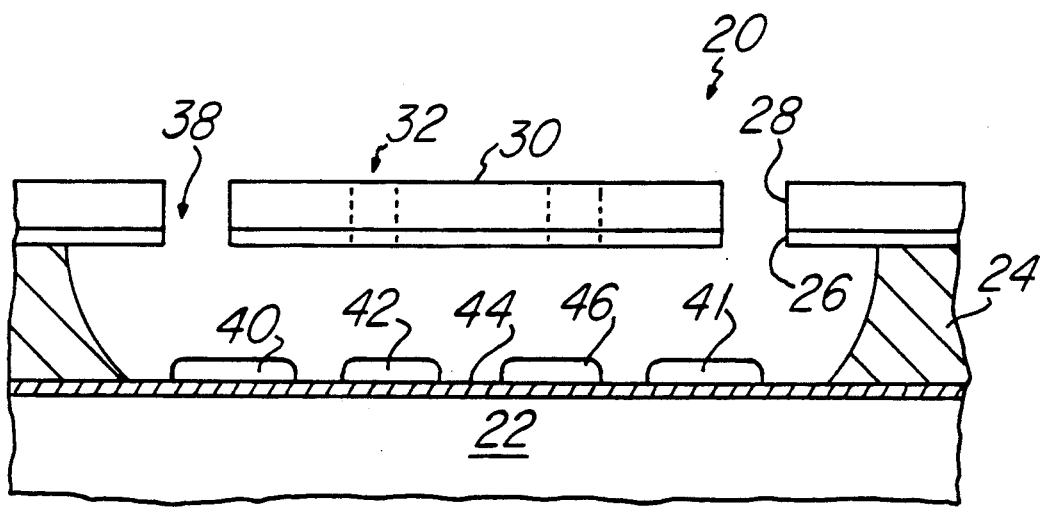
Figure 1C:
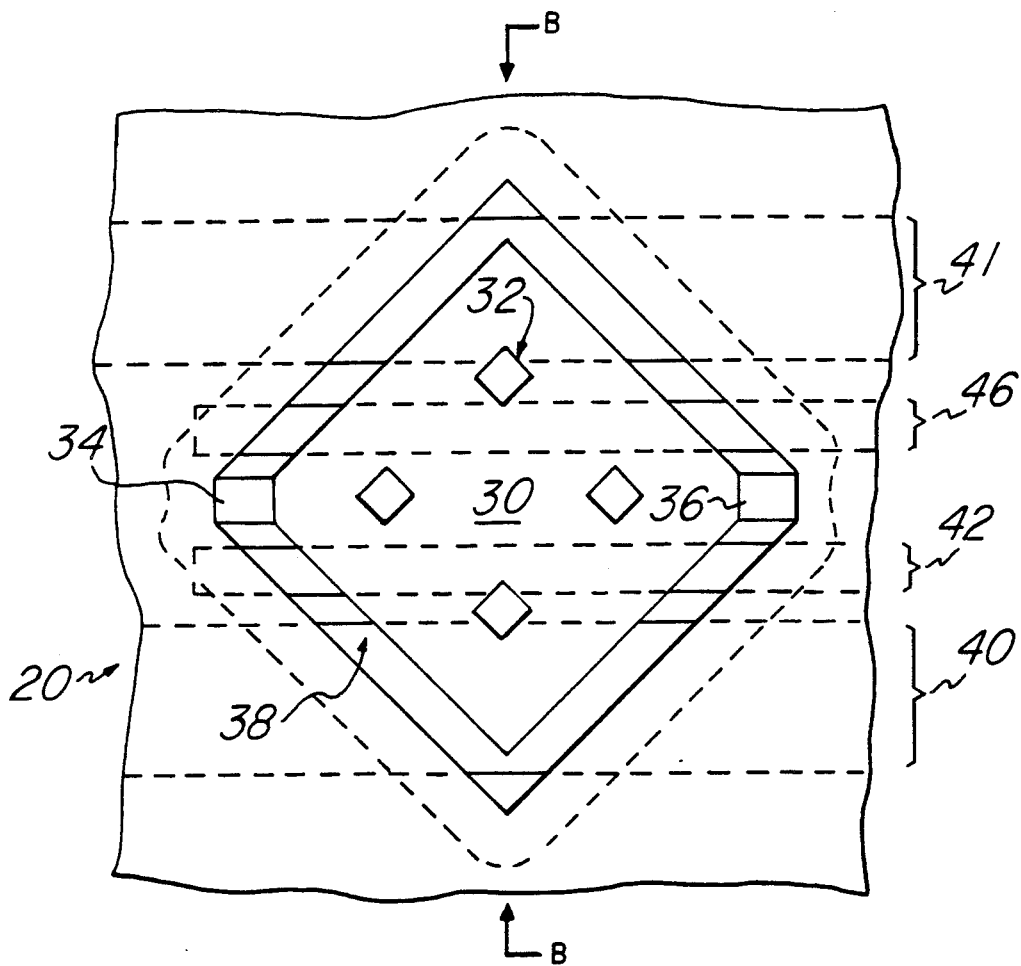

A first preferred embodiment single pixel of a DMD fabricated by a first preferred embodiment method is illustrated in perspective view in FIG. 1A, in cross sectional elevation in FIG. 1B, and in plan view in FIG. 1C. The pixel, generally denoted 20, is basically a beam (flap) covering a shallow well and includes silicon substrate 22, insulating spacer 24, metal hinge layer 26, metal beam layer 28, beam 30 formed in layers 26-28, and plasma etch access holes 32 in beam 30. The portions 34, 36 of hinge layer 26 that are not covered by beam layer 28 form torsion hinges (torsion rods) attaching beam 30 to the portion of layers 26-28 supported by spacer 24. Electrodes 40, 42, 46 and 41 run between spacer 24 and substrate 22 and are isolated from substrate 22 by silicon dioxide layer 44. FIG. 1B is a cross section along line B-B as indicated in FIGS. 1A and 1C.

Typical dimensions for pixel 20 would be as follows: beam 30 is a square with sides 12.5 microns long, spacer 24 is 4.0 microns thick (vertical in FIG. 1B), hinge layer 26 is 800 Å thick, beam layer 28 is 3,600 Å thick, hinges 34 and 36 are each 4.6 microns long and 1.8 microns wide, plasma etch access holes 32 are 2.0 microns square, and plasma etch access gap 38 (the space between beam 30 and the remainder of beam layer 28) is 2.0 microns wide.

Another set of typical dimensions for pixel 20 that yield a maximum beam deflection angle of about ten degrees would be as follows: beam 30 is a square with sides 19 microns long, spacer 24 is 2.3 microns thick (vertical in FIG. 1B), hinge layer 26 is 750 Å thick, beam layer 28 is 3,000 Å thick, torsion hinges 34 and 36 are each 4.6 microns long and 1.0 microns wide, plasma etch access holes 32 are 1.5 microns square, and plasma etch access gap 38 (the space between beam 30 and the remainder of beam layer 28) is 1.0 micron wide.

Substrate 22 is (100) silicon with resistivity about 10 ohm-cm and typically will have addressing circuitry formed on its surface, including peripheral devices in addition to electrodes 40, 41, 42, and 46. Spacer 24 is positive photoresist which is an insulator; hinge layer 26 and beam layer 28 are both an aluminum, titanium, and silicon alloy (Ti:Si:Al) with 0.2% Ti and 1% Si. This alloy has a coefficient of thermal expansion not drastically different from spacer 24 and thus minimizes the stress between the metal layers and spacer 24 generated during the fabrication process described in the following; also, the two layers 26 and 28 being the same metal minimizes stress. Note that any stress between layers in the beam or hinge would cause warping or curling of the beam or hinge, and any stress between the metal and the spacer can cause buckling or warping of the free portion of the metal over the well.

The architecture of FIGS. 1A-C simultaneously satisfies two criteria: (1) it is possible to make the beam metal as thick and the hinge metal as thin as desired without the problems of step coverage of the hinge metal over the beam metal and (2) the spacer surface under the beam metal is not exposed to processing side effects which would arise if the hinge were formed as a rectangular piece on the spacer prior to deposition of the beam metal.

Figure 2:
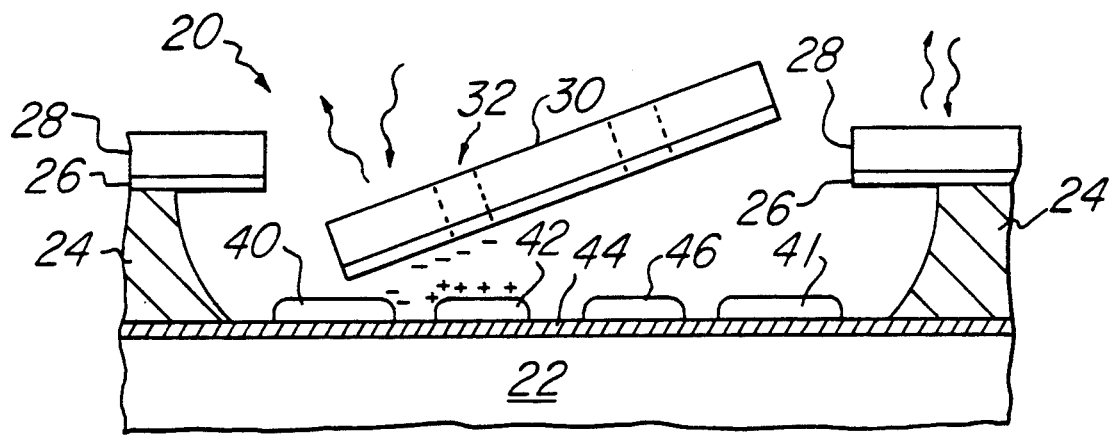
FIG. 2 illustrates deflection of the pixel beam of the first preferred embodiment.

Pixel 20 is operated by applying a voltage between metal layers 26-28 and electrodes 42 or 46 on substrate 22: beam 30 and the electrodes form the two plates of an air gap capacitor and the opposite charges induced on the two plates by the applied voltage exert electrostatic force attracting beam 30 to substrate 22, whereas electrodes 40 and 41 are held at the same voltage as beam 30. This attractive force causes beam 30 to twist at hinges 34 and 36 and be deflected towards substrate 22; see FIG. 2 for a schematic view of this deflection together with an indication of the charges concentrated at the regions of smallest gap for a positive voltage applied to electrode 42. For voltages in the range of 20 to 30 volts, the deflection is in the range of 2 degrees. Of course, if hinge 34 were made longer or thinner or narrower, the deflection would increase as the compliance of hinge 34 varies linearly with the inverse of its width and directly with the square of its length and inversely with the cube of its thickness. Note that the thickness of beam 30 prevents significant warping of beam 30 due to surface stress generated during processing, but that the thinness of hinge 34 allows for large compliance. FIG. 2 also indicates the reflection of light from deflected beam 30 as may occur during operation of a DMD.

Figure 3A:
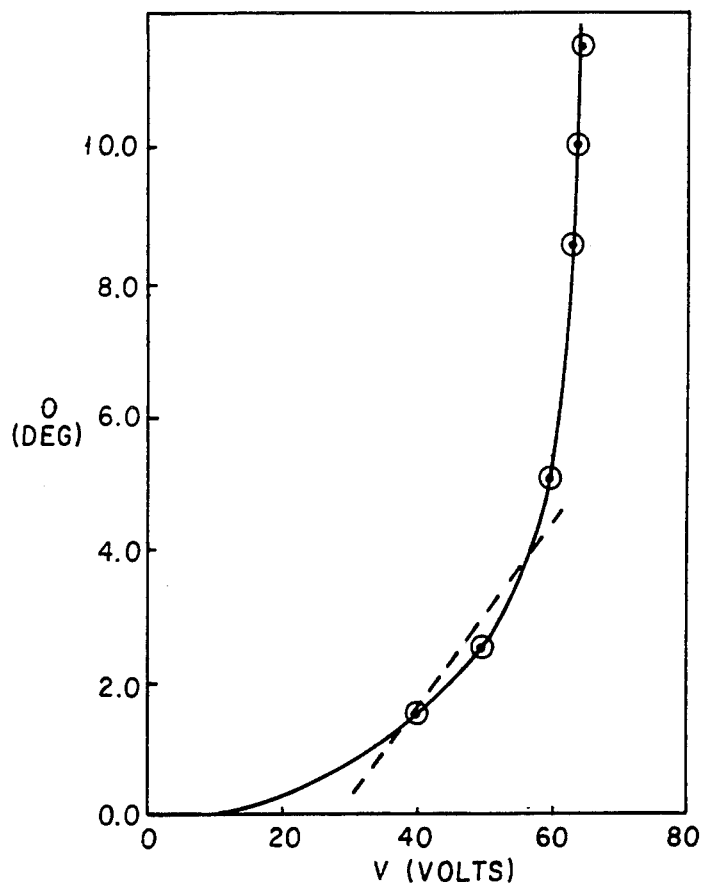
FIGS. 3A-B show the dependence of beam deflection on applied voltage for a simplified version of the first preferred embodiment pixel and a plan view of the simplified version pixel.

The deflection of beam 30 is a highly nonlinear function of the applied voltage because the restoring force generated by the twisting of hinge 34 is approximately a linear function of the deflection but the electrostatic force of attraction increases as a function of the reciprocal of the distance between the closest corner of beam 30 and substrate 22 (recall that the capacitance increases as the distance decreases so the induced charges both increase in quantity and get closer together). FIG. 3A illustrates the approximate dependence of deflection on voltage for pixel 120 which is a simplified version of pixel 20 with electrodes 42 and 40 joined together as address electrode 142 (and electrodes 41 and 46 joined together as address electrode 146). See FIG. 3B for a plan view with the elements of pixel 120 referenced numbered 100 higher than the corresponding elements of pixel 20. The voltage at which torsion beam 130 of pixel 120 becomes unstable and bends all the way to touch substrate 122 is called the collapse voltage. For voltages somewhat less than the collapse voltage the deflection is approximately a linear function of the voltage (see the dotted line in FIG. 3) and this is the analog operating region. Note that the voltages involved (40–50 volts) for analog operation are much larger than the usual for integrated circuits.

Figure 4:
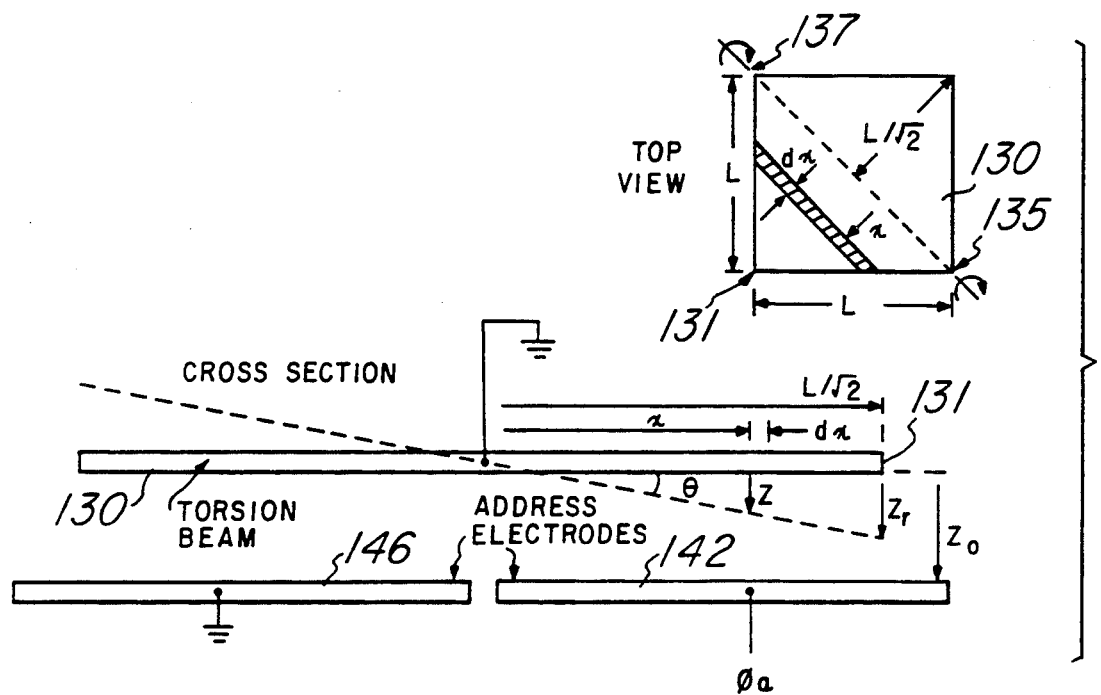
FIG. 4 is a cross sectional elevation schematic view of the simplified version pixel defining analysis terms.
Figure 3B:
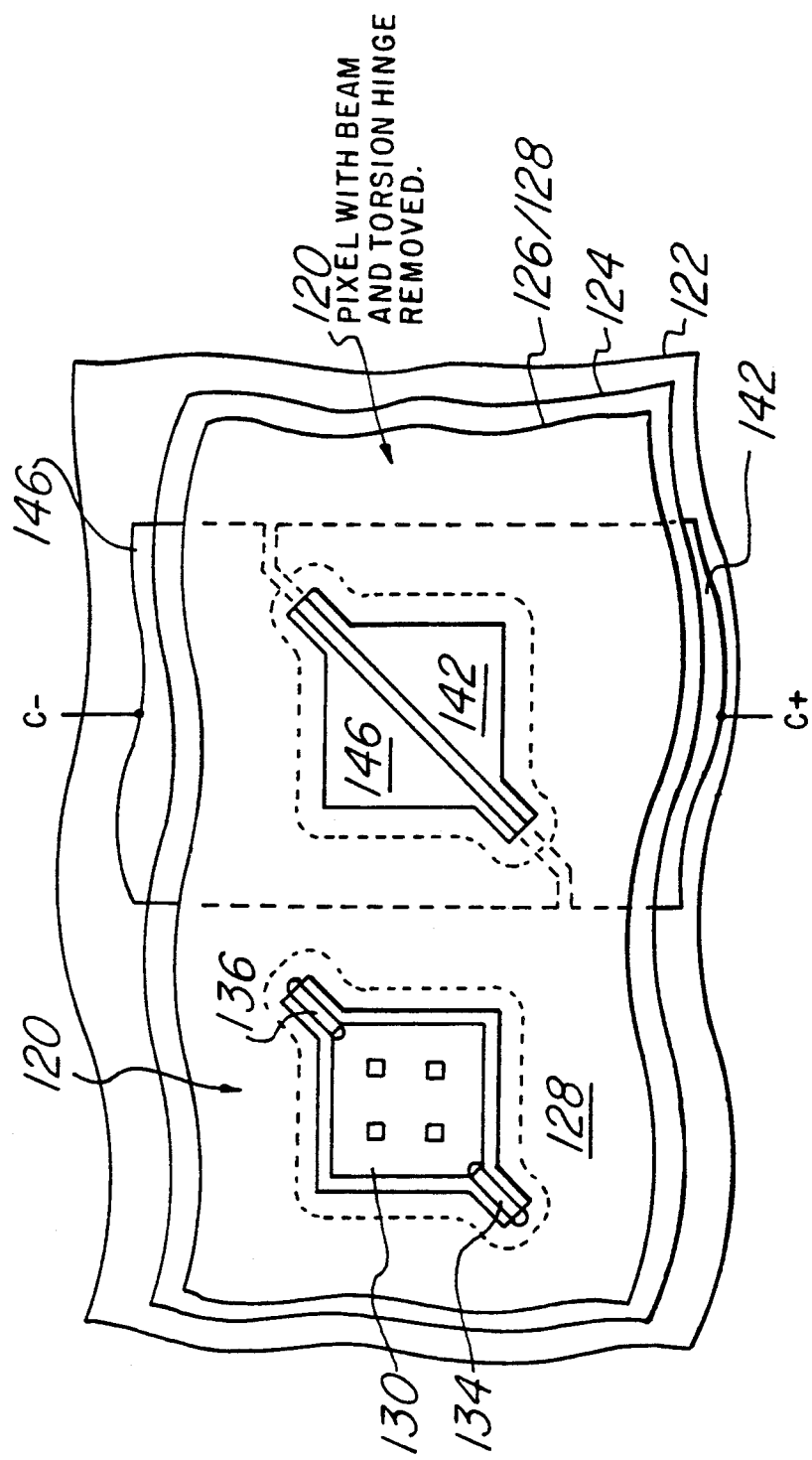

Prior to analysis of the operation of pixel 20, a qualitative analysis of the simplified pixel 120 will be presented. FIG. 4 is a schematic cross sectional elevation view (analogous to FIGS. 1B and 2) of pixel 120 showing definitions of the variables involved; and FIG. 3B is a plan view to two adjacent pixels 120.

As indicated in FIG. 4, address electrode 146 and torsion beam 130 are grounded and a voltage $\phi_a$ is applied to address electrode 142 which causes torsion beam 130 to rotate through an angle $\theta$. The rotation of the torsion beam may be expressed in terms of the distance that tip 131 of torsion beam 130 is deflected, $z_T$, or as a distance $\alpha$ normalized to the distance between the undeflected torsion beam tip 131 and address electrode 142, $z_0$; that is $$\alpha = \frac{z_T}{z_0}$$

For small angles of rotation and with $\theta$ expressed in radians, $\theta$ and $\alpha$ are related by $$\theta = \frac{z_T}{L/\sqrt{2}} = \frac{\alpha z_0 \sqrt{2}}{L}$$

where L is the length of the side of square torsion beam 130 which is torsion hinged at opposite corners 135 and 137.

The torque exerted on torsion beam 130 about the axis through corners 135 and 137 by application of voltage $\phi_a$ to address electrode 142 is computed as follows. First consider the small (infinitesimal) area of torsion beam 130 located a distance x from the axis of rotation and of width dx (see the top view in FIG. 4). The electrostatic energy in the small vertical volume between the small area on torsion beam 130 and address electrode 142 is approximately (assuming a uniform electric field ignoring fringing fields) equal to $$dU = \frac{1}{2} \bar{D} \cdot \bar{E}(z_0 - z) 2(L/\sqrt{2} - x) dx$$

where $\bar{E}$ is the electric field and $\bar{D}$ is the electric displacement in the small vertical volume. Note that $z_0 - z$ is the height of the small vertical volume and that $2(L/\sqrt{2} - x)$ is the length of the small area on torsion beam 130. Of course, electrostatic $\bar{D}$ and $\bar{E}$ are related by the permittivity of the medium: $\bar{D} = \epsilon_0 \bar{E}$; and the electric field magnitude is just the voltage difference divided by the separation:

$$|E| = \frac{\phi_a}{z_0 - z}$$

The small force in the vertical (z) direction on the small area by the electric field is just the partial derivative of dU in the z direction:

$$dF_z = -\frac{\partial (dU)}{\partial z}$$

so $$dF_z = \frac{1}{2} \epsilon_0 \frac{\phi_a^2}{(z_0 - z)^2} 2(L/\sqrt{2} - x) dx$$

and the small torque exerted on torsion beam 130 by this small force is just $x dF_z$ because the force has moment arm equal to x. Thus the total attracting torque, $\tau_a$, exerted on torsion beam 130 by $\phi_a$ applied to address electrode 142 is given by $$\tau_a = \int x dF_z = \frac{1}{2} \epsilon_0 \phi_a^2 \int_0^{L/\sqrt{2}} \frac{2x(L/\sqrt{2} - x)}{(z_0 - x\theta)^2} dx$$

where the small angle approximation $\theta = \tan(\theta)$ was used to set $z = x\theta$.

Figure 5:
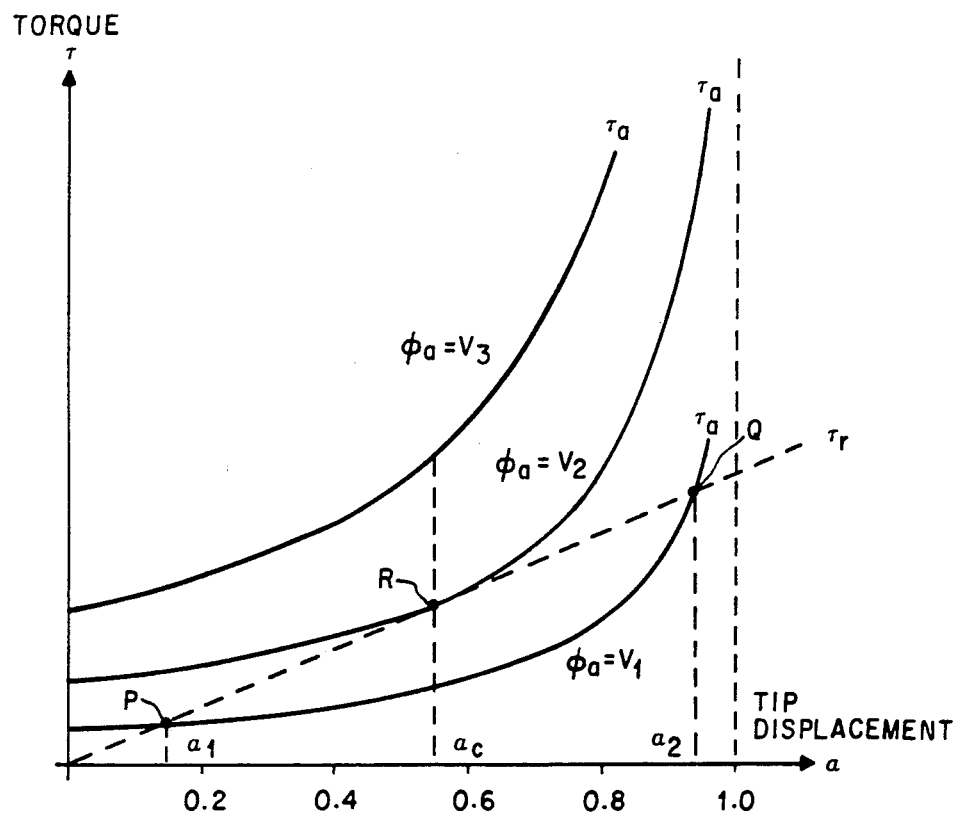
FIG. 5 illustrates the torques on the beam in the simplified version pixel.

Evaluation of the integral yields:

$$\tau_a = \frac{\frac{1}{2} \epsilon_0 \phi_a^2 L^3}{z_0^2} \frac{1}{\alpha^3 \sqrt{2}} [(\alpha - 2)\log(1 - \alpha) - 2\alpha]$$

where $\theta$ has been expressed in terms of $\alpha$, the normalized deflection. FIG. 5 illustrates the dependence of $\tau_a$ on $\alpha$ for three different address voltages ($V_1 < V_2 < V_3$). The restoring torque produced by the twisting of the torsion hinges is given by $$\tau_r = \frac{-\theta}{C} = -\alpha \left( \frac{z_0 \sqrt{2}}{CL} \right)$$

where C is the torsion hinge compliance. The magnitude of the restoring torque is indicated by the dashed line in FIG. 5.

Points of stable equilibrium for torsion beam 130 may be found by analyzing points of zero net torque. In FIG. 5 for $\phi_a = V_1$ there is zero net torque at the points labelled "P" and "Q". Point "P" (for $\alpha = \alpha_1$) represents a stable equilibrium because for small excursions of $\alpha$ in either direction the net torque restores $\alpha$ towards $\alpha_1$. Contrarily, for point "Q" the net torque for small excursions of $\alpha$ away from $\alpha_2$ acts to increase the excursion; either back to $\alpha_1$ or to collapse with tip 131 landing on electrode 142 ($\alpha = 1$). Similar behavior obtains for any $\phi_a$ between 0 and $V_2$.

For $\phi_a = V_2$ the points "P" and "Q" coalesce to a single point "R" at the tangency of the $\tau_a$ and $\tau_r$ curves. Point "R" (with $\alpha = \alpha_c$) represents a quasi-stable equilibrium: for excursions of $\alpha$ below $\alpha_c$ the net torque restores $\alpha$ towards $\alpha_c$, but for excursions of $\alpha$ above $\alpha_c$ the net torque leads to collapse of tip 131 to address electrode 142 ($\alpha = 1$). For $\phi_a$ greater than $V_2$, such as $V_3$ illustrated in FIG. 5, there are no points of zero net torque. Thus $V_2$ is the collapse voltage and denoted $V_c$.

Figure 6:
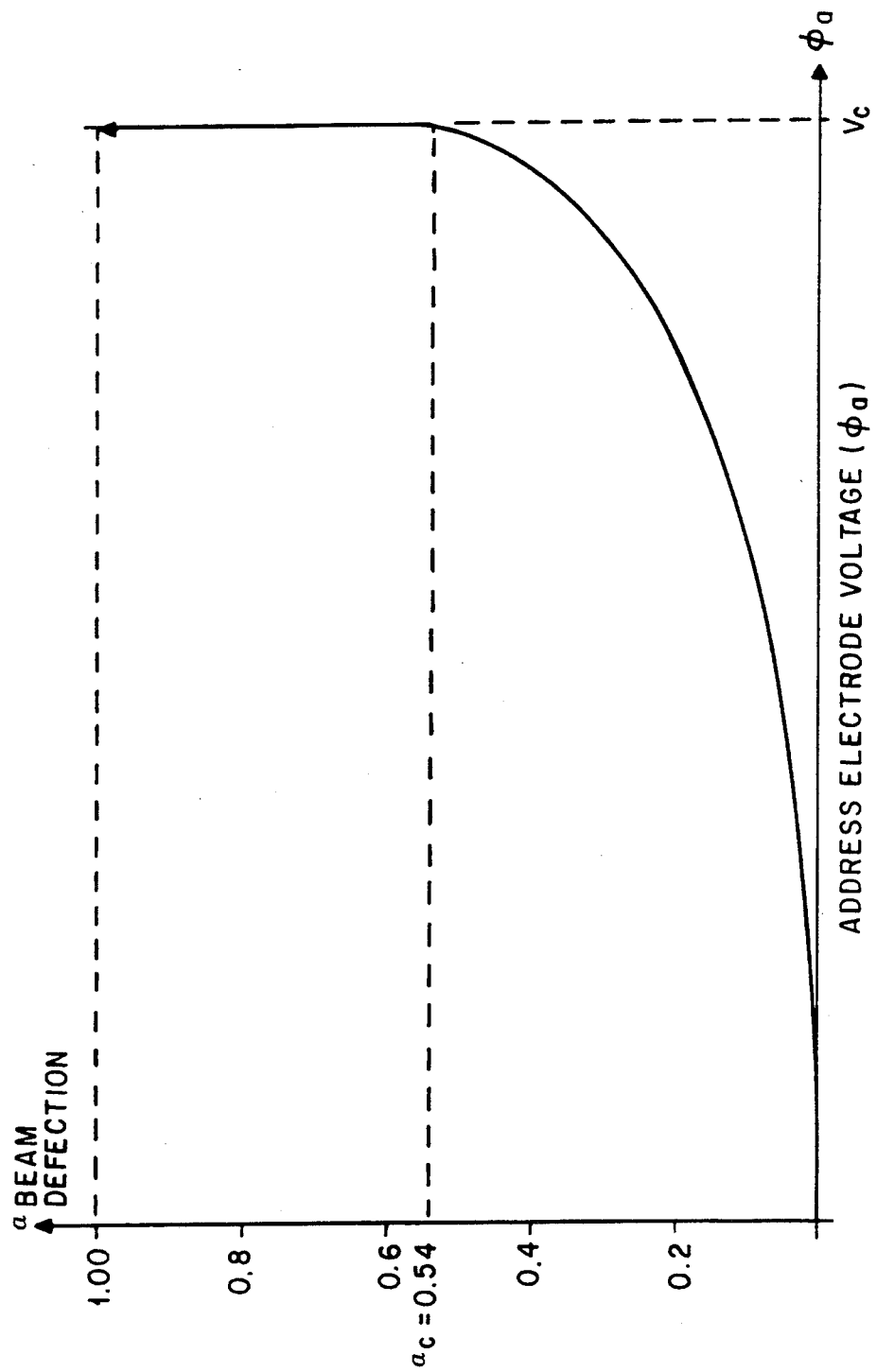
FIG. 6 illustrates the beam deflection as a function of control voltage for the simiplified version pixel.

FIG. 6 summarizes the foregoing: increasing $\phi_a$ from 0 to $V_c$ leads to an increasing stable deflection equilibrium $\alpha_1$, and at $\phi_a = V_c$ the stable equilibrium has reached $\alpha_c$ where it disappears. If the collapsed deflection ($\alpha=1$) is included, then pixel 120 can be considered as having two stable equilibria for $\phi_a < V_c$ with one an analog equilibrium (deflection depends upon $\phi_a$) and another digital ($\alpha=1$) independent of $\phi_a$. For $\phi_a \geq V_c$ the analog equilibrium disappears and pixel 120 is only digital.

Note that at collapse, torsion beam tip 131 touches address electrode 142 and a large current passes through tip 131 to electrode 142 and tip 131 is welded to electrode 142. Therefore collapse is a destructive phenomenon for this particular architecture. For very thin torsion hinges, the hinges act as fusible links and are blown away when the torsion beam collapses.

Figure 7:
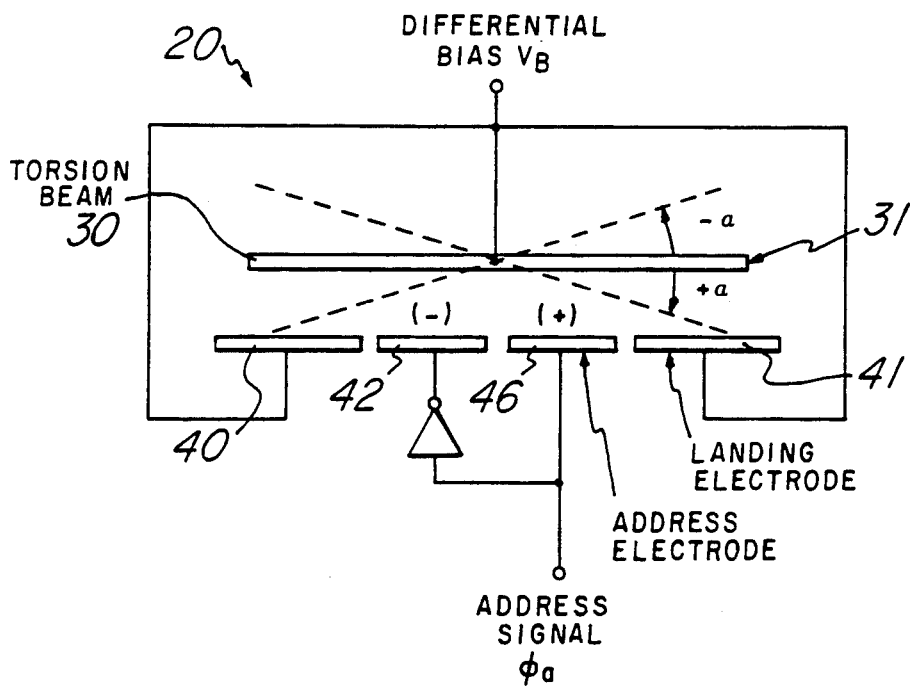
FIG. 7 is a schematic cross sectional elevation view of the first preferred embodiment.

Pixel 20 overcomes the problems of pixel 120 of high voltage operation and destructive collapse of the torsion beam to the underlying electrodes. Pixel 20 has the addition of landing electrodes 40 and 41 which are electrically connected to torsion beam 30 and the connection of address electrode 42 with address electrode 46 but with a logical inversion of the address signal $\phi_a$. See schematic FIG. 7. The operation of pixel 20 is described in the following paragraphs.

First for a fixed address signal voltage $\phi$ consider the torque $\tau_+$ produced between beam 30 and address electrode 46 as a function of the normalized deflection $\alpha$ of beam 30. Initially presume that beam 30 and landing electrodes 40 and 41 are grounded ($V_B=0$) and that voltage $\phi$ is also applied to address electrode 42. Unlike the torque for the simplified pixel 120, the torque $\tau_+$ does not tend to $\infty$ as $\alpha$ tends to 1 because tip 31 of beam 30 hits landing electrode 41 and keeps beam 30 separated from address electrode 46. In contrast to the destructive nature of tip 131 in pixel 120 hitting electrode 142, the hitting of landing electrode 41 by tip 31 does not lead to a large current pulse and the welding of tip 31 to landing electrode 41 because beam 30 and landing electrode 41 are electrically connected. Further, as beam 30 is deflected in the opposite direction towards landing electrode 40, $\alpha$ tends to $-1$ and $\tau_+$ decreases because the separation between beam 30 and address electrode 46 is increasing; see FIG. 7.

Figure 8:
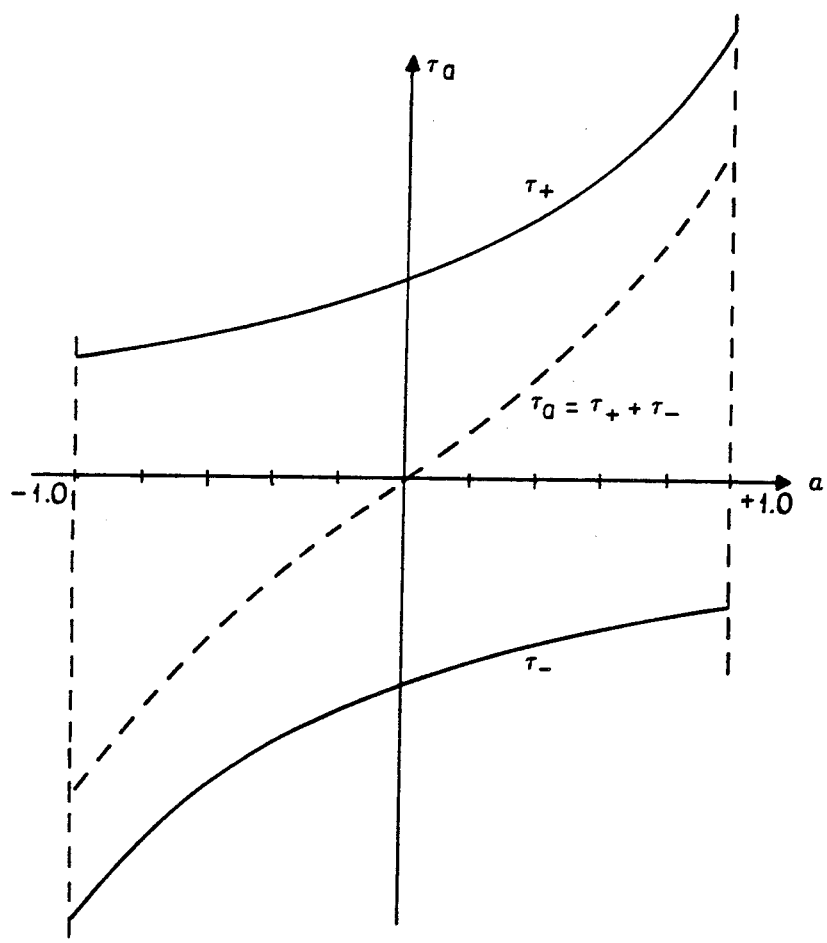
FIG. 8 illustrates the torques on the beam in the first preferred embodiment.
Figure 9:
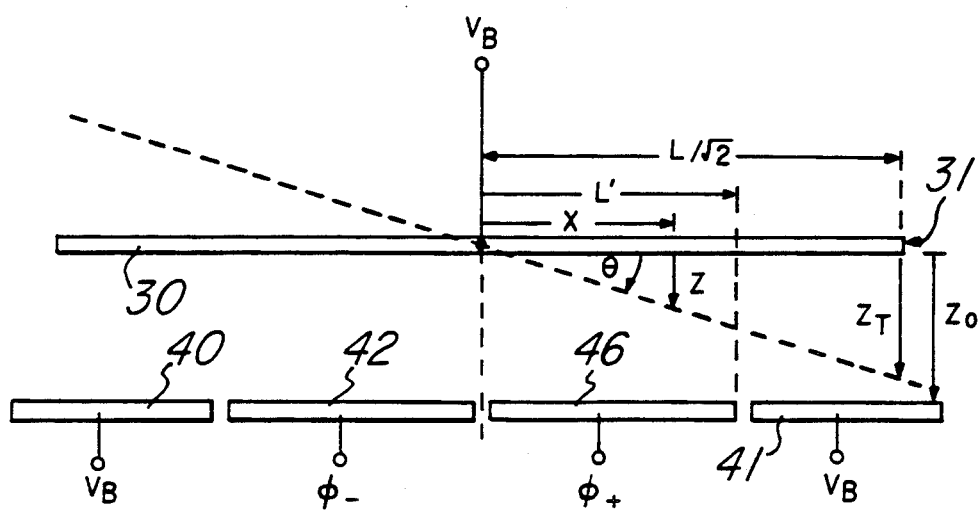
FIG. 9 shows definition of terms in the analysis of the first preferred embodiment.

The torque $\tau_-$ produced on beam 30 by address electrode 42 is easily seen to be related to $\tau_+$ by symmetry: $\tau_-(\alpha) = -\tau_+(-\alpha)$. Thus for a fixed voltage $\phi$ applied to both address electrodes 42 and 46 and a normalized deflection of $\alpha$, the net attractive torque $\tau_a$ is just the sum $\tau_+ + \tau_-$ with positive torque attracting to electrode 46 and negative torque attracting to electrode 42. The net attractive torque as a function of $\alpha$ is illustrated in FIG. 8; the curves for $\tau_+(\alpha)$ and $\tau_-(\alpha)$ will be derived in a manner analogous to the derivation of $\tau_a$ in connection with the discussion of pixel 120. FIG. 9 illustrates the variables used; these are the same variables as in FIG. 4 with the addition of L' to measure the extent of address electrodes 42 and 46 under torsion beam 30. It is convenient to express L' as a normalized distance $\beta$ defined by $$\beta = \frac{L'}{L/\sqrt{2}}$$

Thus for pixel 120 L' would equal $L/\sqrt{2}$ and $\beta$ would equal 1. With this definition and a change of integration variables, the computation for $\tau_+$ is:

$$\tau_+ = \int x dF_z = \frac{1}{2}\epsilon_0\phi^2 \int_0^{L'} \frac{2x(L/\sqrt{2} - x)}{(z_0 - x\theta)^2} dx$$

$$= \frac{\frac{1}{2}\epsilon_0\phi^2 L^3}{z_0^2} \frac{1}{\alpha^3\sqrt{2}} \int_0^{\alpha\beta} \frac{w(\alpha - w)}{(1-w)^2} dw$$

This is immediately integrated by partial fractions to yield:

$$\tau_+ = \frac{\frac{1}{2}\epsilon_0\phi^2 L^3}{z_0^2} \frac{1}{\alpha^3\sqrt{2}} \left[ (\alpha - 2)\log(1 - \alpha\beta) + \frac{\alpha\beta(\alpha\beta + \alpha - 2)}{1 - \alpha\beta} \right]$$

$$= \frac{\frac{1}{2}\epsilon_0\phi^2 L^3}{z_0^2} g(\alpha,\beta)$$

where $g(\alpha,\beta)$ is a dimensionless function defined by the equation. Putting $\beta=\frac{1}{2}$ leads to the curves in FIG. 8.

To analyze the operation of pixel 20, preliminarily consider the effect of increasing the positive differential bias $V_B$ applied to beam 30 and landing electrodes 40 and 41 while address electrodes 42 and 46 are both held at ground potential. (Of course, this generates the same torque as applying $V_B$ to both address electrodes and grounding beam 30 and both landing electrodes; also negative $V_B$s give symmetric results but only positive $V_B$s will be considred for notational simplicity.) As with the analysis of pixel 120, the computation of points with zero net torque (attractive torque $\tau_a$ plus restoring torque $\tau_r$) determines equilibrium points. Now $\tau_r$ is the same as for pixel 120 because $\tau_r$ just depends upon the torsion beam deflection and the torsion hinge compliance; however, the attractive torque $\tau_a$ for pixel 20 is bounded, symmetric and passes through zero at $\alpha=0$ (see FIG. 8) in contrast to the unbounded torque at $\alpha=1$ and the positive torque at $\alpha=0$ for pixel 120 (see FIG. 5). This leads to a qualitative difference from the previously discussed operation of pixel 120 as follows.

Figure 10:
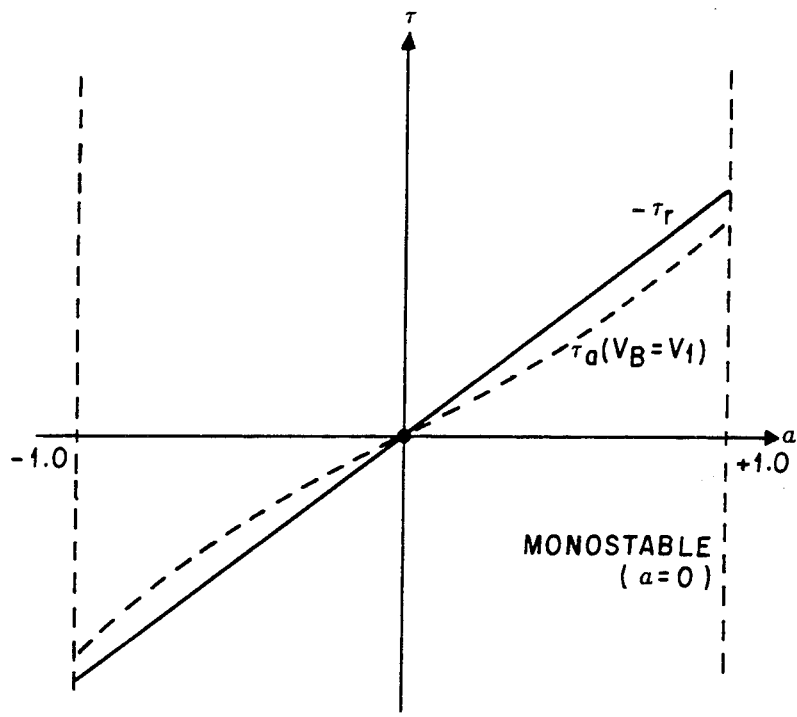
FIGS. 10-13 illustrate the torques on the beam for different modes of operation of the first preferred embodiment.

FIG. 10 shows $\tau_a$ and $\tau_r$ for pixel 20 with small $V_B$ and grounded address electrodes 42 and 46. The net torque vanishes at $\alpha=0$ and beam 30 remains undeflected. Note that for any nonzero $\alpha$ (including $\alpha=\pm1$ where beam 30 is collapsed to one of the landing elctrodes 40 or 41) the net torque restores beam 30 to the undeflected state ($\alpha=0$) and this is the only stable equilibrium. Thus this is a monostable mode of operation.

Figure 11:
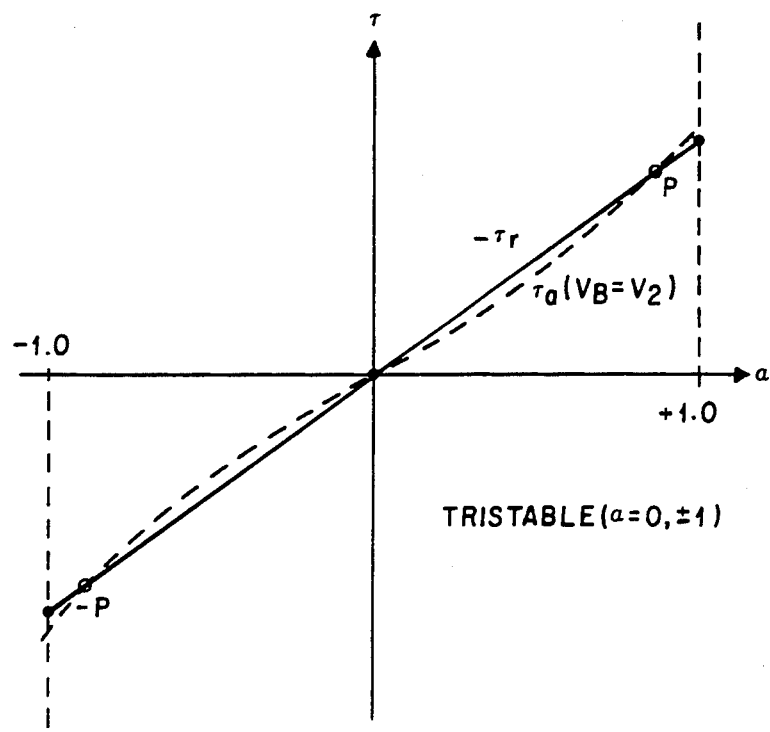

As the differential bias is increased from $V_B=V_1$ (FIG. 10) to $V_B=V_2$ (FIG. 11), two additional points of zero net torque appear: $\alpha=0$ and points "P" and "$-P$" near $\alpha=\pm1$. Again $\alpha=0$ is a stable equilibrium, but the points "P" and "$-P$" are unstable analogous to the point "Q" in FIG. 5 for pixel 120; small excursions about "P" or "$-P$" to smaller $|\alpha|$ provide a net torque to return beam 30 to the undeflected state $\alpha=0$, and small excursions about "P" or "$-P$" to larger $|\alpha|$ provide a net torque to collapse beam 30 to either landing electrode 40 or 41 ($\alpha=\pm1$). Thus with this differential bias beam 30 has three stable equilibria: $\alpha=0,\pm 1$. Thus this is a tristable mode of operation.

Figure 12:
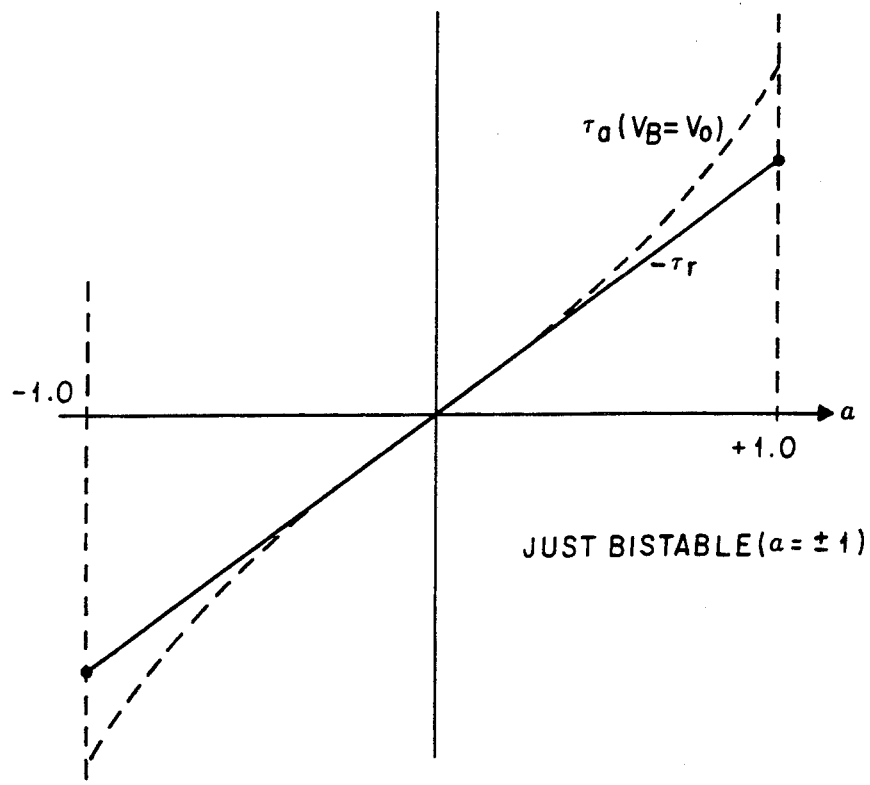
Figure 13:
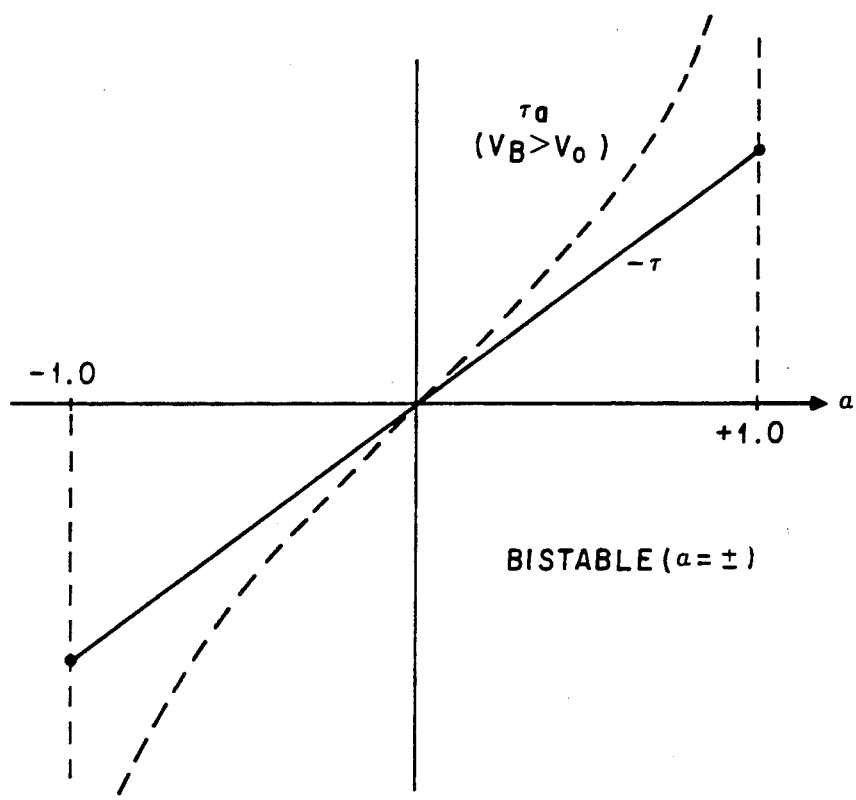

Further increase of the differential bias from $V_B=V_2$ to $V_B=V_o$ (see FIG. 12) makes the $\tau_a$ and $\tau_r$ curves tangent at $\alpha=0$, and $\alpha=0$ disappears as a stable equilibrium. Indeed, any small excursion in $\alpha$ about 0 will have $|\tau_a|>|\tau_r|$ and beam 30 will collapse to one of the landing electrodes ($\alpha=\pm 1$). For the differential bias $V_B$ greater than $V_o$, pixel 20 continues to have two stable points: $\alpha=\pm 1$; thus this is a bistable mode of operation. See FIG. 13.

Figure 14:
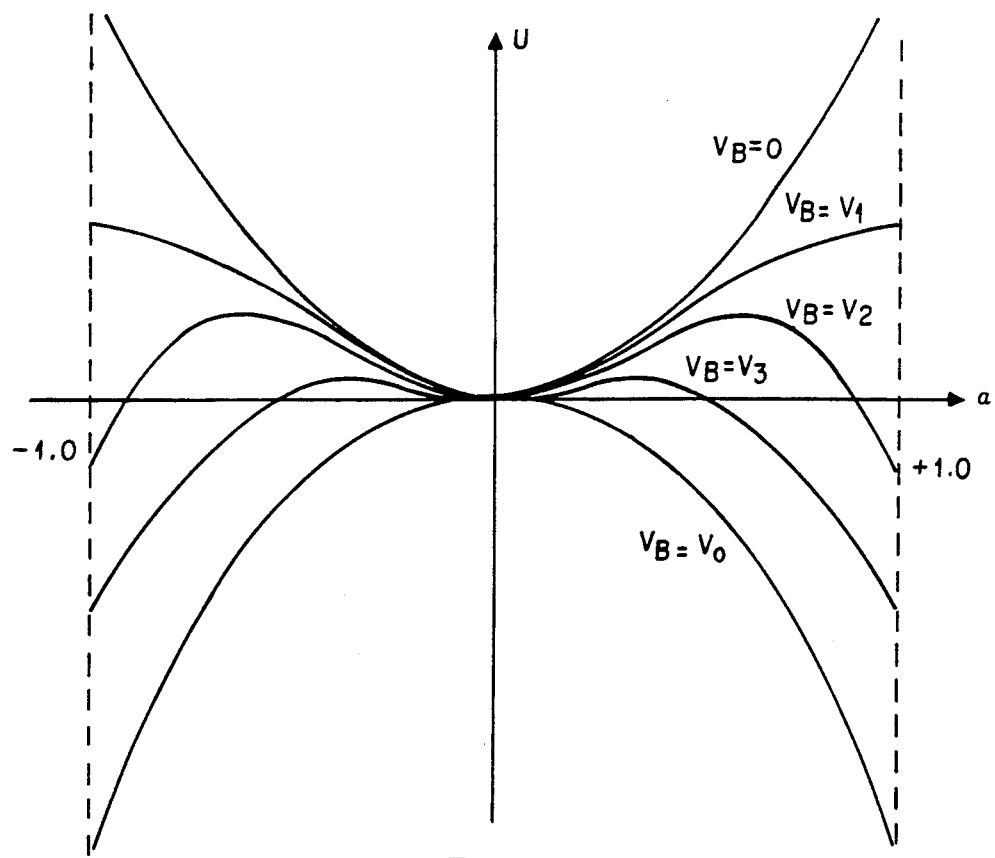
FIG. 14 illustrates the potential energy functions involved in the different modes of operation of the first preferred embodiment.

In summary, for both address electrodes tied to the same potential, pixel 20 is monostable ($\alpha=0$) for small differential bias, becomes tristable ($\alpha=0,\pm 1$) for increasing differential bias, and settles at bistable ($\alpha=\pm 1$) for all differential biases greater than or equal to $V_o$. This progression in behavior with increasing differential bias may be graphically illustrated by plotting the potential energy of torsion beam 30 as a function of beam deflection for various values of the differential bias $V_B$; FIG. 14. For low values of the differential bias ($V_B=0$ in FIG. 14) the potential increases in both directions from $\alpha=0$, and beam 30 is monostable with zero deflection the only stable point. As $V_B$ increases to $V_1$, the slope of the potential energy curve becomes 0 at $\alpha=\pm 1$ and the net torque is zero at these points. For $V_B>V_1$ the potential energy is lowered at $\alpha=\pm 1$ and barriers develop between $\alpha=0$ and $\alpha=\pm 1$; beam 30 is now tristable. Further increase of $V_B$ to $V_o$ leads to a coalescing and disappearance of the barriers at $\alpha=0$ and beam 30 becomes bistable for $V_B\geq V_o$.

The minimal differential bias $V_o$ required to make pixel 20 bistable is derived as follows. With $V_B$ applied to beam 30 and landing electrodes 40 and 41 and address electrodes 42 and 46 grounded, the net torque produced by the address electrodes on beam 30 is:

$$\tau_a = \tau_+ + \tau_- = \frac{\frac{1}{2}\epsilon_o V_B^2 L^3}{z_0^2}(g(\alpha,\beta)-g(-\alpha,\beta))$$

$$= \tau_0 \Delta g(\alpha,\beta)$$

where $\Delta g(\alpha,\beta)=g(\alpha,\beta)-g(-\alpha,\beta), g(\alpha,\beta)$ is the dimensionless function previously defined in connection with analysis of pixel 120, and $\tau_0$ is the dimensional quantity $$\frac{\frac{1}{2}\epsilon_o V_B^2 L^3}{z_0^2}.$$

Figure 18:
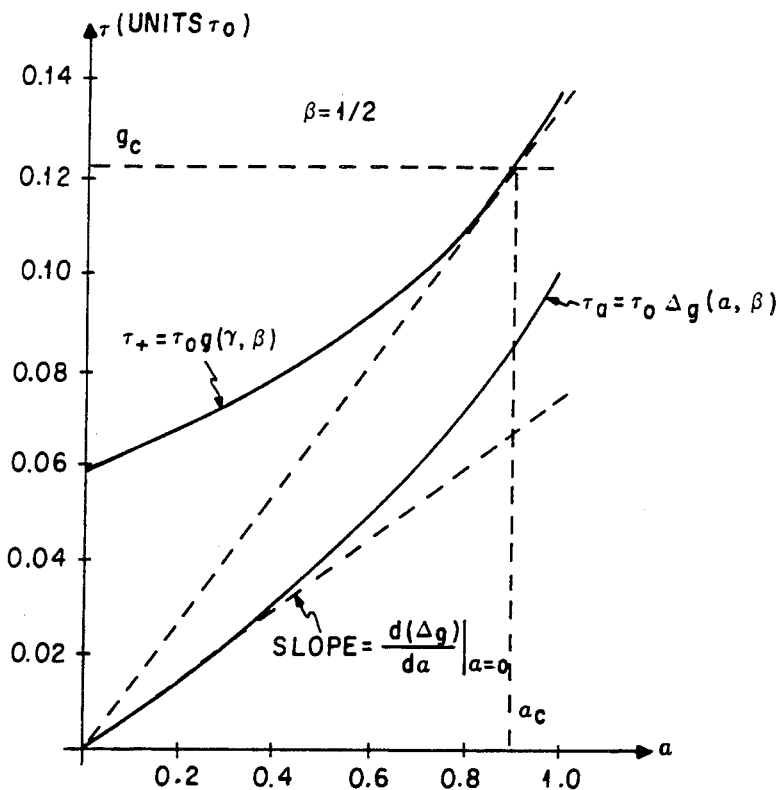
FIGS. 18-23 show the torques and deflection for analysis of the operation of the first preferred embodiment.

FIG. 18 illustrates the functions. Then $V_o$ is the value of $V_B$ that makes $\tau_a$ and $\tau_r$ tangent at $\alpha=0$:

$$\left.\frac{\partial \tau_a}{\partial \alpha}\right|_{\alpha=0} = \left.\frac{\partial \tau_r}{\partial \alpha}\right|_{\alpha=0},$$

and using definitions previously given, this can be reexpressed as $$\frac{\epsilon_o C V_o^2 L^4}{z_0^3} = \frac{2\sqrt{2}}{\left.\frac{\partial \Delta g}{\partial \alpha}\right|_{\alpha=0}}$$

If the torsion hinge compliance C is known, then the foregoing equation can be solved for $V_o$, the differential bias that just makes pixel 20 bistable. If C is unknown, then $V_o$ can be expressed as a percentage of the collapse voltage $V_c$ for operation of pixel in the analog mode and determined experimentally.

Figure 15:
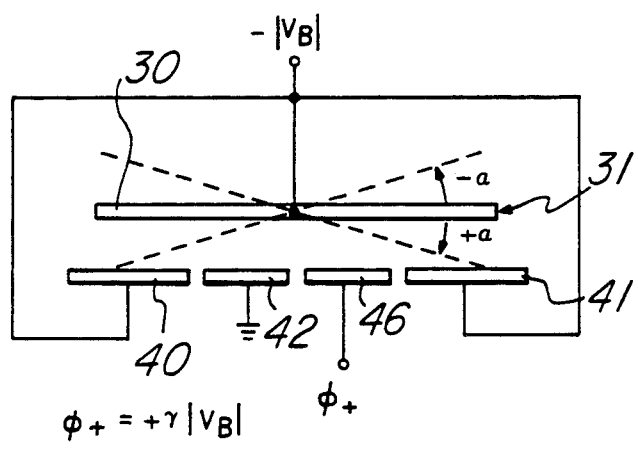
FIG. 15 shows the differential bias on the first preferred embodiment.
Figure 16:
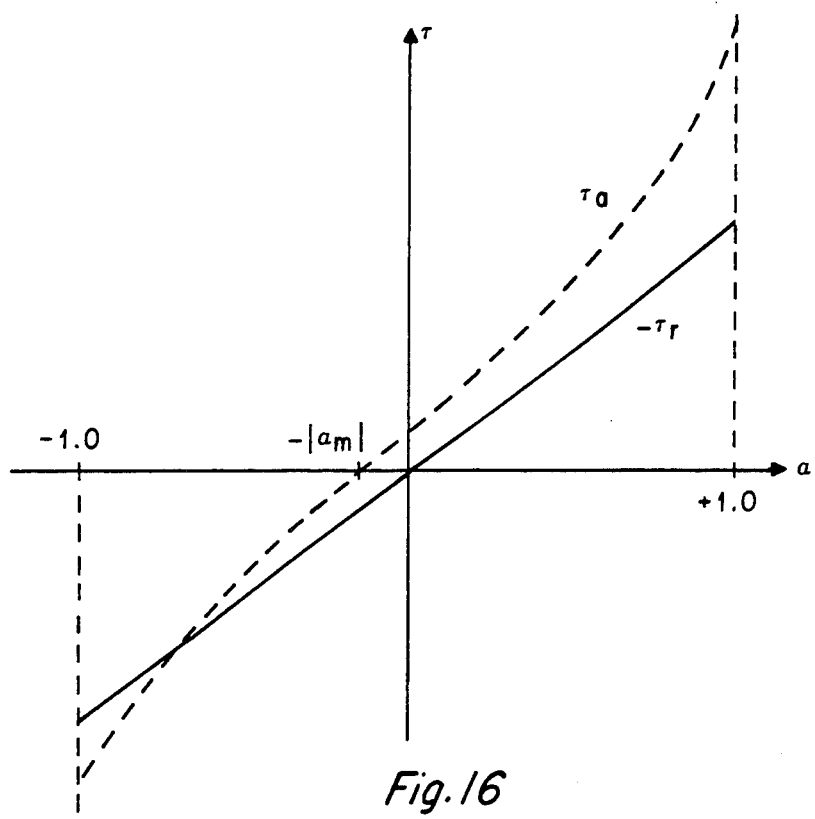
FIG. 16 illustrates the torques for applied differential bias in the first preferred embodiment.

To make a bistable pixel 20 addressable, a preferred direction for rotation must be established. If both address electrodes 42 and 46 are grounded, then small perturbations about $\alpha=0$ will cause beam 30 to randomly rotate and collapse to one of the landing electrodes upon application of the differential bias ($V_B>V_o$) to beam 30 and landing electrodes 40 and 41. However, if prior to application of the differential bias, address electrode 46 is set to a potential of $\phi_+=-\gamma V_B$ where $\gamma$ is a positive number much less than 1, then application of the differential bias $V_B$ to beam 30 and landing electrodes 40 and 41 (see FIG. 15) will produce a net torque to rotate beam 30 towards landing electrode 41. This is illustrated by the $\tau_a$ curve in FIG. 16. In effect, torsion beam has been "triggered" into the $\alpha=+1$ stable state by $\phi_+$ of the opposite sign of $V_B$. Note that the opposite signs of $\phi_+$ and $V_B$ implies the attraction to address electrode 46 is greater than the attraction to address electrode 42 once the differential bias is applied even if beam 30 is still undeflected; also the small size of $\gamma$ means that prior to application of $V_B$ beam 30 need rotate a small distance to reach a stable equilibrium point analogous to point "P" in FIG. 5. Symmetrically, applying the triggering potential $\phi_-$ to address electrode 42 will rotate beam 30 to landing electrode 40 upon application of the differential bias. Also, if the triggering potential $\phi_\pm$ is of the same sign as $V_B$, then this is approximately equivalent to applying a triggering potential of the opposite sign to the opposite address electrode once the differential bias is applied.

Figure 17:
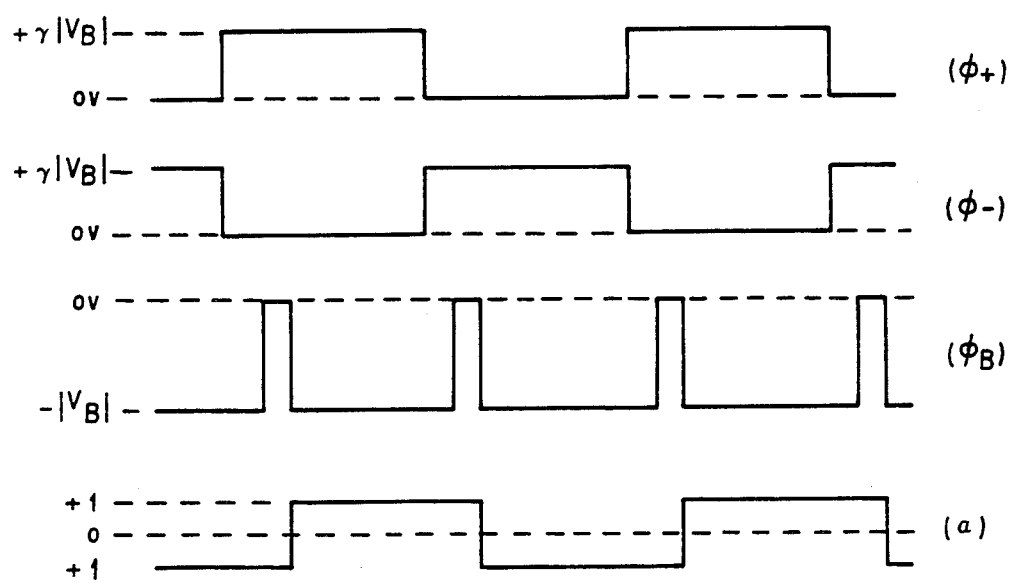
FIG. 17 is a timing diagram for bistable operation of the first preferred embodiment.

As long as $V_B$ is maintained, beam 30 in a stable state ($\alpha=\pm 1$) will remain in that stable state even if a triggering potential $\phi_\pm=-\gamma V_B$ is removed and the address electrodes returned to ground. In order to trigger beam 30 from one stable state to the other stable state, the differential bias must be momentarily turned off. When the differential bias is turned back on, the potentials of the two address electrodes are "sampled" and beam 30 is triggered into the appropriate stable state. FIG. 17 is a timing diagram for beam 30 alternately switched between $\alpha=1$ and $\alpha=-1$ with a negative $V_B$.

The magnitude of $\gamma$ is just the ratio of the address voltage to the differential bias; and the smaller $\gamma$ can be made, the lower the voltage of operation of pixel 20. Analysis of $\gamma$ begins with consideration of the attractive torque produced by electrode 46 with potential $\phi_+=\gamma|V_B|$ when the differential bias $-|V_B|$ is applied to beam 30 and landing electrodes 40 and 41 and electrode 42 is grounded. (A positive address voltage and a negative differential bias will be presumed.) Because the potential difference is $\phi_++|V_B|$, $$\tau_+ = \frac{\frac{1}{2}\epsilon_o(V_B+\gamma V_B)^2 L^3}{z_0^2}g(\alpha,\beta)$$

$$= (1+\gamma)^2 \tau_0 g(\alpha,\beta)$$

The attractive torque produced by electrode 42 at ground is the same as previously derived:

$$\tau_- = -\tau_0 g(-\alpha,\beta)$$

Thus the net attractive torque is $$\tau_a = \tau_0[(1+\gamma)^2 g(\alpha,\beta) - g(-\alpha,\beta)]$$

Figure 19:
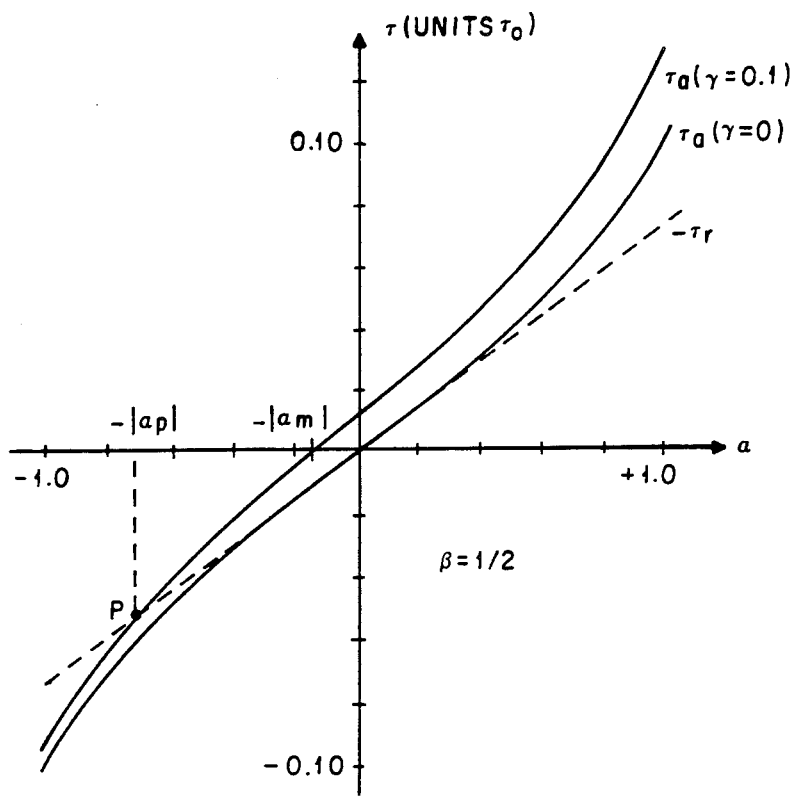

FIG. 19 illustrates $\tau_a$ for $\gamma=0$ and $\gamma=0.1$, and shows that for $\gamma=0$ pixel 20 is bistable with no preferred direction of rotation at $\alpha=0$. Contrarily, for $\gamma=0.1$ the net torque is zero at the point labelled "P", and for $\alpha > -|\alpha_p|$ beam 30 rotates towards landing electrode 41 and for $\alpha < -|\alpha_p|$ beam 30 rotates towards landing electrode 40. Now $\gamma$ also relates to the torque gain at $\alpha=0$ by use of differential bias; this gain is defined as the ratio of the net attractive torque at $\alpha=0$ with an applied address voltage of $\phi_+ = -\gamma V_B$ plus an applied differential bias of $V_B$ to the net attractive torque at $\alpha=0$ with an applied address voltage of $\phi_+ = -\gamma V_B$ but no applied differential bias. Thus $$\begin{aligned} G &= \frac{\tau_a(0,\beta)V_B}{\tau_a(0,\beta)_0} \\ &= \frac{(V_B + \gamma V_B)^2 g(0,\beta) - V_B^2 g(0,\beta)}{(\gamma V_B)^2 g(0,\beta)} \\ &= \frac{(1+\gamma)^2 - 1}{\gamma^2} \\ &= 1 + \frac{2}{\gamma} \end{aligned}$$

For example, if $V_B = -50$ volts and $\gamma=0.1$ (so the address voltage $\phi_+ = +5$ volts), then $G=21$. This means that the torque at $\alpha=0$ is twenty-one times greater when the 5 volt address voltage is combined with a 50 volt differential bias than when the 5 volt address voltage is used alone. This concept of torque gain helps illustrate the feature of differential bias of providing a gain in the torque produced by a smaller address voltage without also producing a net torque when acting alone.

Figure 20:
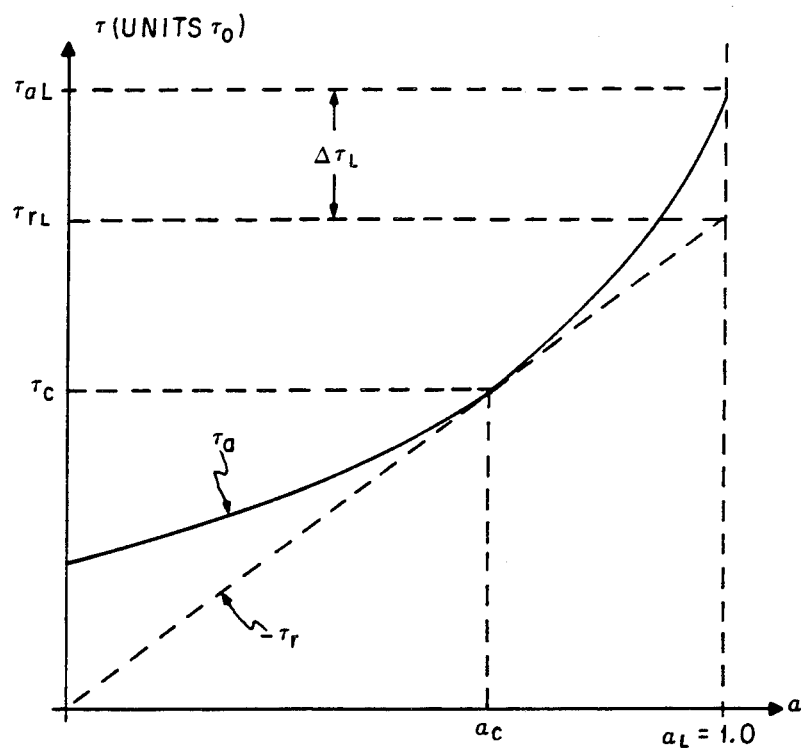

A feature of the use of address electrodes with $\beta<1$ in pixel 20 is the soft landing that beam 30 makes when it hits landing electrode 40 or 41 as compared to the landing that beam 130 of pixel 120 makes when it hits electrode 142 or 146 under similar operating conditions. First consider pixel 120. FIG. 20 illustrates the attracting and restoring torques for pixel 120 with the collapse voltage applied to address electrode 146 but with electrode 146 decreased in width to $\beta$ times the half-width of beam 130 (this is the same $\beta$ as in pixel 20 and is needed to avoid the unbounded nature of the attractive torque if beam 130 hits electrode 146). The landing torque is just the difference between the attracting and restoring torques at the landing deflection ($\alpha=1$); and the landing torque normalized to the restoring torque is this difference divided by the restoring torque at the landing deflection:

$$\begin{aligned} \tau_L &= \frac{\tau_a(1,\beta) - \tau_r(1,\beta)}{\tau_r(1,\beta)} \\ &= \frac{g(1,\beta)}{g(\alpha_c,\beta)} \frac{\alpha_c}{1} - 1 \end{aligned}$$

where the geometry of FIG. 20 was used to substitute $\tau_r(1,\beta) = \tau_0 g(\alpha_c,\beta)/\alpha_c$. Thus if $\beta$ can be chosen to make the collapse deflection ($\alpha_c$) approximately equal to 1, then $\tau_L$ approaches zero. For $\beta=0.5$ the collapse deflection $\alpha_c=0.9$ and $\tau_L$ computes to 0.011 so the landing torque is only 1% of the restoring torque at landing.

Applying a thin dielectric layer over electrode 146 will permit use of $\beta=1$ width electrodes 146 because this will prevent beam 130 from hitting electrode 146 and destructing (in effect, $\alpha$ is limited to a value slightly less than 1.0). Thus the landing deflection $\alpha_L$ may be less than 1, and the product $\alpha_L \beta$ approaching 1 is the logarithmic singularity in $g(\alpha,\beta)$. And the normalized landing torque for $\beta=1$ and $\alpha_L=0.987$ (which corresponds to pixel 120 with polysilicon electrode 146 covered 2,000 Å of silicon dioxide and a spacer layer of 4 micron thickness and operation in air) computes to about 3.06, and the collapse deflection $\alpha_c=0.54$. The ratio of the normalized landing torque with $\beta=1$ to the normalized landing $\beta=0.5$ is thus about 278; this indicates the large effect of $\beta$ on normalized landing torque.

There are two effects to be considered in determining the utility of soft landing. The first effect is the kinetic effect which deals with the mechanical damage produced by the impact of the moving beam hitting the electrode (either a landing electrode or the dielectric on an address electrode). The second effect is the static effect which deals with cold welding effects produced between the beam and the electrode caused by a sustained landing torque. The static effect is reduced by lowering the landing torque as has just been considered, and the kinetic effect is reduced by lowering the kinetic energy (speed) at landing.

The kinetic energy at landing can be computed in two extreme cases, depending on the degree of mechanical damping. Damping is caused by the displacement of the air in the gap between the beam and the electrode as the beam quickly rotates ($\approx 1$ $\mu$sec) to hit the electrode; and the two extreme cases are overdamping and no damping.

In the overdamped case the speed of the beam is quickly brought to zero in the absence of a sustained attractive torque. Thus for the case of $\beta$ selected to reduce the normalized landing torque the speed is reduced to near zero upon landing.

In the undamped case the kinetic energy continually increases until the beam hits the electrode and may be computed by integrating $\tau_a - \tau_r$ from $\alpha=0$ to $\alpha=1$. The ratio of this integration for $\beta=0.5$ to this integration for $\beta=1.0$ is even smaller than the ratio of normalized landing torques considered previously. Thus the soft landing is effective in reducing both static and kinetic landing effects for pixel 120.

Figure 21:
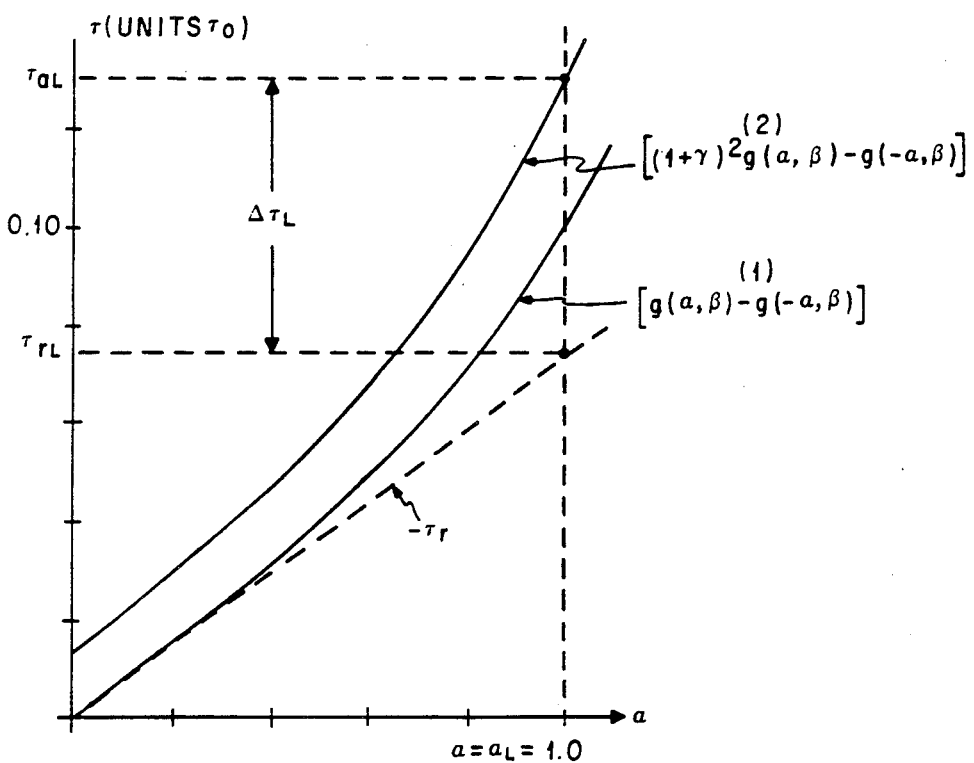

The soft landing analysis for pixel 20 with the differential bias at a level to just make pixel 20 bistable ($V_B = V_o$) is as follows. FIG. 21 shows $\tau_a$ for $\gamma=0$ (curve no. 1) and for $\gamma=0.1$ (curve no. 2). Now the condition $V_B = V_o$ implies the tangency of the attractive and restoring torque curves at $\alpha=0$:

$$\tau_0 \frac{\partial}{\partial \alpha}(g(\alpha,\beta) - g(-\alpha,\beta))_{\alpha=0} = \tau_r$$

and the normalized landing torque for the bistable pixel 20 is $$\tau_L = \frac{\tau_a(1,\beta) - \tau_r(1,\beta)}{\tau_r(1,\beta)}$$

$$= \frac{(1 + \gamma)^2 g(1,\beta) - G(-1,\beta)}{\frac{\partial}{\partial \alpha}(g(\alpha,\beta) - g(-\alpha,\beta))_{\alpha=0}}$$

For $\beta=0.5$ and $\gamma=0.1$ the normalized landing torque is 0.74; that is, the landing torque is 74% of the restoring torque. Contrarily, for $\beta=1.0, \alpha=0.987, \gamma=0.1$, the normalized landing torque is 15.8, so the ratio of landing torques is 21.4.

Figure 22:
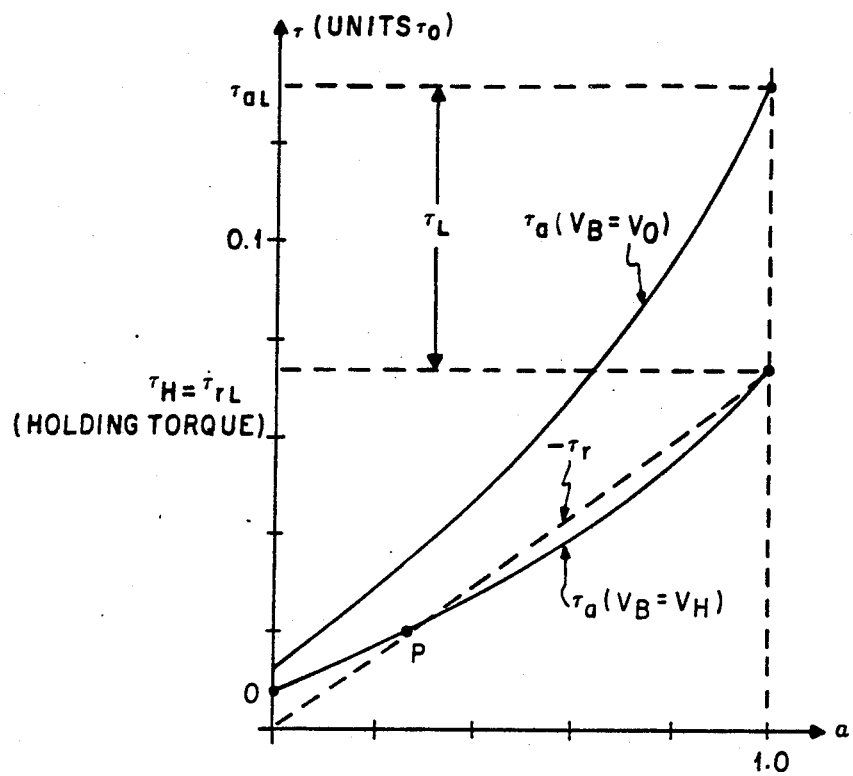

The normalized landing torque can be experimentally determined by measuring the holding voltage $V_H$ as shown in FIG. 22. The upper $\tau_a$ curve represent the attracting torque for the minimal differential bias $V_o$ making pixel 20 bistable and a address voltage $\phi_\alpha = -\gamma V_B$, and the beam lands with a landing torque $\tau_L$. Now presume that $\gamma$ is fixed and $V_B$ is slowly decreased in magnitude below $V_o$. At $V_B = V_H$, $\tau_a(1)$ has decreased in magnitude to $\tau_r(1)$, and the landing torque has decreased to zero. For smaller $|V_B|$ the net torque is in a direction to restore beam 30 to the analog equilibrium position labelled "P" in FIG. 22. Therefore, as $V_B$ is slowly decreased and becomes slightly less than $V_H$ in magnitude, beam 30 suddenly releases from its landed position and returns to the much smaller deflected analog equilibrium.

Figure 23:
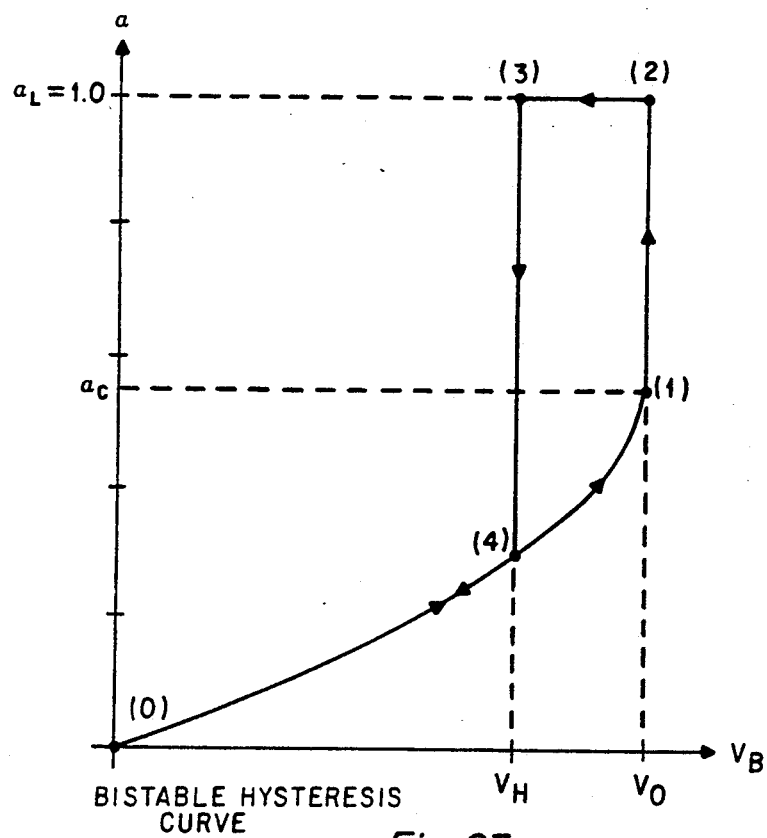

The operation of pixel 20 in the bistable mode can thus be described in terms of a hysteresis curve as in FIG. 23 which is a graph of $\alpha$ as a function of differential bias $V_B$ for a fixed $\gamma$. At point (0) $V_B=0$ so $\phi_\alpha = -\gamma V_B$ is also zero and beam 30 is undeflected ($\alpha=0$). From point (0) to point (1) pixel 20 is in the analog mode and the address voltage ($\phi_\alpha = -\gamma V_B$) applied to address electrode 46 with address electrode 42 grounded results in a beam 30 deflection to the stable equilibrium $\alpha(V_B)$ which is less than 1. As $V_B$ increases, $\alpha$ increases until bistable operation at $V_B = V_o$ is reached at point (1) with a deflection of $\alpha_c$, and beam 30 collapses to landing electrode 41 at point (2). Now beam 30 stays on landing electrode 41 as the magnitude of $V_B$ is decreased until $V_B = V_H$ is reached at point (3) and beam 30 releases from electrode 41. Released beam 30 returns to the deflection corresponding to $V_H$ in the analog mode; see point (4) in FIG. 23.

As with any digital device, pixel 20 operating in the bistable mode will not switch into proper stable states if certain pixel parameters deviate from the intended operating point by more than a specified amount. The amount of allowed deviation is called the noise margin; if any pixel parameter varies by more than the noise margin, then the pixel will switch into the wrong state. Moreover, any noise or deviation of one parameter from the intended operating point, reduces the noise margin of the other parameters for the pixel.

Figure 24:
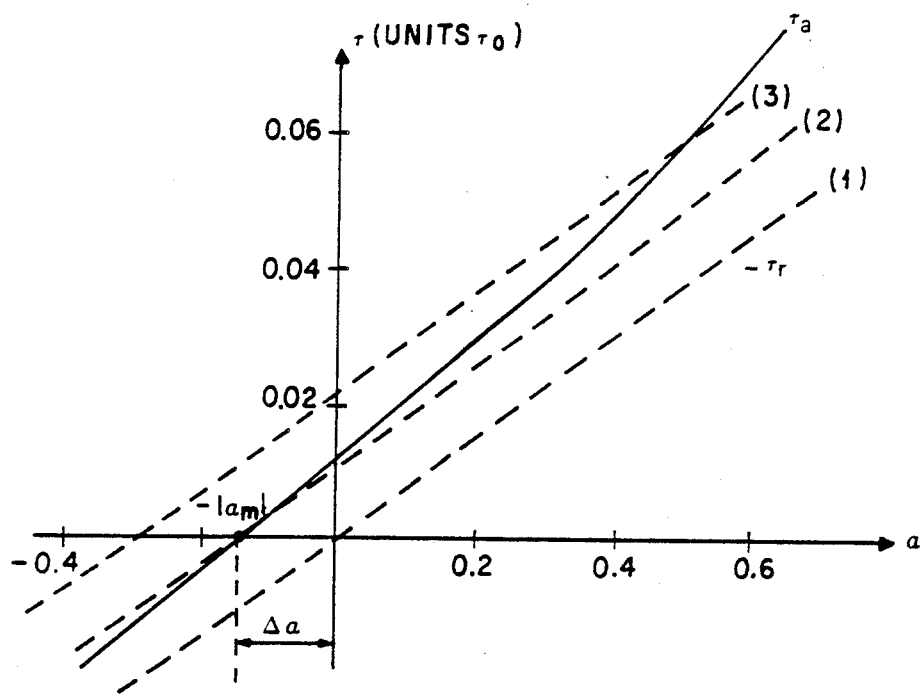
FIGS. 24-26 illustrate noise margin analysis for the first preferred embodiment.

The two most significant pixel 20 parameter deviations that can lead to faulty bistable operation are (i) torsion beam 30 deviation from flatness and (ii) address electrode 42 and 46 misalignment with respect to torsion hinges 34 and 36 and beam 30. First consider the margin for beam 30 deviation from flatness, denoted $\Delta \alpha$. FIG. 24 shows the attracting torque $\tau_a$ for pixel 20 addressed at electrode 46 (to deflect beam 30 to $\alpha=+1$ at landing electrode 41), and also the restoring torque $\tau_r$ for three different deviations of beam 30 from flatness (the dashed lines labelled (1), (2), and (3)). For line (1) beam 30 is flat and the net torque rotates beam 30 towards $\alpha=+1$. For line (2) beam 30 has a built-in initial deflection of $-|\alpha_m|$ (towards landing electrode 40) and the application of the differential bias plus addressing voltage to address electrode 46 and ground to address electrode 42 produces zero net torque because of the in-built initial deflection. For line (3) the built-in initial deflection is so large that application of the differential bias plus addressing voltage on electrode 46 and ground 42 produces a net torque rotating beam 30 towards $\alpha=-1$; that is, the wrong stable state results. Thus $|\alpha_m|$ is the maximum tolerable deviation from beam flatness and is called the margin for angular deviation. $|\alpha_m|$ is computed by simply finding the solution of $$\tau_a(\alpha) = \tau_0[(1+\gamma)^2 g(\alpha,\beta) - g(-\alpha,\beta)] = 0$$

For $|\alpha_m| << 1$ the function g is easily approximated and the solution is $$\alpha_m \approx -\frac{1/2 - 1/3\beta}{2/3\beta - 1/2\beta^2} \cdot \frac{(1+\gamma)^2 - 1}{1 + (\gamma)^2 + 1}$$

Of course, the angular margin in the direction of landing electrode 46 is the same by symmetry.

For $\beta=0.5$ and $\gamma << 1$, the expression for $\alpha_m$ reduces to $$\alpha_m = \pm 1.6 \gamma$$

The angular deviation margin increases with $\gamma$, as expected, and as flatness degrades proper operation requires larger addressing voltage relative to the differential bias. For example, with $\gamma=0.1$ and a landing angle of 10 degrees, $|\alpha_m|=0.16$ and this corresponds to 1.6 degrees of angular deviation from flatness (recall $\alpha$ is the normalized deflection). A flatness of 0.5 degree has been routinely achieved in practice.

Figure 25:
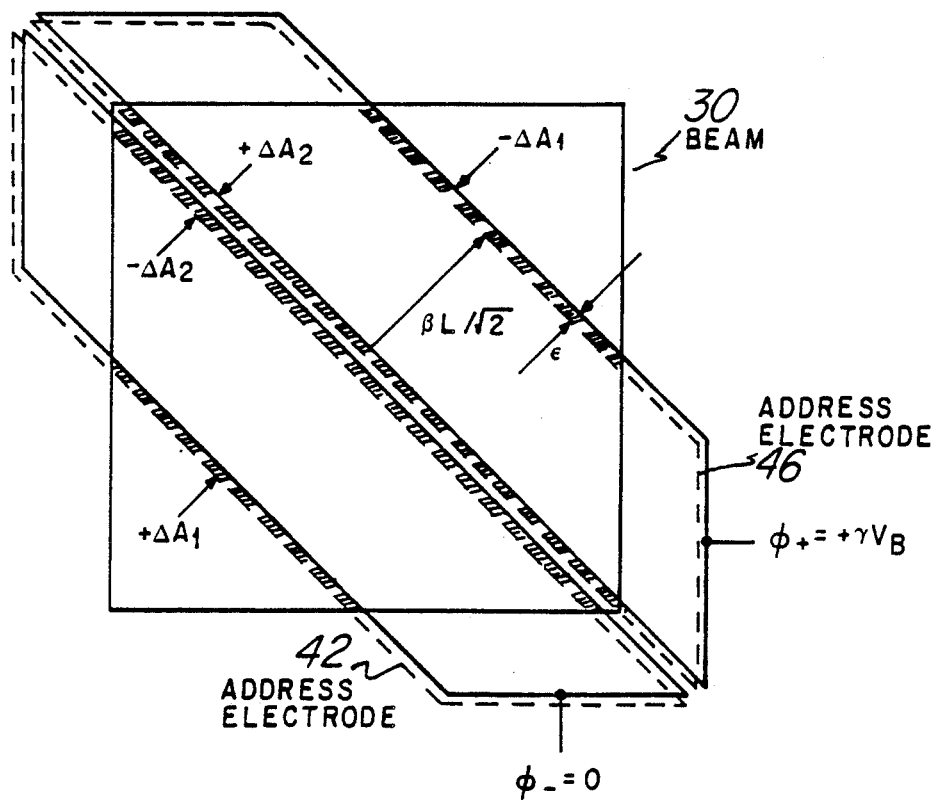
Figure 26:
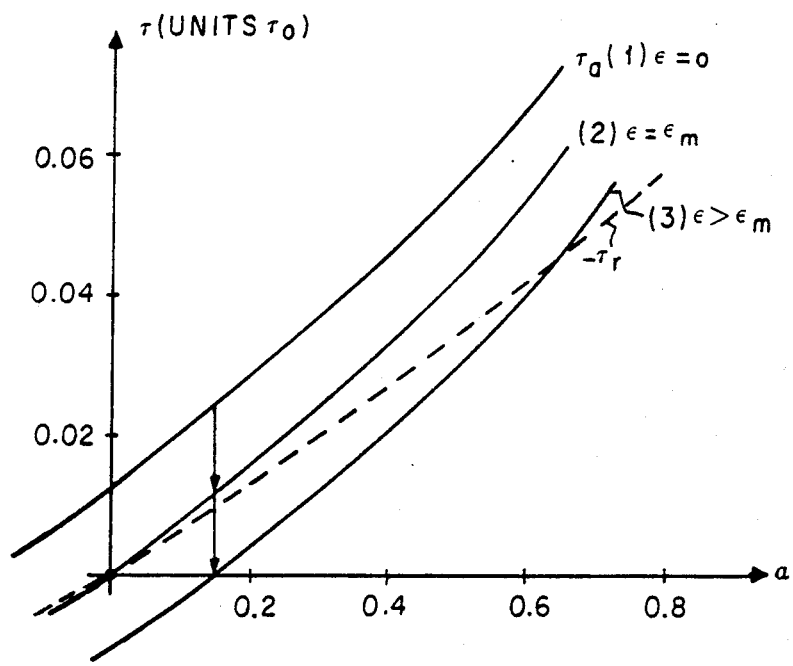

One type of address electrode 42 and 46 misalignment with respect to beam 30 and torsion hinges 34 and 36 is illustrated in plan view in FIG. 25; namely, the electrodes are misaligned along the diagonal by a distance $\epsilon$ in the direction of landing electrode 40 and away from landing electrode 41 but all other alignments are correct. For simplicity, only this misalignment will be analyzed. First, as shown in FIG. 25 the misalignment defines the shaded areas of difference between beam 30 and electrodes 42 and 46; these areas lead to changes in the torque produced by the differential bias and addressing voltages. The torque changes from area $\pm \Delta A_2$ will be ignored due to their small moment arms, and assume electrode 46 has the addressing voltage $\phi_\alpha = \gamma V_B$ and electrode 42 is grounded. Thus area $-\Delta A_1$ diminishes the positive torque $\tau_{30}$ and area $\Delta A_1$ increases the negative torque $\tau_{31}$. FIG. 26 illustrates this effect on the attractive torque for three misalignments. For curve (1) the misalignment $\epsilon$ is zero and the net torque is positive so beam 30 rotates to the correct landing electrode. For curve (2) the misalignment equals $\epsilon_m$ and the attractive torque about $\alpha=0$ approximates the restoring torque and the net torque is zero, so fluctuations of beam 30 determine to which of the landing electrodes 40 or 41 beam 30 will rotate. With the larger misalignment $\epsilon > \epsilon_m$ of curve (3), the net torque at $\alpha=0$ is negative and beam 30 rotates to landing electrode 40 instead of landing electrode 41; that is, the wrong stable state results. To determine the margin $\epsilon_m$, simply compute the effect of the misalignment $\epsilon$ on $\tau_+$ and $\tau_-$ and solve for the $\epsilon$ that makes $\tau_\alpha$ zero at $\alpha=0$. Of course, $\epsilon$ misalignment is just the same as a different width electrode, so $$\tau_+(\alpha) = \tau_0(1 + \gamma)^2 g(\alpha,\beta - \epsilon\sqrt{2}/L)$$

$$\tau_-(\alpha) = -\tau_0 g(-\alpha,\beta + \epsilon\sqrt{2}/L)$$

and the asymptotic form for $g(\alpha,\beta)$ for $\alpha$ very small is easily derived from the definition of g:

$$g(\alpha,\beta) \approx \frac{\beta^2(3 - 2\beta)}{6\sqrt{2}} + O(\alpha)$$

For small $\epsilon$ the condition $\tau_\alpha$ vanishes at $\alpha=0$ is just $$(1 + \gamma)^2(\beta - \epsilon\sqrt{2}/L)^2 - (\beta + \epsilon\sqrt{2}/L)^2 = 0$$

$$\frac{\epsilon_m}{L} \approx \frac{\beta\gamma}{2\sqrt{2}}$$

For example, with $\gamma=0.1$ and $\beta=0.5$, the misalignment margin is $\epsilon_m=0.02L$; for pixel 20 with L=12.5 microns this is $\epsilon_m=0.25$ microns, which exceeds typical current stepper misalignment. Of course, increasing $\gamma$ increases $\epsilon_m$.

Figure 27:
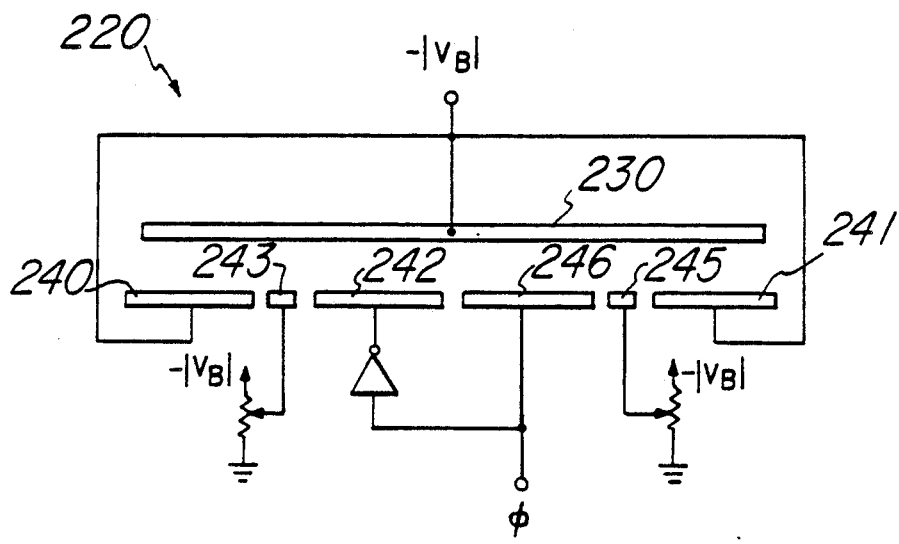
FIG. 27 is a schematic cross sectional elevation view of balance electrodes added to the first preferred embodiment.

Address electrode misalignment can also be compensated for by use of balance electrodes as illustrated schematically in cross sectional elevation view of preferred embodiment pixel 220 in FIG. 27. Pixel 220 has address electrodes 242 and 246, landing electrodes 240 and 241, plus balance electrodes 243 and 245 interposed between the address electrodes and the landing electrodes. If there is no misalignment, then the balance electrodes would be biased at the differential bias voltage; whereas, if there is misalignment of the address electrodes in the direction of landing electrode 240 (as in the previous discussion), then balance electrode would be biased towards ground to supply additional torque (increase $\tau_+$) to counteract the misalignment. If the misalignment is in the other direction, then balance electrode 243 is biased towards ground.

Figure 28:
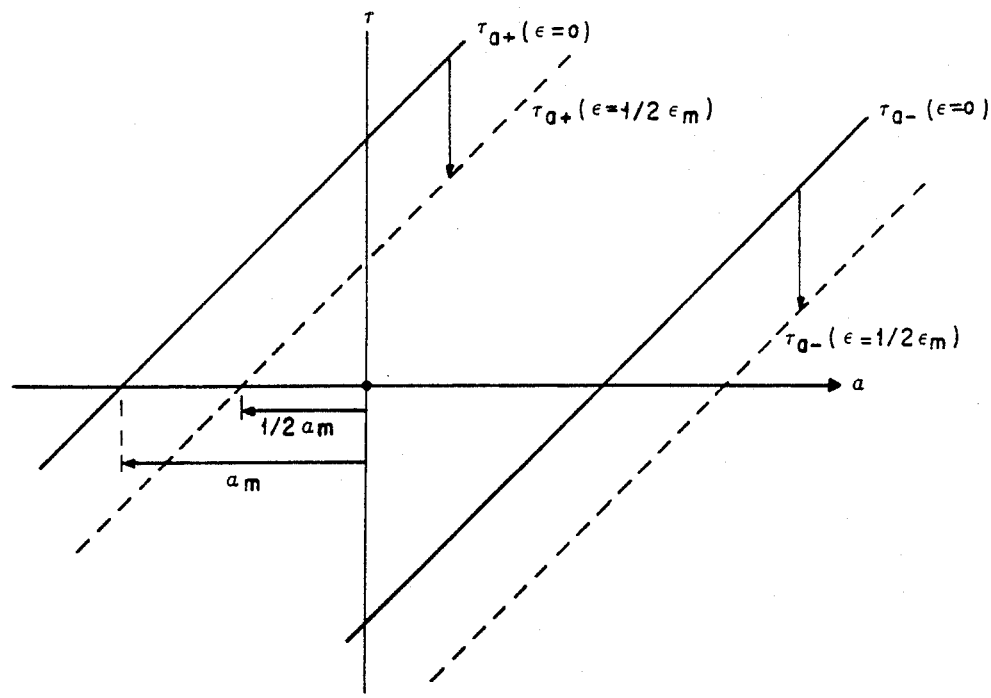
FIG. 28 illustrates noise margin interaction.

The noise margins computed above are not independent, and the effects interact to lower the margins. For example, FIG. 28 illustrates the attractive torques for the two bistable address conditions (addressing the +electrode 46 or the −electrode 42) with zero misalignment and with misalignment equal to one half of the margin ($\epsilon=\frac{1}{2}\epsilon_m$). The margin for angular deviation $\alpha_m$ is shown for both the aligned and misaligned cases, and clearly the misaligned case has a margin for angular deviation of one half of the aligned case margin with respect to the +electrode and a 50% greater margin with respect to the −electrode. Of course, the argument is symmetric and nonflatness within the angular deviation margin will lower the misalignment margin. Increase of $\gamma$ will expand the margins.

Figure 29:
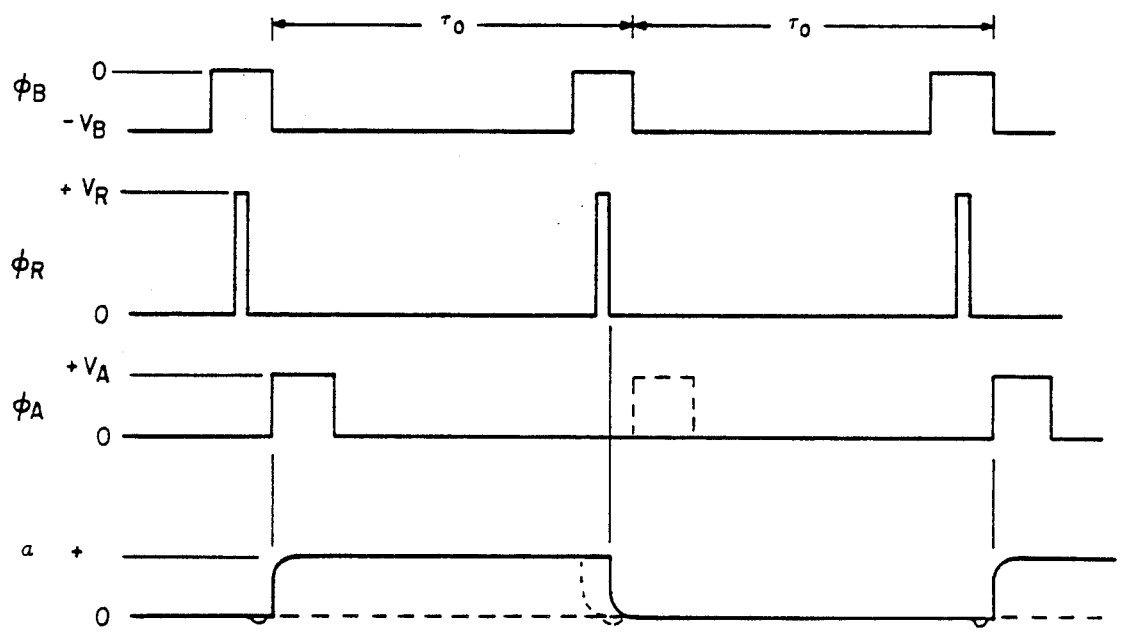
FIG. 29 is a timing diagram for a first method of reset for the first preferred embodiment.

Despite the fact that beam 30 and landing electrodes 40 and 41 are electrically connected and the fact that beam 30 soft lands on landing electrodes 40 and 41 during operation, beam 30 may stick to landing electrode 40 or 41. Thus the following electrical reset methods may be used with pixel 20 to augment the restoring torque provided by the torsion hinges 34 and 36 to pull beam 30 off of one of the landing electrodes 40 or 41 and reset beam 30 to an undeflected position. The first method uses address electrode 42 as a reset electrode and address electrode 46 for addressing; pixel 20 is operated in the monostable or tristable mode and with rotation in one direction (to landing electrode 41) only. The reset method includes a high voltage pulse (90 volts for 1 $\mu$sec) applied to reset electrode 42 during the time that both the differential bias and the addressing voltage are at ground: See FIG. 29 for a timing diagram which shows the differential bias $\phi_B$ applied to beam 30 and landing electrodes 40 and 41, the reset pulses $\phi_R$ applied to electrode 42 during times that $\phi_B$ vanishes, the addressing voltage $\phi_A$ for a sequence of deflect, not deflect, deflect applied to electrode 46, and the resultant beam deflection $\alpha$. If beam 30 were stuck on landing electrode 41, then the pulse on reset electrode 42 provides a short duration torque to help the restoring torque of torsion hinges 34 and 36 pull beam 30 off of landing electrode 41. If beam 30, however, were not stuck on landing electrode 41 but rather were undeflected, then the pulse on reset electrode 41 would rotate beam 30 towards landing electrode 40. But the short duration of the pulse (1 $\mu$sec) is less than the time constant of beam 30 (about 12 $\mu$sec) and beam 30 will not reach landing electrode 40 and the restoring torque of torsion hinges 34 and 36 will return beam 30 to the undeflected state. This short-duration fluctuation in the direction of landing electrode 40 is indicated by the dip to negative $\alpha$ values in FIG. 29. Also, if beam 30 does not stick, then the restoring force of torsion hinges 34 and 36 brings beam 30 back to $\alpha=0$ as indicated by the dashed line in the $\alpha$ plot in FIG. 29. All of the reset electrodes 40 of an array of pixels 20 on a single integrated circuit chip could be tied together on-chip and a single off-chip high voltage pulse driver would supply the reset pulses.

Figure 30A:
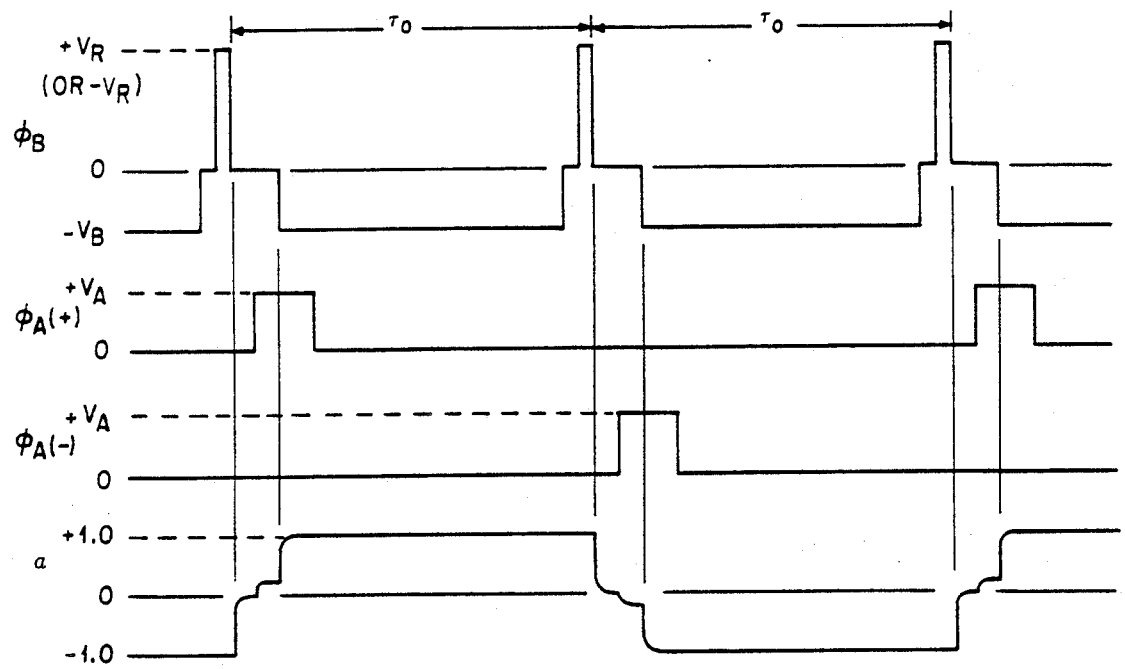
FIGS. 30A-B are a timing diagram and cross sectional elevation view of a second method of reset for the first preferred embodiment.
Figure 30B:
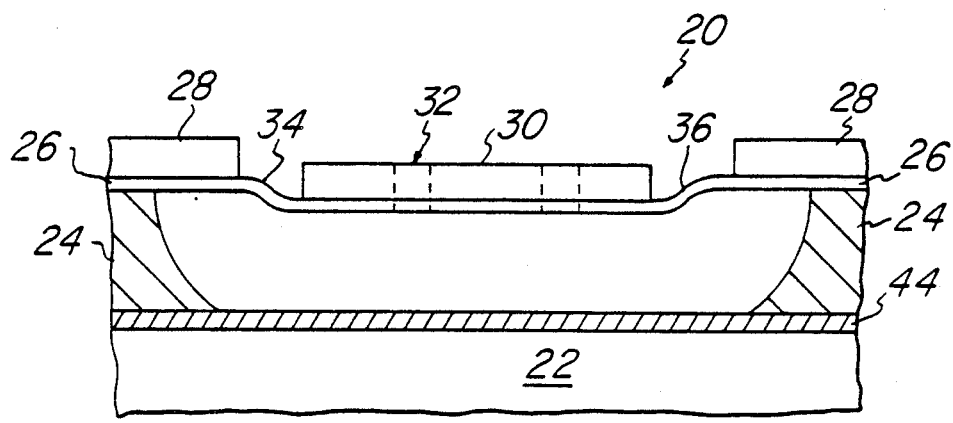

A second reset method is illustrated in FIGS. 30A-B and uses a nonrotational bending of torsion hinges 34 and 36 to help pull a stuck beam 30 off of landing electrodes 40 or 41. In this method the reset pulse is applied to the landing electrodes 40 and 41 and beam 30 while address electrodes 42 and 46 are grounded. In an array of pixels 20 a differential bias bus may be used to connect together all of the landing electrodes and this bus is connected to the reflecting layer 26-28 which includes the torsion beams 30, so the reset pulse would just be applied to the differential bias bus. In contrast to the first reset method, with the second reset method pixel 20 may be operated in any mode. The reset pulse (typically 60 volts for 1 $\mu$sec) applied to beam 30 with the address electrodes grounded deflects beam 30 towards substrate 22 whether beam 30 is undeflected or stuck to one of the landing electrodes; the nonrotational bending of torsion hinges 34 and 36 stores the potential energy of this deflection. See FIG. 30A for a timing diagram and FIG. 30B for illustration of the deflection. In FIG. 30A the beam and landing electrode bias $\phi_B$ has a reset pulse $(+|V_R|)$ of opposite polarity to the differential bias $(-|V_B|)$, although the reset pulse could have the same polarity; the addressing voltages ($\phi_A(+)$ for electrode 46 and $\phi_A(-)$ for electrode 42) are for a sequence of deflections of beam 30 first to landing electrode 41, then landing electrode 40, and lastly back to landing electrode 41. At the end of the reset pulse this stored potential energy is released and provides an impulse pulling beam 30 straight up. Thus an undeflected beam 30 will just exhibit vertical damped oscillation about the undeflected state, wheres a stuck beam 30 is pulled off of the landing electrode and the restoring torque returns it to the undeflected state plus also exhibiting vertical damped oscillations. Because this second reset method resets a beam no matter what its landing direction, any inadvertent collapse and sticking of beams on account of electrostatic discharge due to handling is automatically corrected as soon as a reset pulse is applied. See FIG. 30B for illustration of the vertically deflected beam 30 in cross sectional elevation view along the torsion hinge axis which is between the address electrods 42 and 46.

Figure 31:
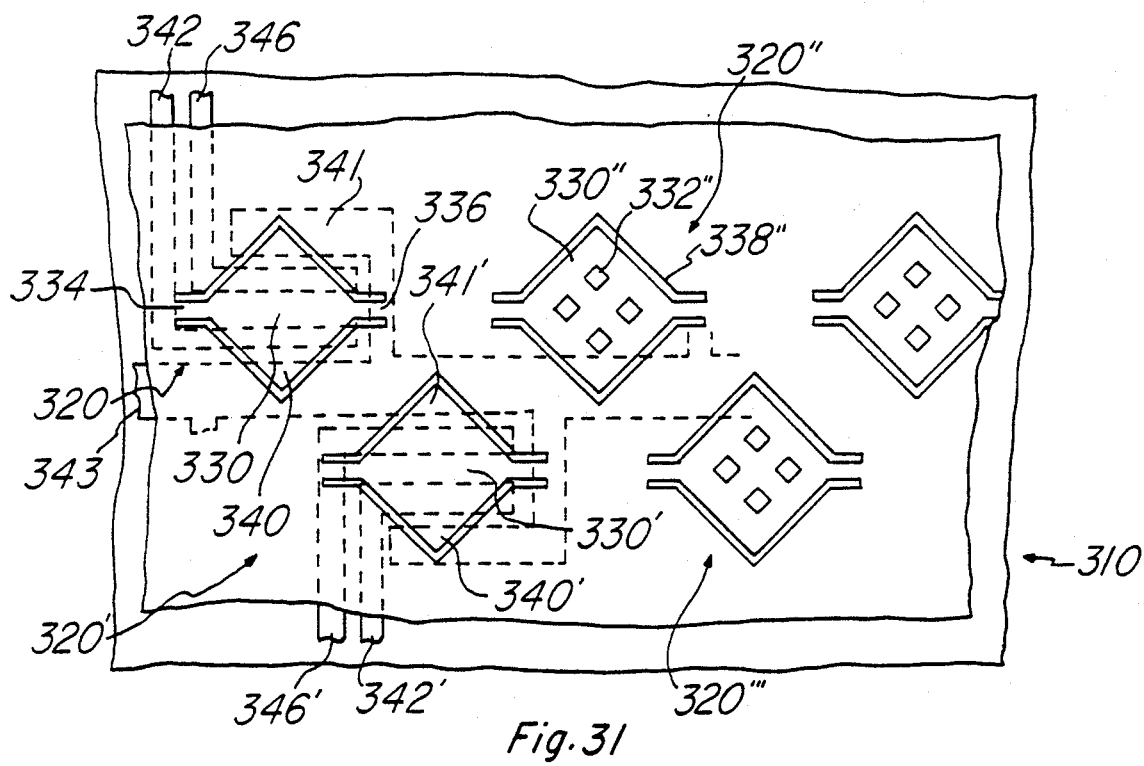
FIG. 31 is a plan view of a linear array second preferred embodiment.
Figure 32A:
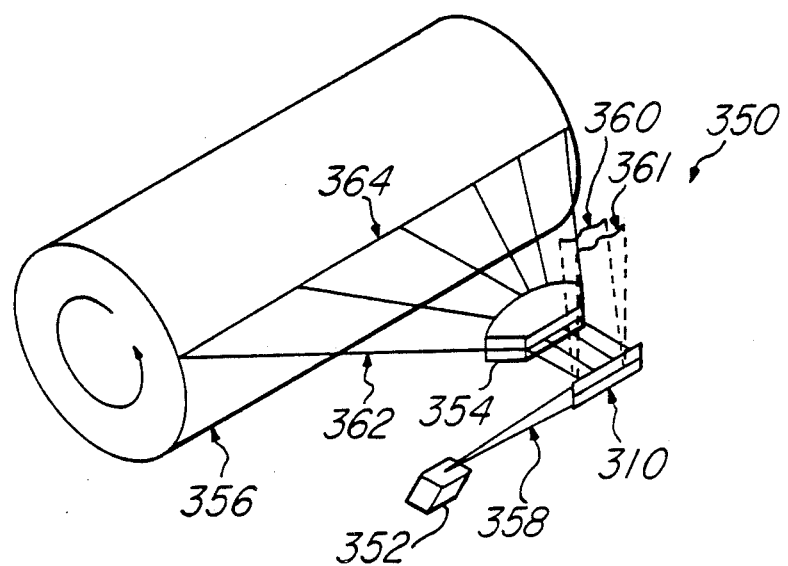
FIGS. 32A-C schematically illustrate use of the second preferred embodiment for electrophotographic printing.
Figure 32B:
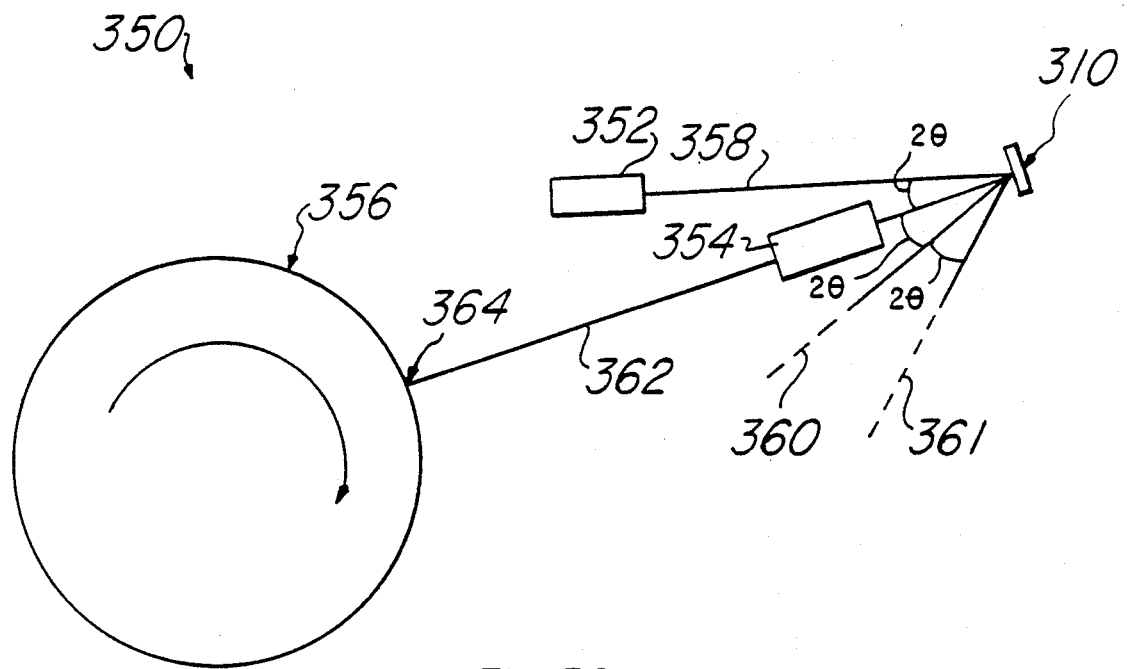
Figure 32C:
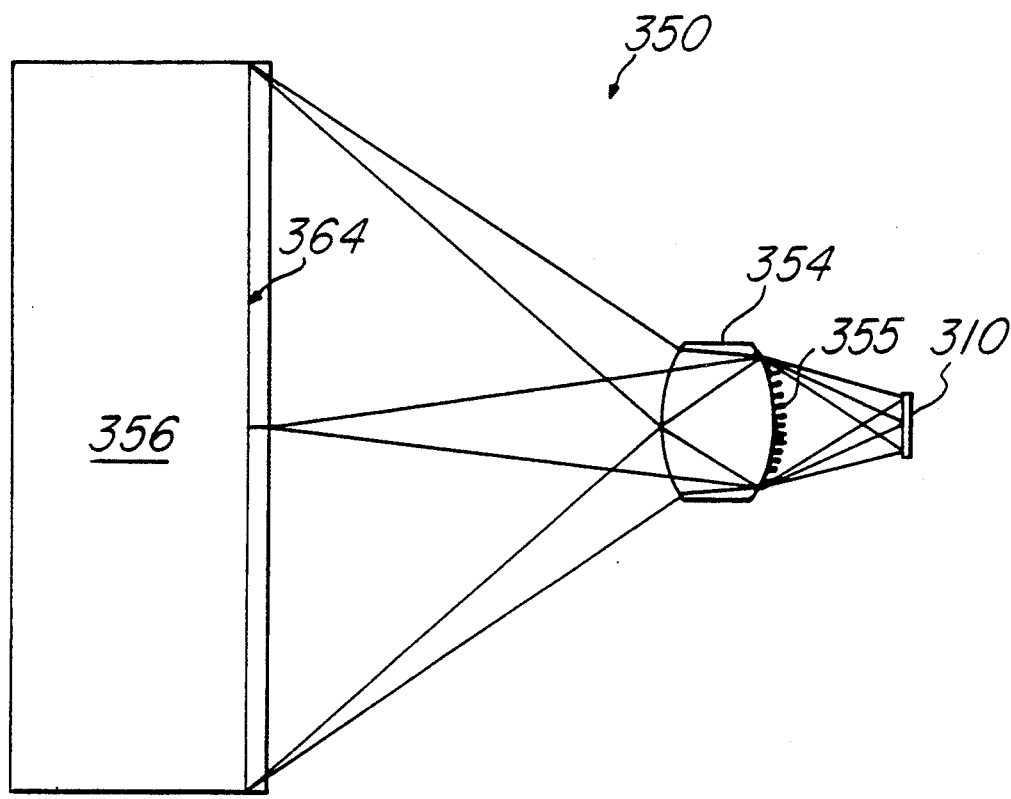

FIG. 31 is a plan view of a portion of a linear array 310 of second preferred embodiment pixels 320, 320', 320", ... with each of the pixels similar to pixel 20. For pixel 320 the beam 330, torsion hinges 334 and 336, landing electrodes 340 and 341, and address electrodes 342 and 346 are shown; similarly for pixel 320'. Note that the landing electrodes all connect to a central metal line 343. Linear array 310 could be used for electrophotographic printing as illustrated schematically in FIGS. 32A-C. FIG. 32A is a perspective view and FIGS. 32B-C are elevation and plan views showing system 350 which includes light source and optics 352, array 310, imaging lens 354, and photoconductive drum 356; the light from source 352 is in the form of a sheet 358 and illuminates linear array 310 with the light reflected from the area between beams 330, 330', 330", ... forming sheet 360, the light reflected from negatively deflected beams within sheet 361, and the light reflected from positively deflected beams passing through imaging lens 354 within sheet 362 and focussed on drum 356 within line 364 as a series of dots, one for each deflected beam. Because linear array 310 is actually two rows of pixels, the image on drum 356 are dots within two lines and electronic delay of addressing one of the rows of pixels together with the drum rotation bring the image dots back into one line 364. Thus a page of text or a frame of graphics information which has been digitized and is in raster-scanned format can be printed by feeding the information a line at a time to array 310 to form dots a line 364 at a time on drum 356 as drum 356 rotates; these dot images are transferred to paper by standard techniques such as xerography. If $\theta$ is the deflection angle of beam 330 when on landing electrodes 341, then sheet 362 is normal to linear array 310 when the angle of incidence of sheet 358 is $2\theta$ from the normal to linear array 310. This geometry is illustrated in FIG. 32B and permits imaging lens 354 to be oriented normal to linear array 310. Each positively deflected beam produces an image 355 of light source 352 on imaging lens 354 as schematically shown in FIG. 32C for three beams.

Linear array 310 with the pixels operating in bistable mode has advantages over linear arrays of cantilever beam pixels because (i) the bistable pixel operates at a larger deflection angle, so the angular subtense of the light source can be increased to yield a brighter dot at the drum; (ii) the turn-off pixels have the torsion beams deflected in the opposite direction rather than just undeflected as in the cantilever case, this doubles the reflection angle from turned-off pixels and lessens the optical contrast degradation due to beam curvature and eliminates the influence of anguar deviation for zero applied voltage; and (iii) brightness uniformity is improved because the deflection angle is a linear function of the spacer thickness and not dependent upon a non-linear region of operation where the deflection uniformity is very sensitive to spacer thickness and hinge compliance as with the cantilever beam.

Figure 33:
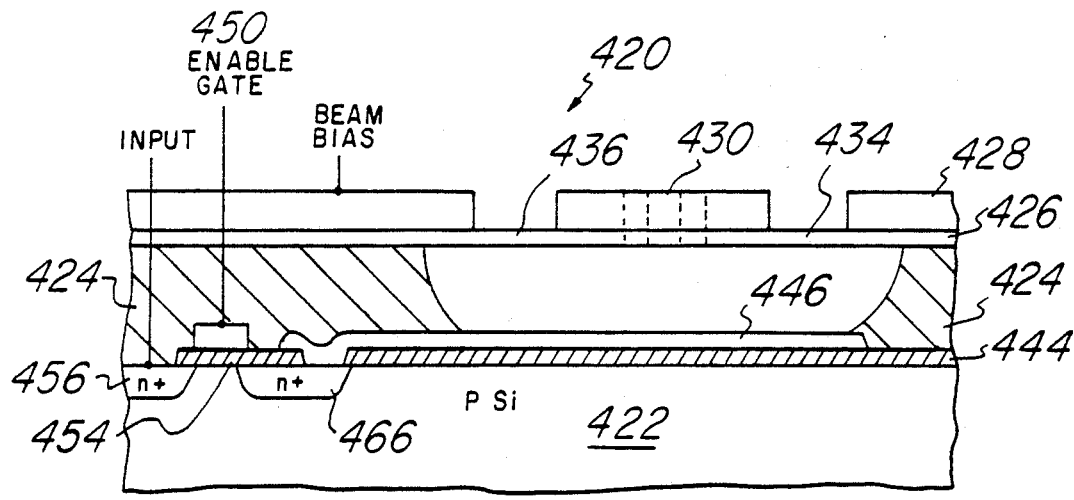
FIG. 33 illustrates the addressing of a second preferred embodiment pixel in cross sectional elevation view along a control electrode.
Figure 34:
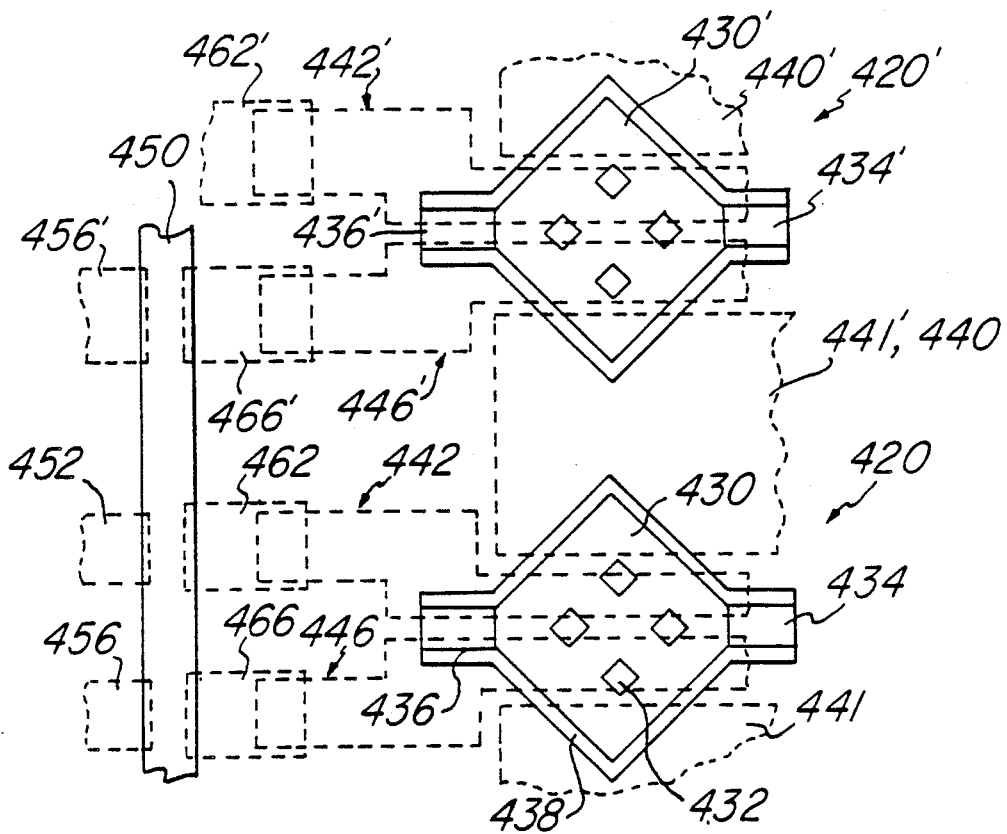
FIG. 34 illustrates the addressing of the second preferred embodiment pixel in plan view.

The addressing of individual pixels in linear array 310 is illustrated in a simplified version in FIGS. 33 and 34; FIG. 33 is a cross sectional view of a single pixel 420 along address electrode 446 showing an input and enable gate 450 and FIG. 34 is a plan view showing pixels 420 and 420' and addressing circuitry. Ti:Si:Al electrode 446 is insulated from p type silicon substrate 422 by silicon dioxide 444, and the voltage to deflect beam 430 is applied to electrode 446, with metal layers 426–428 a common bias for all pixels and substrate 422 grounded. The landing electrodes 441 and 440 (shared as landing electrode 441' in pixel 420') are connected to metal layers 426–428 and thus beam 430. Enable gate 450 is polysilicon and insulated from substrate 422 by gate oxide 454, and n+ doped regions 452, 456, 452', 456', ... and 462, 466, 462', 466', ... form the drains and sources, respectively, for MOSFETs with enable gate 450 as a common gate. Inputs for address electrodes 442 and 446 are applied to the MOSFET drains 452 and 456 and connected to the address electrodes when the MOSFETs are turned on by enable gate 450.

The steps of a first preferred embodiment method of fabrication of pixel 320, including addressing electrode 346 on substrate 322, are illustrated in cross sectional elevation view in FIGS. 35A-E as follows.

(a) First, 2,000 Å of thermal oxide 344 is grown on (100) silicon substrate 322. Next, 3,000 Å of Ti:Si:Al (0.2% Ti and 1% Si) is sputter deposited on oxide 344, and patterned and plasma etched to define electrodes 346. See FIG. 35A.

(b) Positive photoresist is spun on and baked in three applications to a total thickness of four microns to form spacer 324; three applications of resist are used to build up the thickness in order to avoid resist surface waves which can occur when spinning on a single very thick layer. A bake of approximately 180° C. is required after each application of resist to prevent the previous layers from dissolving in the resist solvent and to drive out excess solvent from the spacer; the last bake avoids the formation of solvent bubbles under the hinge metal during the photoresist bake for the beam pattern photolithography. Note that the photoresist planarizes over any circuitry that has been formed on the surface of substrate 322. The positive photoresist is preferably chosen to be insoluble in chlorobenzene, for example, novalac based resists. Then 800 Å of Ti:Si:Al (0.2% Ti and 1% Si) to form hinge layer 326 is sputter deposited at a substrate temperature as near to room temperature as possible to minimize thermal expansion mismatch between organic spacer 324 and metal layer 326. Also, this alloy of aluminum minimizes the hillocking arising in deposition of pure aluminum. Next, 1,500 Å of silicon dioxide is deposited by PEVCD; the oxide is then patterned and etched to form torsion hinge etch stops 348 (in plan view etch stops 348 occupy the areas to become torsion hinges 334 and 336 plus a small extension at each hinge end) and the photoresist used in the patterning and etching is plasma stripped. See FIG. 35B.

(c) 3,600 Å of Ti:Si:Al (0.2% Ti and 1% Si) to form beam layer 328 is sputter deposited, again near room temperature, and photoresist 50 is spun on. The deposition of the metal is under the same conditions as for the deposition of hinge layer 326 so that no stresses between the metal layers are developed. Photoresist 50 is patterned to define plasma etch access holes 332 and plasma etch access gap 338 plus hinges 334 and 336.

Patterned photoresist 50 is then used as the mask for plasma etching the metal layers 326 and 328 with hinge etch stops 348 preventing the etching of the portion of hinge layer 326 that becomes hinges 334 and 336. The plasma etch of the aluminum alloy may be with a chlorine/boron trichloride/carbon tetrachloride etch gas mixture. An alternative would be to use silicon dioxide masking as in step (b) with 2,000 Å of silicon dioxide patterned in place of photoresist 50; in this alternative the aluminum alloy etch could be reactive ion etching with silicon tetrachloride. Note that the hinge thickness is determined by the thickness of layer 326, the hinge width is determined by the width of etch stops 348; thus the compliance of hinges 334 and 336 may be adjusted by three different process parameters. See FIG. 35C.

(d) A thin layer of positive photoresist is spun on to act as an adhesion layer, and then 1.5 microns of PMMA (polymethyl methacrylate) 52 is spun on as a protective layer during subsequent steps, and substrate 322 is diced into chips (each chip to become a spatial light modulator). The dicing debris is illustrated sitting on PMMA 52 in FIG. 35D.

Figure 35A:
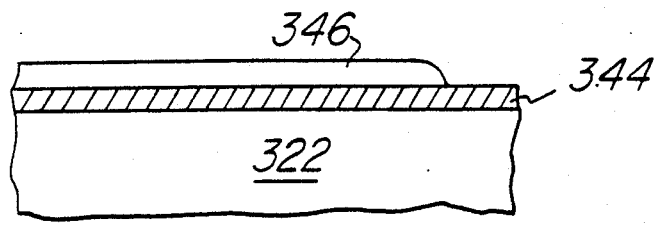
FIGS. 35A-E illustrate in cross sectional view the steps of the first preferred embodiment method of fabrication.
Figure 35B:
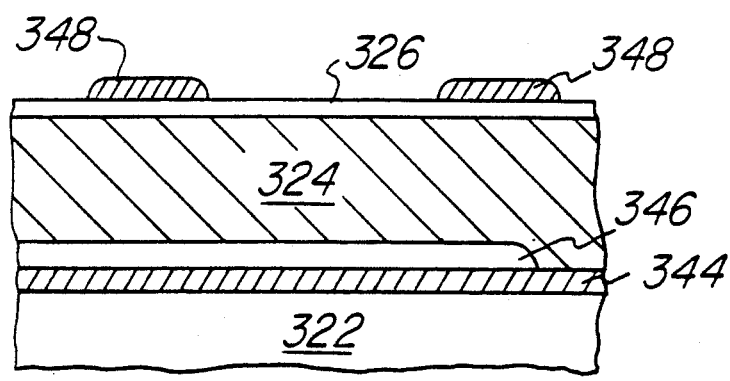
Figure 35C:
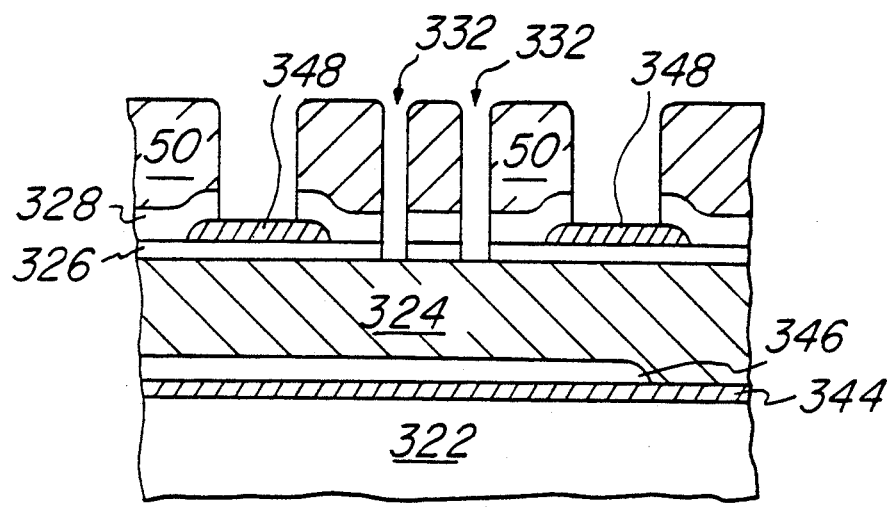
Figure 35D:
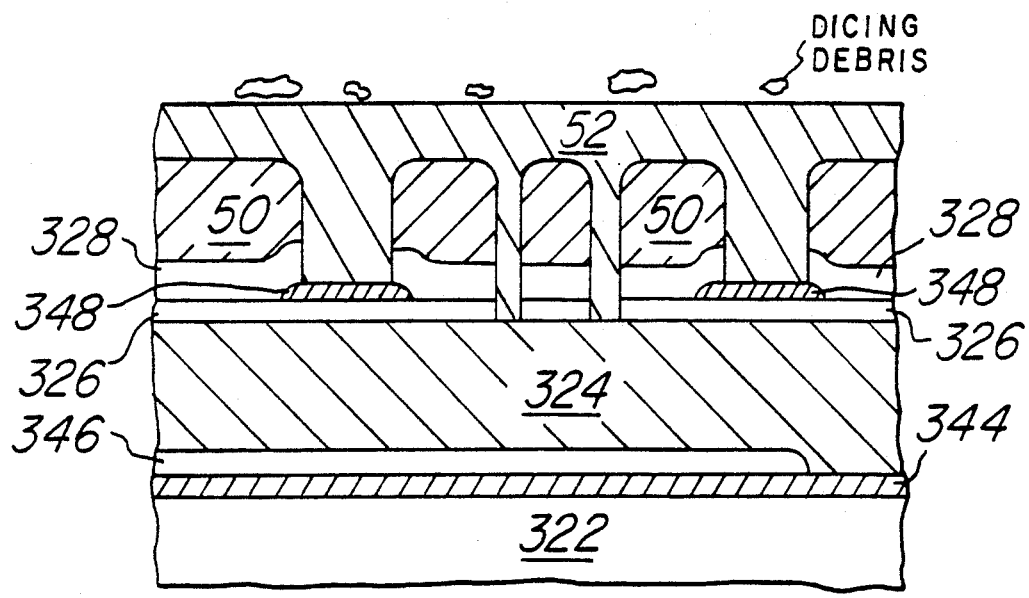
Figure 35E:
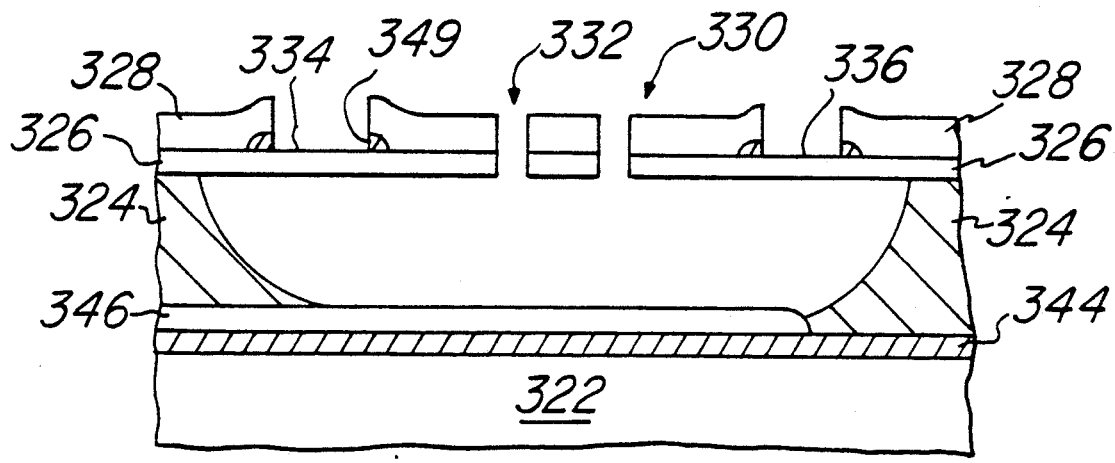
Figure 36A:
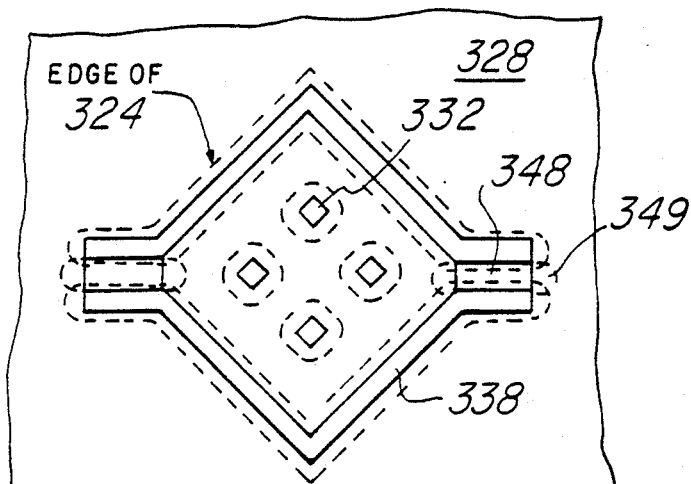
FIGS. 36A-C and 37A-C further illustrate the last step of the first preferred embodiment method of fabrication.
Figure 36B:
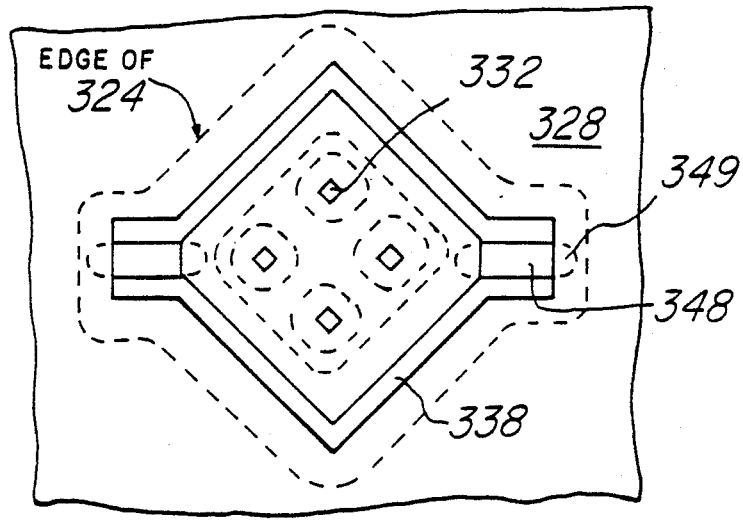
Figure 36C:
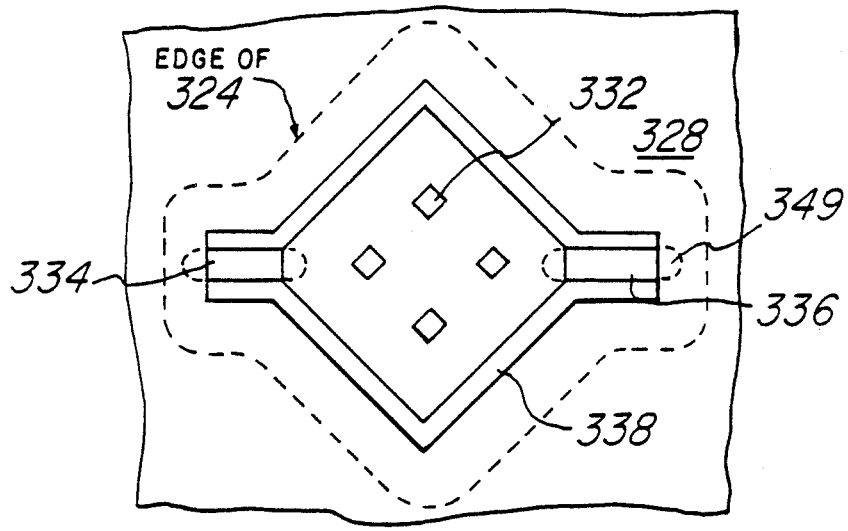
Figure 37A:
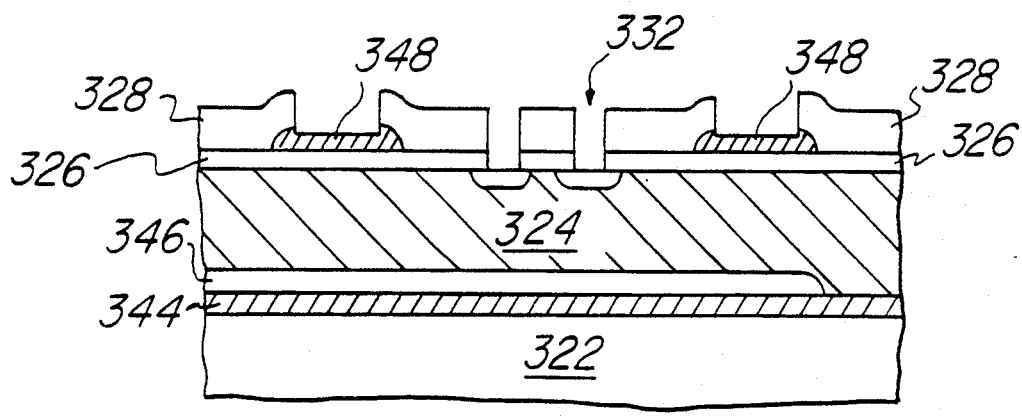
Figure 37B:
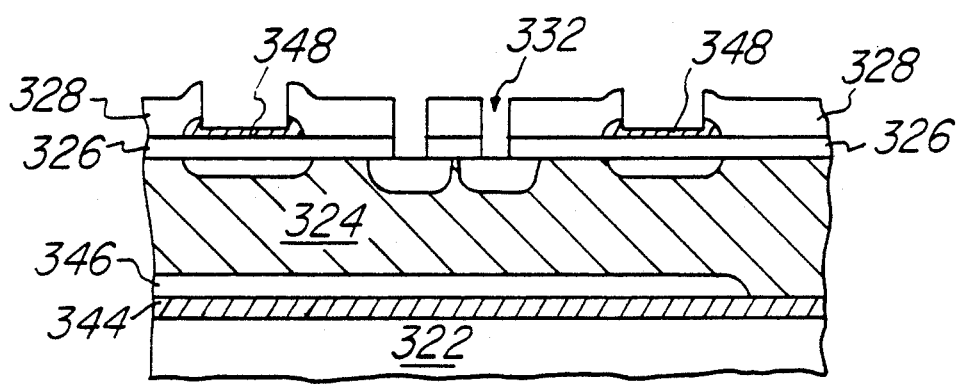
Figure 37C:
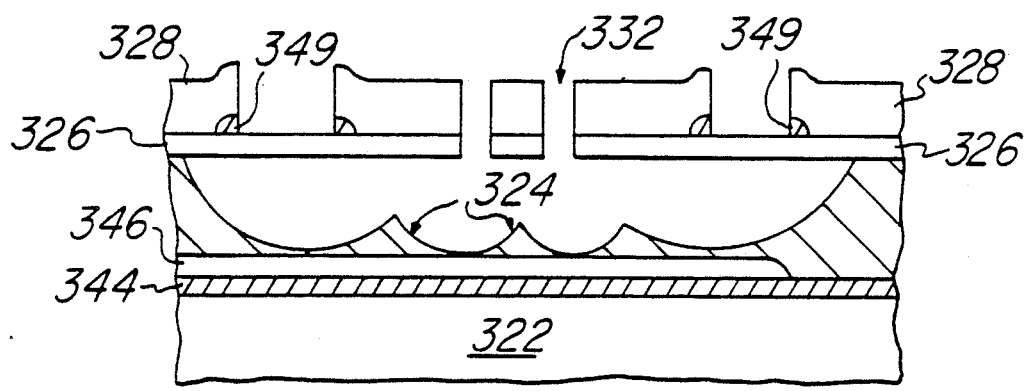

(e) PMMA 52 is dissolved by spraying with chlorobenzene and immediately centrifuging; note that resist (or oxide) 50 and spacer 24 do not dissolve in chlorobenzene. Thus the dicing debris is removed without beam 330 being diretly exposed to the debris. Lastly, resist 50 and spacer 324 are isotropically plasma etched in oxygen, with a few percent fluorine (such as from $CF_4$ or $NF_3$) to remove the exposed portion of etch stops 348; this etching is at low temperature and monitored to remove just enough of spacer 324 to form the well below beam 330. See FIG. 35E which is analogous to FIG. 1B but along a different cross section. Note that FIG. 35E shows the remnants 349 of the etch stops 348 which are omitted from FIGS. 1A and 1C because the second preferred embodiment method of fabrication (described infra) avoids the remnants and for clarity in FIGS. 1A and 1C. FIGS. 36A-C illustrate in plan view and FIGS. 37A-C in cross sectional view the stages of the etch of spacer 324.

Figure 38:
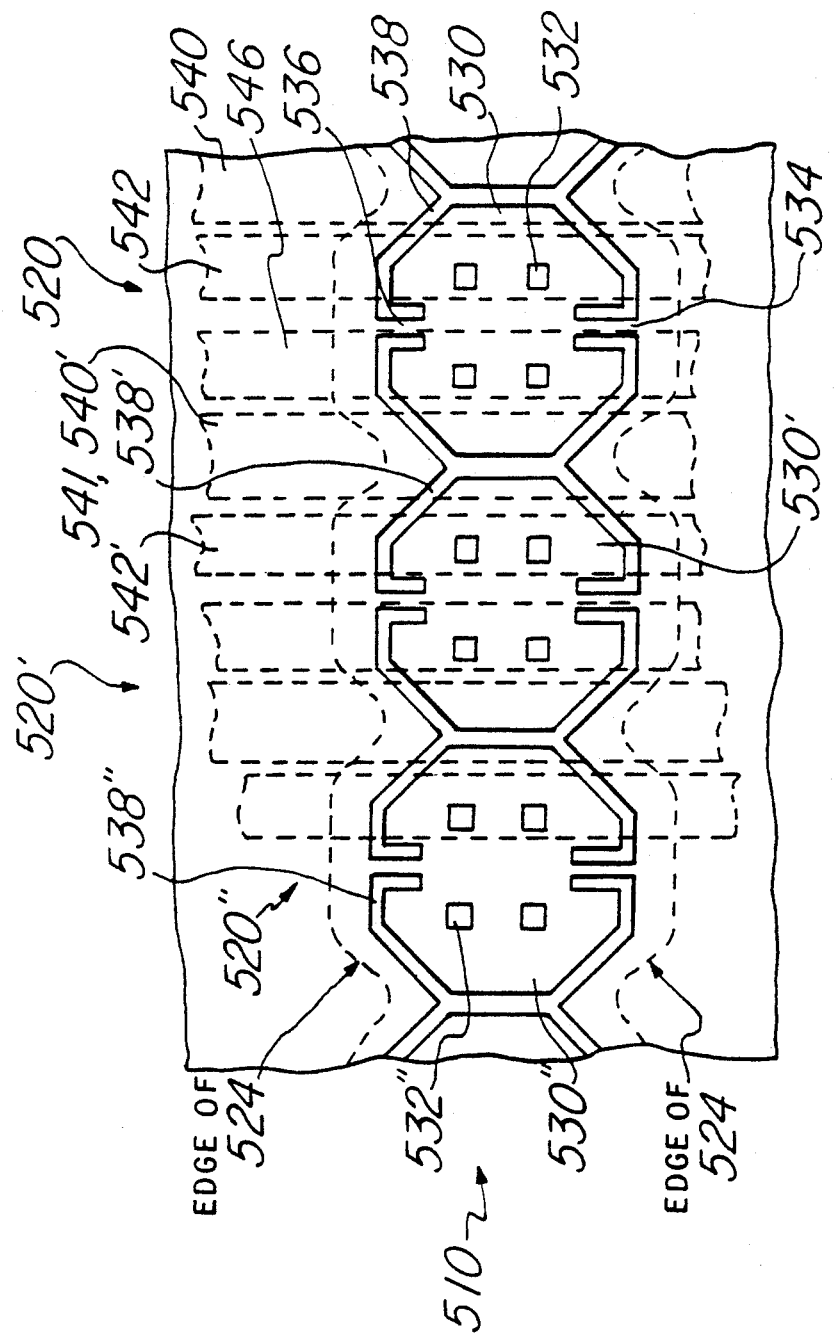
FIG. 38 illustrates in plan view a third preferred embodiment.

FIG. 38 illustrates in plan view a portion of linear array 510 of third preferred embodiment pixels including pixels 520, 520', 520''. Beams 530, 530', 530'' are octagonal with plasma etch access holes 532, 532', 532'' and plasma etch access gaps 538, 538', 538'', respectively; note that plasma etch access gaps 538 and 538' have a common portion between beams 530 and 530', as do the other gaps between abutting pixels. The wells in spacer 524 beneath beams 530, 530', 530'', ... all connect together and form one long well as indicated by the dotted lines in FIG. 38. The address electrodes 542, 546, 542', 546', ... and landing electrodes 540, 541, 540', 541', ... are shown in FIG. 38 by dashed lines; note that abutting landing electrodes are shared, for example, 541 and 540'. For clarity in FIG. 38 torsion hinges 534, 536, ... were shown as made from the same layer as beams 530, 530', 530'', . . . .

Figure 39A:
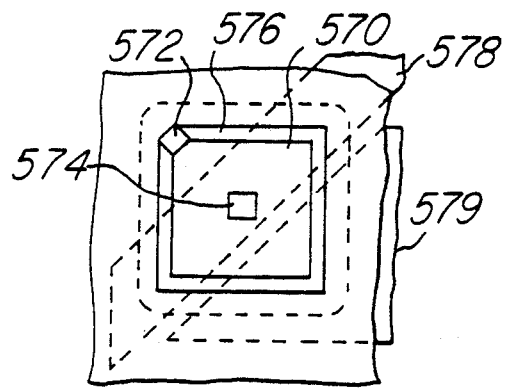
FIGS. 39A-D show alternative beam geometries and layouts in plan views.

FIGS. 39A-D illustrate in plan views alternative beam geometries. In particular, FIG. 39A shows a cantilever beam 570 with cantilever hinge 572, plasma etch access hole 574, plasma etch access gap 576, address electrode 578, and landing electrode 579. A cantilever beam only deflects in one direction and has torque curves similar to the curves of FIG. 5 but bounded, so only monostable and bistable (one stable deflection point plus collapsed to landing electrode 579) operation is available.

Figure 39B:
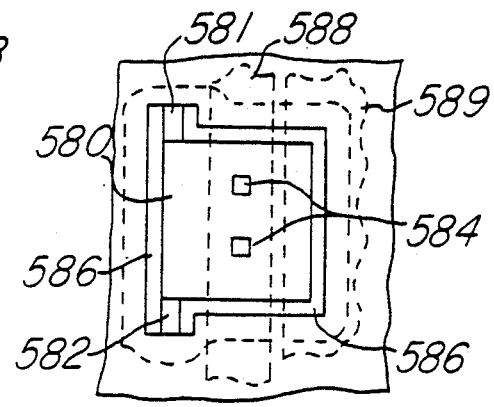

FIG. 39B shows torsion beam 580 with torsion hinges 581 and 582, plasma etch access holes 584, plasma etch access gap 586, address electrode 588, and landing electrode 589. Beam 580 deflects in only one direction and has operation similar to beam 570.

Figure 39C:
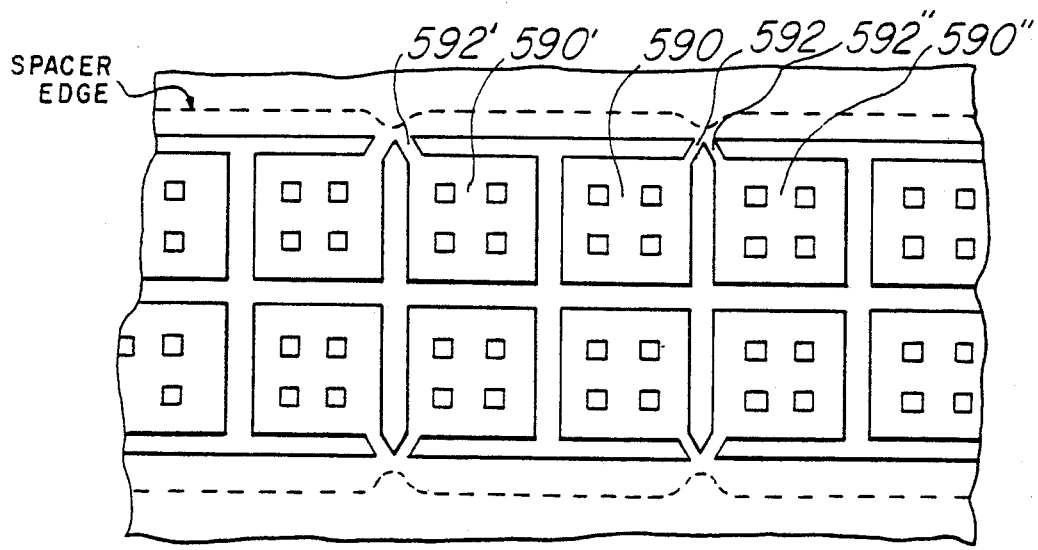

FIG. 39C shows a linear array of cantilever beams 590, 590', 590'', ... arranged as abutting inverted cloverleaves of groups of four beams. As with linear array 510, the wells under beams 590, 590', 590'', ... join to form a single elongated well as indicated by the dotted lines. Cantilever hinges 592, 592', 592'', ... are shown as made of the same layer as the beams and the address and landing electrodes are not shown for clarity.

Figure 39D:
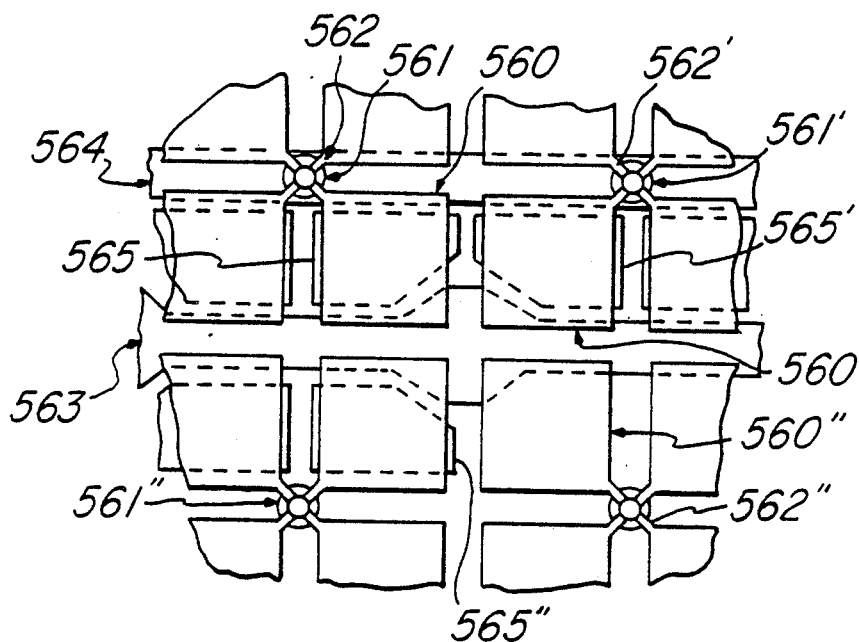

FIG. 39D illustrates a portion of an area array of cantilever beams 560, 560', 560'', ... grouped in fours and supported on posts 561, 561', 561'', ... by cantilever hinges 562, 562', 562'', . . . . Landing electrodes for the beams may be connected in rows such as electrode 563, and the beams are connected through the conductive posts to row electrodes 564. The address electrodes 565, 565', 565'', ... are addressed through circuitry not shown and fabricated in layers beneath the electrodes. Some of the electrodes are omitted for clarity.

A second preferred embodiment buried hinge fabrication method is shown in cross section (FIGS. 40A-E) and in plan (FIGS. 41A-C) views for a hinge located on a flat side of a torsion beam rather that at a corner. The cross section is taken in a transverse direction to the axis of the hinge (Section AA in FIG. 41C). The second preferred embodiment process relies on metal liftoff to define the thin hinge metal region, rather than a buried $SiO_2$ etch stop. As with the first preferred embodiment process, only one plasma etch is required to etch both the hinge and beam metalization layers.

Figure 40A:
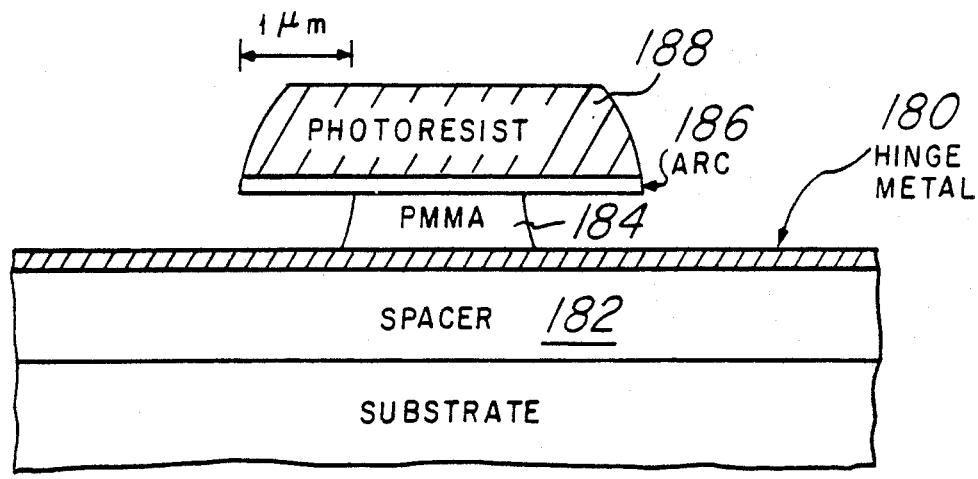
FIGS. 40A-E illustrate in cross sectional view the steps of the second preferred embodiment method of fabrication.
Figure 41A:
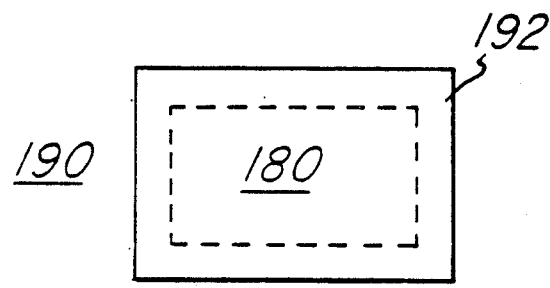
FIGS. 41A-C illustrate in plan view the steps of the second preferred embodiment method of fabrication.

The process begins with a sputter deposition of thin aluminum hinge layer 180 over spacer 182 (FIG. 40A). A trilayer resist process is used to delineate what will later become the thin metal region into which the hinge pattern is finally etched. The trilayer resist process chosen is a modification of the Sestertious process of Y. C. Lin, et al, J. Vac. Sci. Technol., B1(4), 1215 (1983).

The modified Sestertious process begins by spinning a spacer layer 184 of PMMA onto hinge metal 180. The thickness (approximately 5000 Å) is chosen to be slightly greater than the thickness of the beam metal. PMMA 184 is baked at a reduced temperature compared to the standard process in order to maintain a reasonably high solubility rate in its developer during the subsequent undercut of the photoresist capping layer. Next, an antireflection coating (ARC) 186 is spun onto PMMA 184 and baked. ARC 186 coating serves to prevent an interfacial layer from forming between photoresist 188 and PMMA 184. It also reduces the amount of reflected light from hinge metal 180 during the subsequent photolithography exposure.

ARC 186 is then coated with a positive photoresist 188. Photoresist 188 is exposed and developed in the desired hinge liftoff pattern and finally deep UV hardened and baked. ARC 180 is developed at the same time as photoresist 188. Next PMMA 184 is deep UV flood exposed so that regions of PMMA 184 not coated with photoresist 188 are reduced in their average molecular weight and become more soluble in chlorobenzene. A chlorobenzene develop of PMMA 184 quickly dissolves the exposed portion of PMMA 184 and an overdevelop produces approximately a one micron undercut of the photoresist capping layer as shown in FIG. 40A. An ash serves to remove filaments of softened PMMA which are thrown out during the spin dry following PMMA 184 develop. A hardbake then reduces the volatile components still contained in photoresist 188 and PMMA 184. These volatile components are caused by chlorobenzene absorption during the PMMA develop.

Figure 40B:
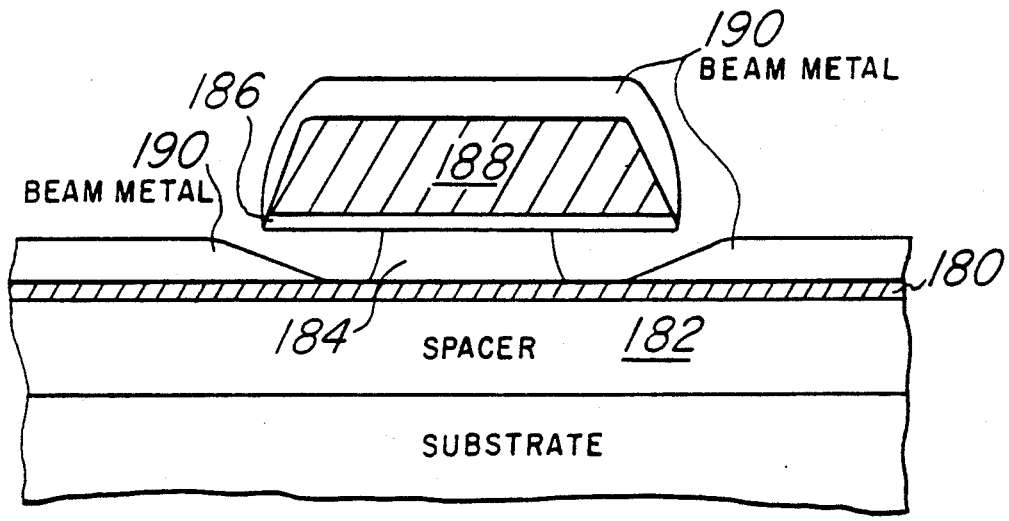
Figure 40C:
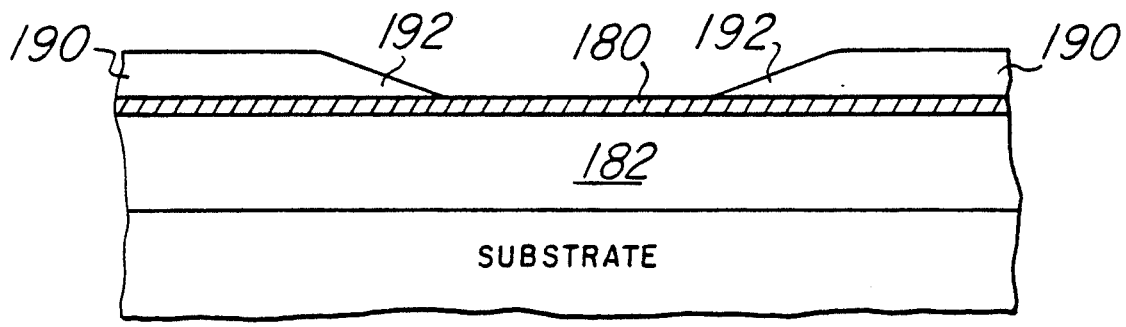

After the trilayer resist pattern (photoresist 188, ARC 186, and PMMA 184) is formed, beam metal 190 is sputter deposited. The overhanging photoresist cap on PMMA 184 causes sputtered beam metal 190 to break into two layers as shown in FIG. 40B. Beam metal 190 is then lifted off by soaking and dissolving the trilayer resist pattern in either chlorobenzene or 1-methyl-2-pyrrolidinone. The result (shown in cross sectional elevation view in FIG. 40C and in plan view in FIG. 41A) is a thin metal region 180 surrounded by a thick metal region 190, with thick metal 190 being tapered at its patterned edge 192.

Figure 40D:
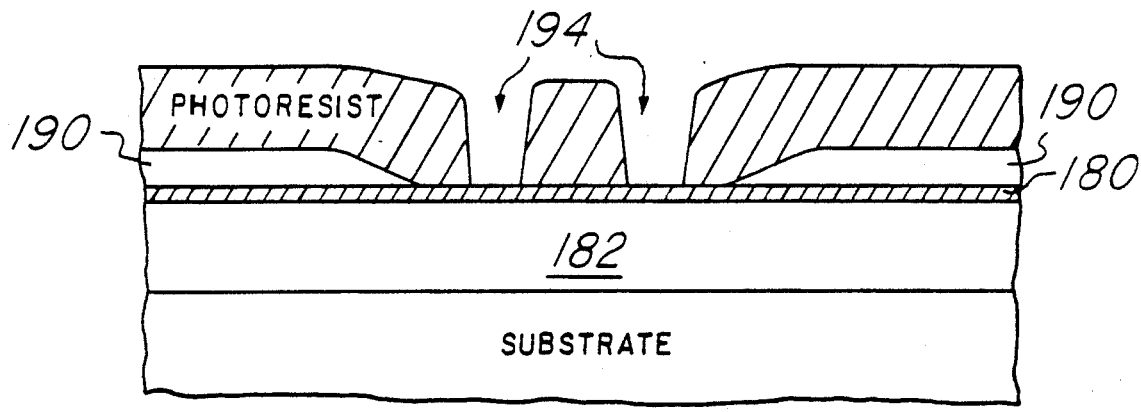
Figure 40E:
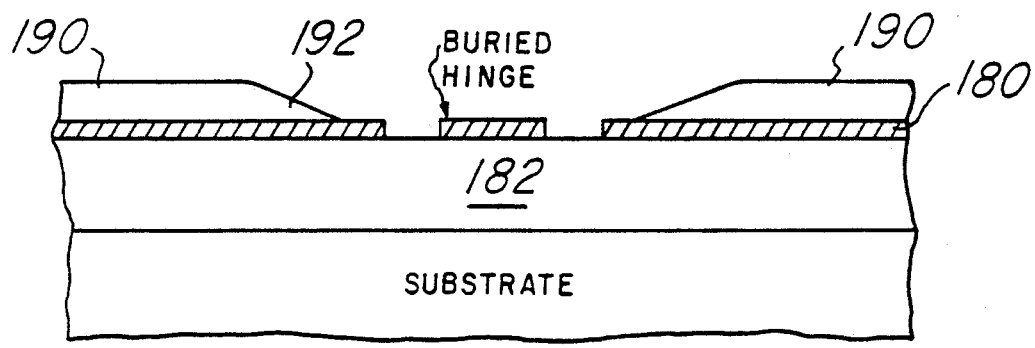
Figure 41B:
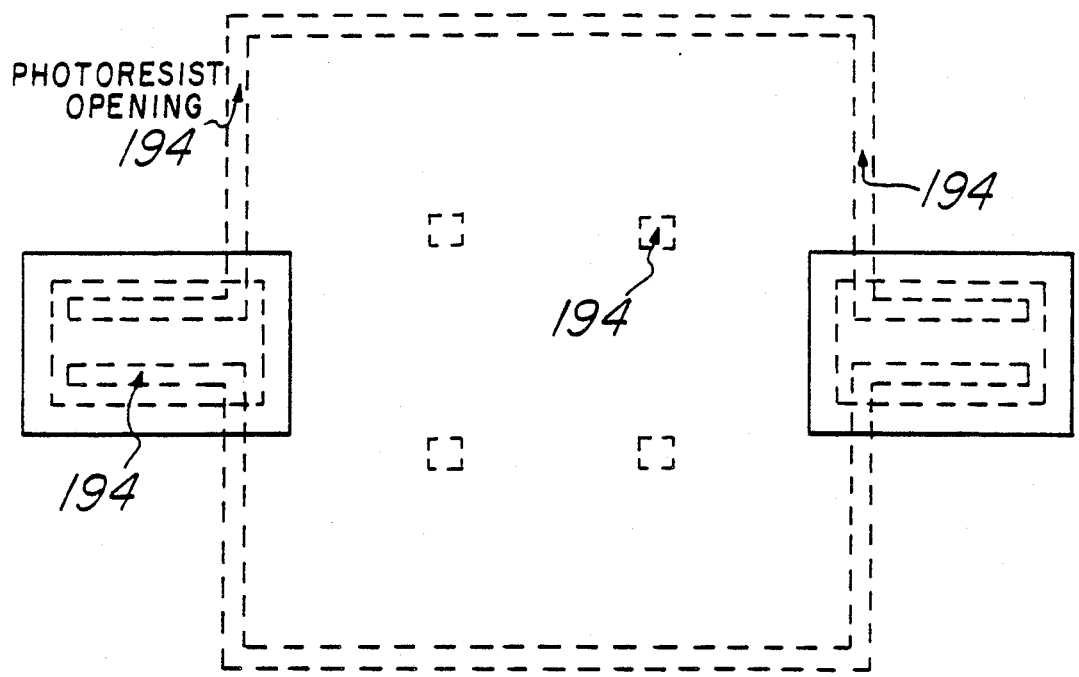
Figure 41C:
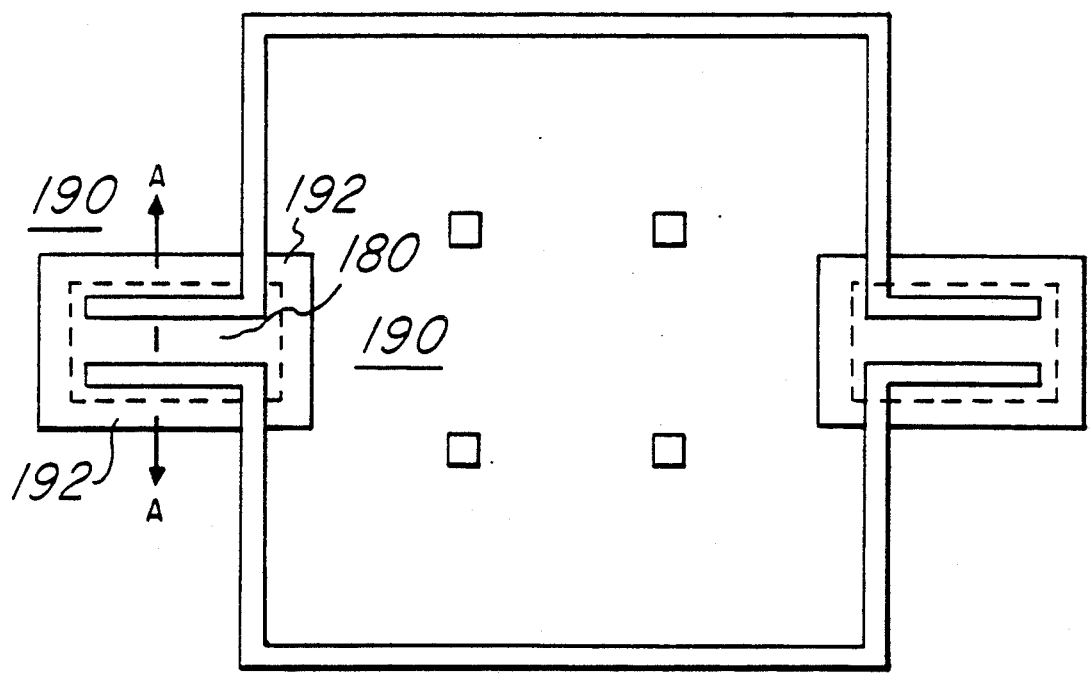

Next a pattern corresponding to the hinge and beam is photolithographically defined as shown in FIG. 40D (cross sectional elevation) and FIG. 41B (plan view). The opening in the photoresist is denoted 194 in the Figures, and the exposed metal is only hinge metal 180 for the two short horizontal portions of opening 194 in FIG. 41B and beam metal 190 elsewhere. Note that this pattern contains both the hinge and beam geometries, unlike the first preferred embodiment process. For this reason, the second preferred embodiment process is self-aligned. The exposed portion of hinge metal 180 and beam metal 190 is then plasma etched to simultaneously form both the hinge and beam geometries. After the photoresist has been ashed away the process is complete and the beam appears as in FIG. 40E (cross section) and FIG. 41C (plan view).

Figure 42A:
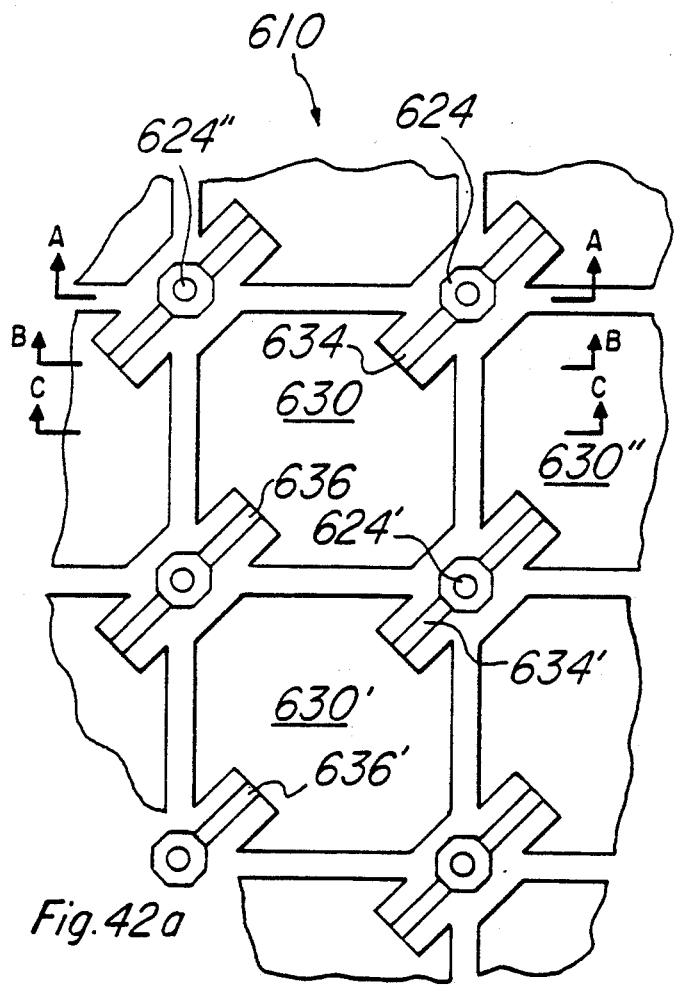
FIGS. 42A-B are plan and schematic views of an array of fourth preferred embodiment pixels.
Figure 42B:
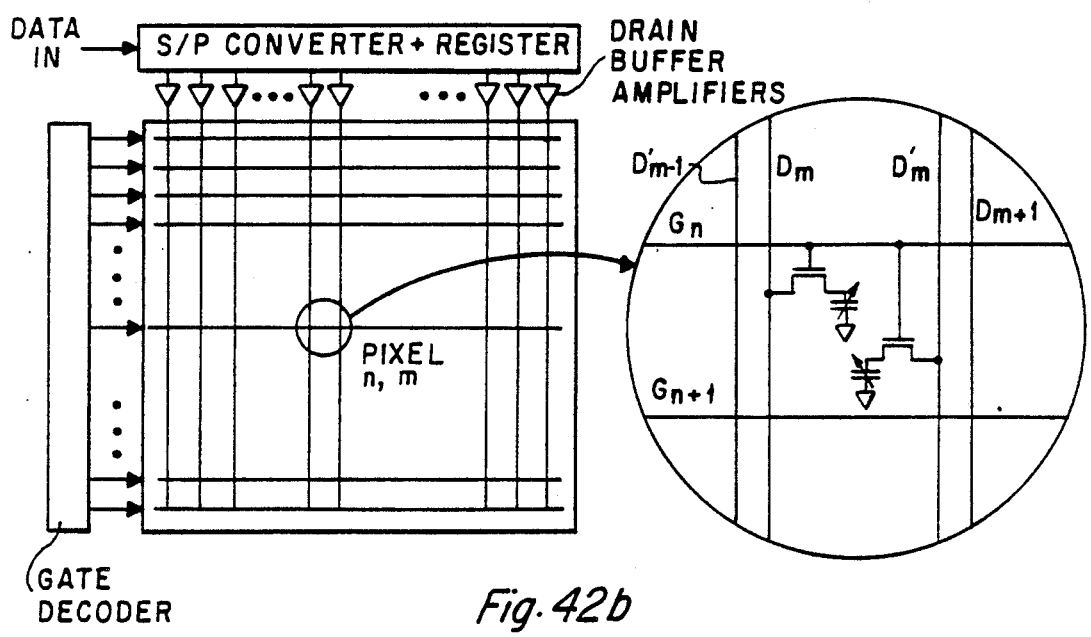

FIG. 42A is a plan view of a portion of array 610 of fourth preferred embodiment pixels 620, each pixel 620 includes torsion beam 630 supported by torsion hinges 634 and 636 which are in turn connected to posts 624, 624', 624", . . . ; the addressing circuitry for array 610 is not shown in FIG. 42A but the overall addressing for the array is schematically illustrated in FIG. 42B. Each pixel is represented as two variable capacitors (one for each address electrode) and two MOSFETs controlling access to the capacitors; the MOSFET gates are common for all pixels in a row, and the MOSFET drains are common for all pixels in a column. Array 610 is line addressed; that is, data is fed to the array one row of pixels at a time by the gate decoder selecting the wordline (gates) and the data is applied on the bitlines (drains) which then charge the floating sources and appropriately deflect the beams. As shown in FIG. 42B, the data may be entered in serial format and then converted to parallel format by a serial-to-parallel converter ("S/P Converter") and held in a storage register ("Register") until applied to the bitlines; the gate decoder sequentially selects the rows of the array.

Figure 43B:
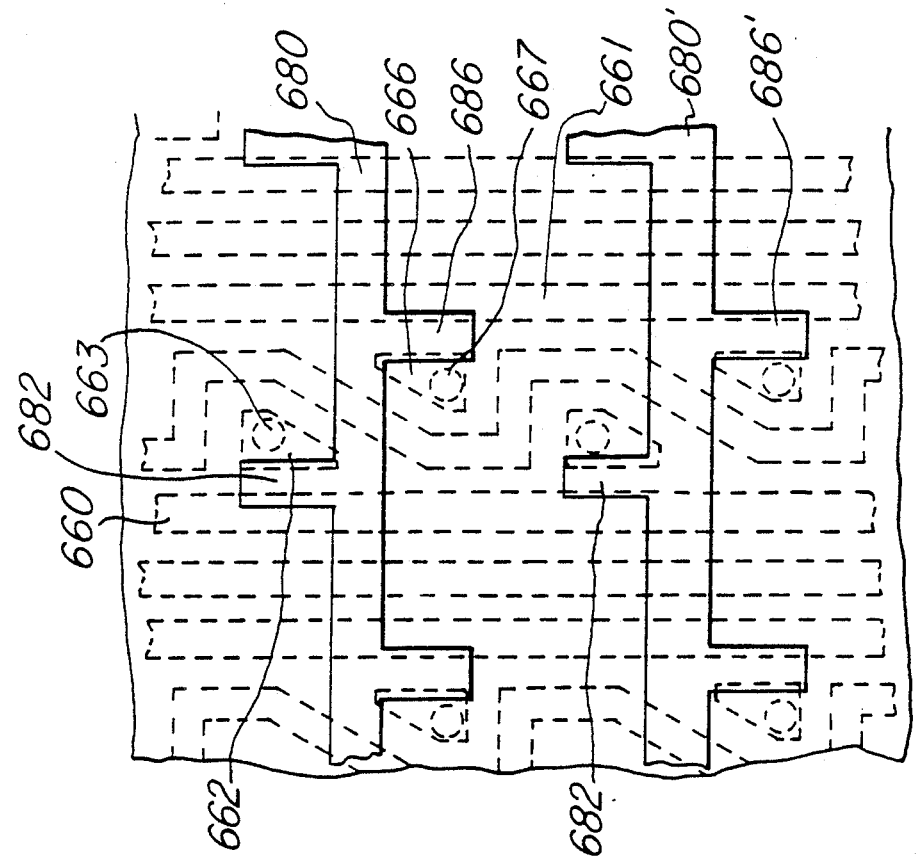
FIGS. 43A-D and 44A-C are plan views of levels of and cross sectional elevation views of fourth preferred embodiment pixels.
Figure 43A:
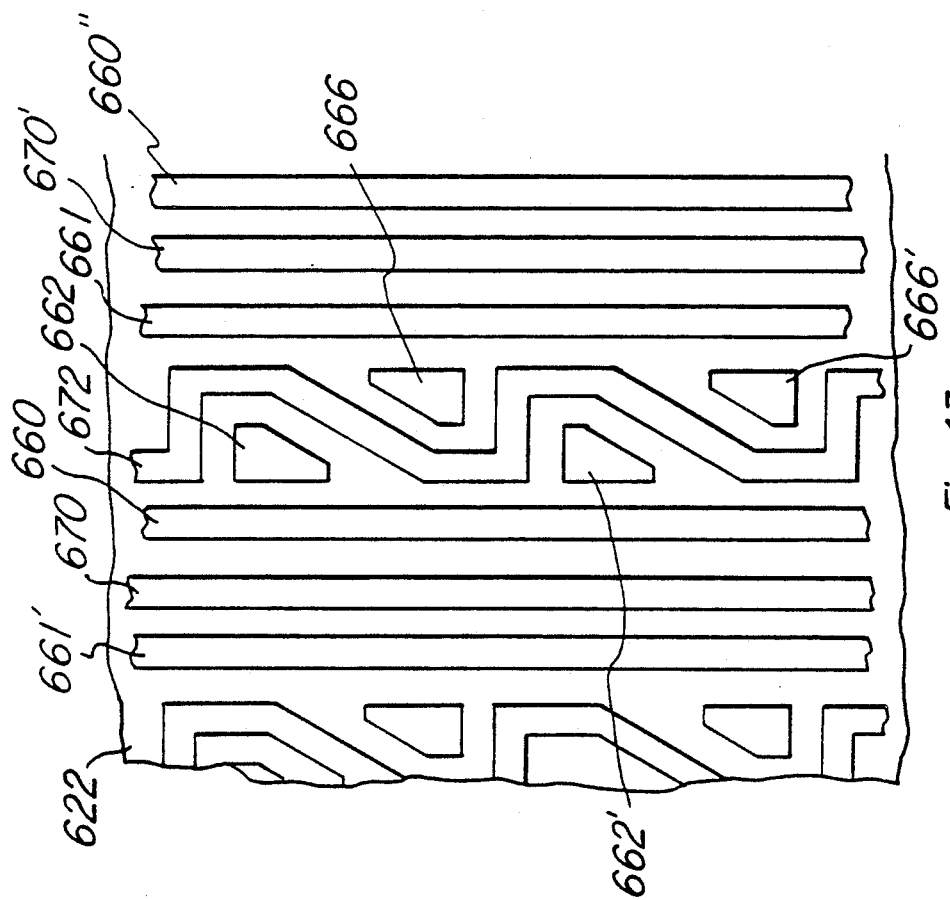
Figure 43C:
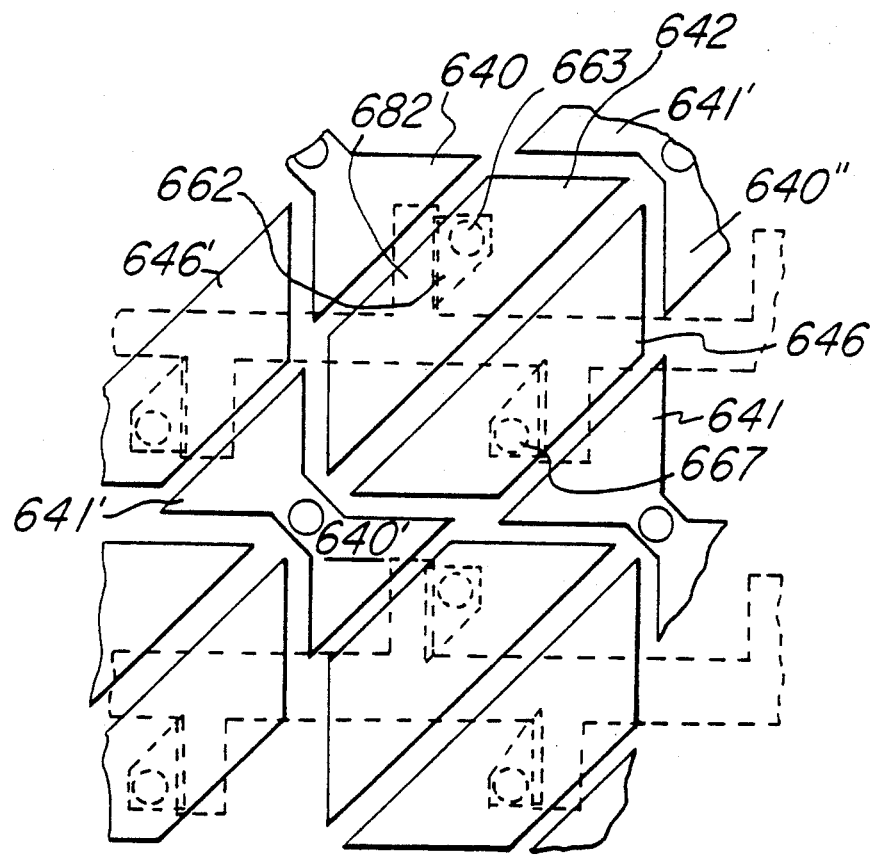
Figure 43D:
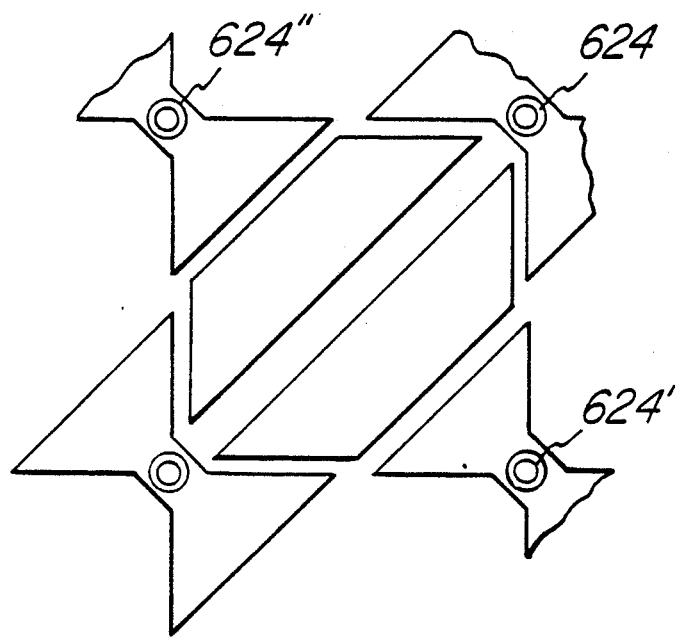
Figure 44A:
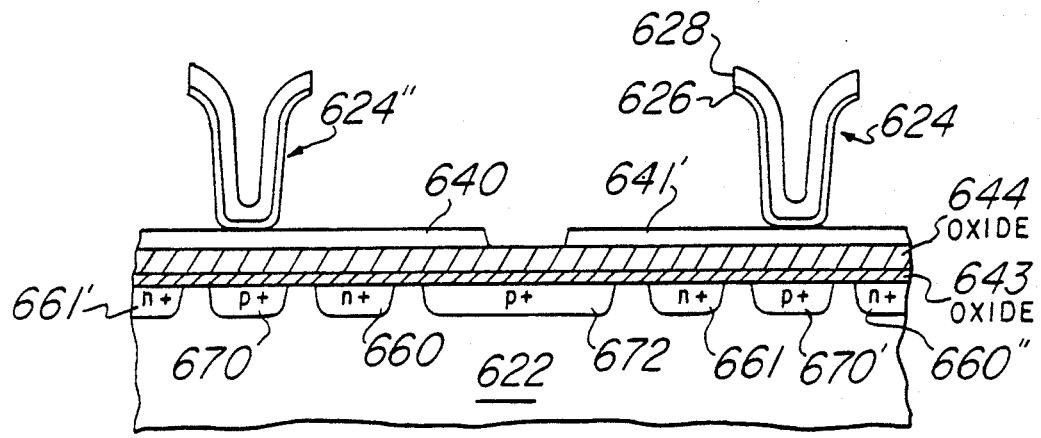
Figure 44B:
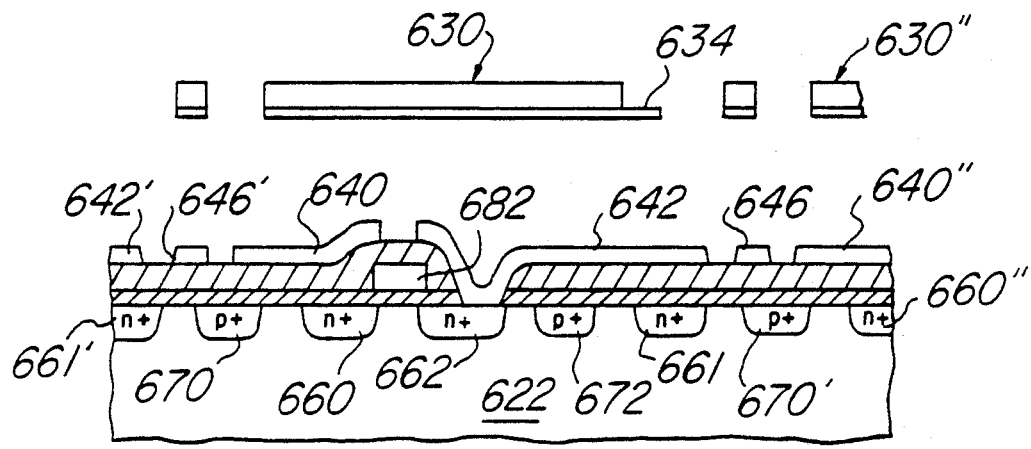
Figure 44C:
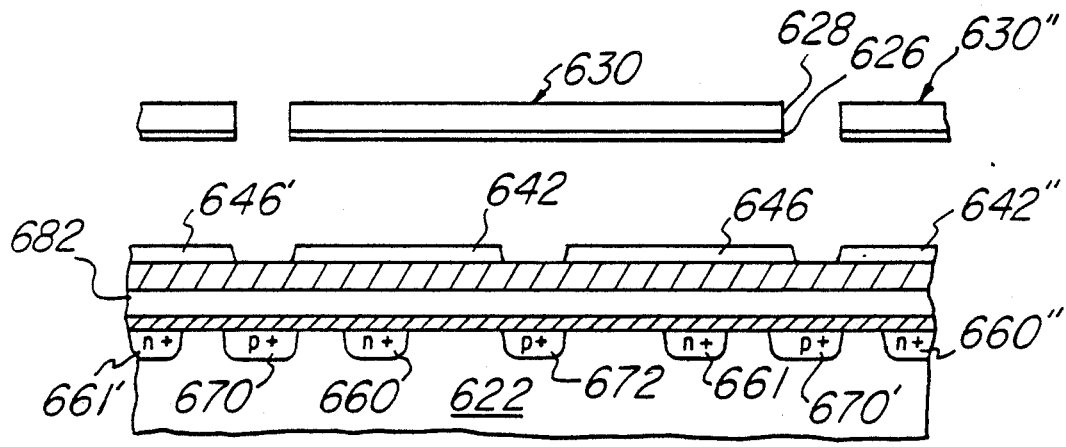

FIGS. 43A-D are plan views illustrating successive levels in a pixel, and FIGS. 44A-C are cross sectional elevation views along lines A—A, B—B, and C—C in FIGS. 42A and 43A-D. In particular, FIG. 43A shows n+ diffused regions 660, 661, 662, 666, 660', . . . and p+ channel stops 670, 672, 670', . . . in p− silicon substrate 622. Diffused lines 660 and 661 are bitlines and the drains for the MOSFETs, and regions 662 and 666 are the floating sources for the MOSFETs in pixel 620. Note that other devices could be fabricated on the same chip as array 610, and that array 610 could be formed in a p well of a CMOS chip. FIG. 43B is the gate level and shows polysilicon wordlines 680 and 680' with attached gates 682, 686, 682', 686', . . . . FIG. 43C illustrates the electrode level with only the wordlines and gates and floating sources indicated for clarity. Address electrodes 642 and 646 vertically connected to floating sources 662 and 666 through vias 663 and 667, respectively; whereas, landing electrodes 640 and 641 are shared with abutting pixels and interconnected through the beams and hinges in the reflecting layer. FIG. 43D is the spacer level and shows that metal posts 624, 624', 624", . . . have taken the place of spacer 24 in pixel 20 to support reflecting layers 626 and 628 in which beams 630, 630', 630", . . . are formed. Metal posts 624, 624', 624", . . . electrically connect beams 630, 630', 630", . . . to landing electrodes 642, 646, . . . in contrast to pixel 20 in which the spacer 24 insulates the beams from both the address and landing electrodes. Of course, FIG. 42A is the reflecting layer level plan view.

FIGS. 44A-C are cross sectional elevation views of pixel 620 along lines A—A, B—B and C—C of FIG. 42A and illustrate posts 624, 624', 624", . . . supporting the reflecting layer (hinge metal 626 plus beam metal 628) and which are fabricated from the hinge and beam metal depositions. Insulating silicon dioxide (oxide) 644 is about 8,000 Å thick but has been reflowed to slope the sidewalls of the openings down to floating sources 662, 666, 662', . . . to help the step coverage during deposition of the metal electrodes 642, 646, 642', . . . . Gate oxide 643 is about 800 Å thick and preserved during the etching of deposited polysilicon to form wordlines and gates 682, 686, 682', . . . .

Array 610 may be fabricated by a method analogous to the first and second preferred embodiment methods described except the spacer layer (324 of the first method and 182 of the second method) is patterned to form openings for posts 624, 624', 624", . . . prior to deposition of hinge and beam metal. Then the deposition of hinge and beam metal forms the posts, and the spacer is totally etched away about the pixels. The circuitry beneath the electrodes is fabricated by standard silicon processing.

MODIFICATIONS AND ADVANTAGES

Various modifications of the preferred embodiment devices and methods may be made while retaining the separation of addressing and landing electrodes which leads to soft landing in the preferred embodiments. Further, the effectively symmetric beams may use differential bias. For example, the address electrodes could be moved outside of the landing electrodes although this would require a more careful analysis of the attractive torque than that presented because the fringing fields would be the basis for the attraction. Further, the dimensions and shapes can be varied such as the hinge length, width, and thickness (even hinges made of beam metal), the size of the beams and their thickness, the thickness of the spacer, and so forth. Even the geometry of the beams and hinges can be varied as shown in FIG. 39. In fact, patterns of thick and thin portions could be fabricated in the beams, and three or more layers of metal with etch stops in each layer could yield various beam structures. Also, the materials can be varied such as Cu:Al, Ti:W, chromium, etc. for the metal, differing resists or insulators such as polyimide for the spacer or composite spacers including conductive sublayers, radiation hardening of the spacer, other semiconductors for the substrate and the electrodes or metal electrodes, and so forth. The buried hinge etch stop could be a different material, such as tungsten; and processing could result in no etch stop remnants between the hinge metal and the beam metal. The landing electrodes could be covered with a thin layer of silicon dioxide or other material to prevent the sticking of the beams on the landing electrodes; or the landing electrodes could be made of a material different from the beams and thereby deter cold welding of the beam to the landing electrode; or the landing electrodes could be contoured to contact the beam away from the beam tip or edge. Various addressing circuitry may be formed beneath the electrodes, including vias to the backside of a substrate.

The advantages of the landing electrode include the uniform, large-angle and soft-landed deflection of the beams.

What is claimed is:

1. A spatial light modulator, comprising:
   (a) a plurality of pixels, each of said pixels including a deflectable beam, an address electrode adjacent said beam, and a landing electrode adjacent said beam;
   (b) wherein a voltage applied between said beam and said address electrode deflects said beam toward said address electrode, and said landing electrode is located to contact said beam deflected toward said address electrode and prevent said deflected beam from contacting said address electrode.

2. The spatial light modulator of claim 1, wherein:
   (a) said deflectable beams are formed in a reflecting layer supported away from said address electrodes and landing electrodes, said deflectable beams connected to said reflecting layer by hinges formed in said reflecting layer.

3. The spatial light modulator of claim 2, wherein:
   (a) said reflecting layer is supported away from said address electrodes and landing electrodes by a spacer layer with wells between said deflectable beams and said electrodes.

4. The spatial light modulator of claim 3, wherein:
   (a) each of said deflectable beams is connected to said reflecting layer by two torsion hinges; and
   (b) each of said pixels has two address electrodes and two landing electrodes.

5. The spatial light modulator of claim 4, wherein:
   (a) said deflectable beams and landing electrodes are connected to a voltage source.

6. The spatial light modulator of claim 2, wherein:
   (a) said reflecting layer is supported away from said address electrodes and landing electrodes by a plurality of posts.

7. The spatial light modulator of claim 6, wherein:
   (a) each of said deflectable beams is connected to said reflecting layer by two torsion hinges; and
   (b) each of said pixels has two address electrodes and two landing electrodes.

8. The spatial light modulator of claim 7, wherein:
   (a) said deflectable beams and landing electrodes are connected to a voltage source.

9. A spatial light modulator, comprising:
   (a) a plurality of pixels formed in a layered structure;
   (b) said layered structure including an insulated substrate, a spacer layer on said substrate, a conductive reflecting layer on said spacer layer, and a plurality of addressing and landing electrodes;
   (c) each of said pixels including
   i. a deflectable element formed in said reflecting layer and connected to the remainder of said reflecting layer by at least one hinge formed from said reflecting layer,
   ii. a well formed in said spacer layer and extending from said deflectable element to said substrate,
   iii. a first addressing electrode on said substrate at the bottom of said well and located to deflect said deflectable element by electrostatic attraction, and
   iv. a first landing electrode on said substrate at the bottom of said well, said first landing electrode located both to contact said deflectable element when said deflectable element is deflected by attraction by said first addressing electrode to said substrate and to prevent said deflectable element from contacting said addressing electrode.

10. The spatial light modulator of claim 9, wherein:
    (a) said deflectable element and said first landing electrode are electrically connected.

11. The spatial light modulator of claim 9, wherein:
    (a) said deflectable element is connected to the remainder of said reflecting layer by two hinges formed from said reflecting layer, said deflectable element deflectable by rotation about the axis defined by said two hinges.

12. The spatial light modulator of claim 11, wherein said each pixel further includes:
    (a) a second addressing electrode on said substrate at the bottom of said well and located to deflect said element by electrostatic attraction in a direction of rotation opposite the direction of rotation due to attraction by said first addressing electrode; and
    (b) a second landing electrode on said substrate at the bottom of said well, said second landing electrode located to contact said deflectable element when said deflectable element is deflected by attraction by said second addressing electrode to said substrate.

13. The spatial light modulator of claim 12, wherein said each pixel further includes:
    (a) a voltage supply connected between said deflectable element plus said landing electrodes and said substrate.

14. The spatial light modulator of claim 9, wherein:
    (a) said reflecting layer is made of first and second sublayers, each of said sublayers a metal; and
    (b) said at least one hinge is formed from only said first sublayer.

15. A spatial light modulator, comprising:
    (a) a plurality of pixels formed in a layered structure;
    (b) said layered structure including a bottom layer, a plurality of electrodes on said bottom layer, a planarizing spacer layer on said electrodes and bottom layer, and a conductive reflecting layer on said spacer layer;
    (c) each of said pixels including:
    i. a deflectable element formed in said reflecting layer;
    ii. first and second of said electrodes, said first and second electrodes both extending beneath said deflectable element, said first electrode an addressing electrode and said second electrode a landing electrode; and
    iii. a well formed in said spacer layer, said well extending from said deflectable element to said first and second electrodes and of width greater than the width of said deflectable element.

16. The spatial light modulator of claim 15, wherein:
    (a) said deflectable element is a portion of said reflecting layer connected to the remainder of said reflecting layer by two hinges formed from said reflecting layer.

17. The spatial light modulator of claim 16, wherein:
(a) said portion of said reflecting layer is of square shape and said hinges are located at diagonally opposite corners of said portion.

18. The spatial light modulator of claim 15, wherein:
(a) said well is characterized by a plasma etching of said spacer layer after said reflecting layer is on said spacer layer and said spacer layer is on said electrodes and said bottom layer and said deflectable element has been formed in said reflecting layer.

19. The spatial light modulator of claim 15, wherein said each pixel further includes:
(a) third and fourth of said electrodes extending beneath said deflectable element, said third electrode an addressing electrode and said fourth electrode a landing electrode.

20. A deflectable beam light modulator, comprising:
(a) an air gap capacitor with a first capacitor plate being a light-reflecting deflectable and conductive beam and a second capacitor plate being an addressing electrode; and
(b) a conductive landing electrode of a selected potential different from the potential of said addressing electrode located to stop the deflection of said beam at a predetermined position away from maid addressing electrode.

21. The light modulator of claim 20, wherein said:
(a) said beam is conductive; and
(b) said deflection stop is a conductive landing electrode has the same electrical potential as said beam.

22. The light modulator of claim 20, wherein:
(a) said beam is metal;
(b) said landing electrode is a metal landing electrode adjacent said addressing electrode; and
(c) said addressing electrode is metal.

23. The light modulator of claim 20, wherein:
(a) said landing electrode is insulated.

24. A deflectable beam light modulator, comprising:
(a) an air gap capacitor with a first capacitor plate being a light reflecting deflectable beam and a second capacitor plate being an addressing electrode; and
(b) an insulated landing electrode located to stop the deflection of said beam at a predetermined position away from said addressing electrode.

25. A deflectable beam light modulator, comprising:
(a) an air gap capacitor with a first capacitor plate being a light-reflecting deflectable beam having a deflection axis and a second capacitor plate being an addressing electrode; and
(b) a deflection stop located outwardly of said deflection axis and said addressing electrode, said deflection stop to stop the deflection of said beam when said beam comes in contact with said deflection stop at a predetermined position away from said addressing electrode.

26. The light modulator of claim 25, wherein:
(a) said beam is conductive; and
(b) said deflection stop is a conductive landing electrode at a selected electrical potential different from that of said addressing electrode.

27. The light modulator of claim 26, wherein:
(a) said beam is metal;
(b) said deflection stop is a metal landing electrode adjacent said addressing electrode; and
(c) said addressing electrode is metal.

28. The light modulator of claim 25, wherein:
(a) said deflection stop is an insulated landing electrode.

* * * * *